US008773881B2

(12) United States Patent
Shepard

(10) Patent No.: US 8,773,881 B2
(45) Date of Patent: Jul. 8, 2014

(54) VERTICAL SWITCH THREE-DIMENSIONAL MEMORY ARRAY

(75) Inventor: Daniel R. Shepard, North Hampton, NH (US)

(73) Assignee: Contour Semiconductor, Inc., N. Billerica, MA (US)

( * ) Notice: Subject to any disclaimer, the term of this patent is extended or adjusted under 35 U.S.C. 154(b) by 416 days.

(21) Appl. No.: 12/720,843

(22) Filed: Mar. 10, 2010

(65) Prior Publication Data

US 2010/0232200 A1 Sep. 16, 2010

Related U.S. Application Data

(60) Provisional application No. 61/209,725, filed on Mar. 10, 2009, provisional application No. 61/273,163, filed on Jul. 31, 2009, provisional application No. 61/275,169, filed on Aug. 26, 2009, provisional application No. 61/281,388, filed on Nov. 17, 2009.

(51) Int. Cl.
*G11C 5/02* (2006.01)

(52) U.S. Cl.
USPC .............................................. 365/51; 365/63

(58) Field of Classification Search
USPC ...................................... 365/51, 63
See application file for complete search history.

(56) References Cited

U.S. PATENT DOCUMENTS

| | | | |
|---|---|---|---|
| 4,321,661 A | 3/1982 | Sano | |
| 5,889,694 A | 3/1999 | Shepard | |
| 6,198,645 B1 | 3/2001 | Kotowski et al. | |
| 6,306,740 B1 | 10/2001 | Hattori | |
| 6,586,327 B2 | 7/2003 | Shepard | |
| 6,806,137 B2 * | 10/2004 | Tran et al. ...................... | 438/239 |
| 6,992,343 B2 * | 1/2006 | Miyatake et al. ............. | 257/296 |
| 7,352,024 B2 * | 4/2008 | Iwata et al. ................... | 257/314 |
| 7,459,741 B2 * | 12/2008 | Kidoh et al. .................. | 257/296 |
| 7,639,525 B2 * | 12/2009 | Yamaoka et al. ............. | 365/154 |
| 2003/0016553 A1 | 1/2003 | Subramanian et al. | |
| 2006/0062043 A1 | 3/2006 | Roehr et al. | |
| 2007/0034921 A1 | 2/2007 | Daley et al. | |
| 2008/0175032 A1 | 7/2008 | Tanaka et al. | |
| 2009/0001337 A1 | 1/2009 | Furukawa et al. | |

FOREIGN PATENT DOCUMENTS

| | | |
|---|---|---|
| EP | 0 479 450 A2 | 4/1992 |
| EP | 1 261 024 A2 | 11/2002 |
| EP | 1 300 868 A2 | 4/2003 |
| EP | 1 426 942 A2 | 6/2004 |
| WO | WO-2008030351 A2 | 3/2008 |

OTHER PUBLICATIONS

International Search Report and Written Opinion for PCT/US2008/087652, mailed on Mar. 27, 2009.

(Continued)

*Primary Examiner* — Pho M Luu
(74) *Attorney, Agent, or Firm* — Bingham McCutchen LLP

(57) ABSTRACT

Methods of forming memory devices include providing a substrate, forming source, channel, and drain layers over the substrate, and patterning the source, channel, and drain layers into an array of memory switches each having a cross-sectional area less than 6 $F^2$. The channel layer has a doping type different from a doping type of the source layer, and the drain layer has a doping type different from a doping type of the channel layer.

30 Claims, 42 Drawing Sheets

(56) References Cited

OTHER PUBLICATIONS

Partial International Search, PCT/US2009/069899, dated Apr. 9, 2010, 3 pages.

International Search Report and Written Opinion for PCT/US2009/069899, dated Mar. 19, 2010, 17 pages.
Communication Relating to the Results of the Partial International Search, filed in PCT/US2010/026775, dated Jun. 14, 2010.

* cited by examiner

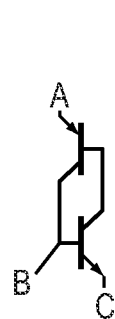 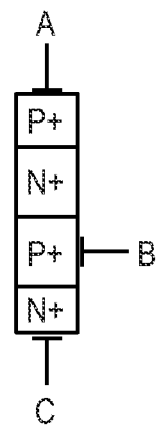 
FIG. 9A    FIG. 9B    FIG. 9C
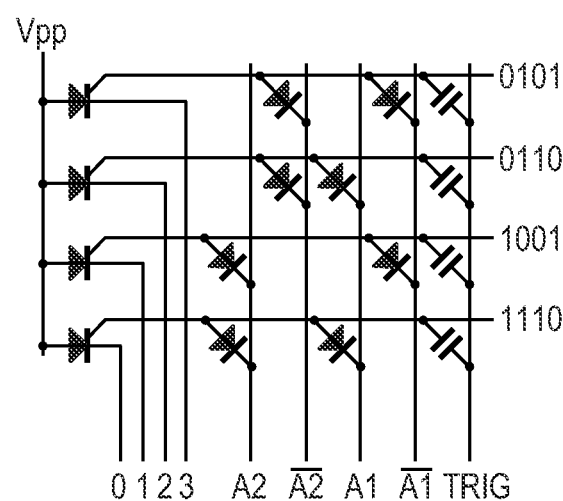
FIG. 10

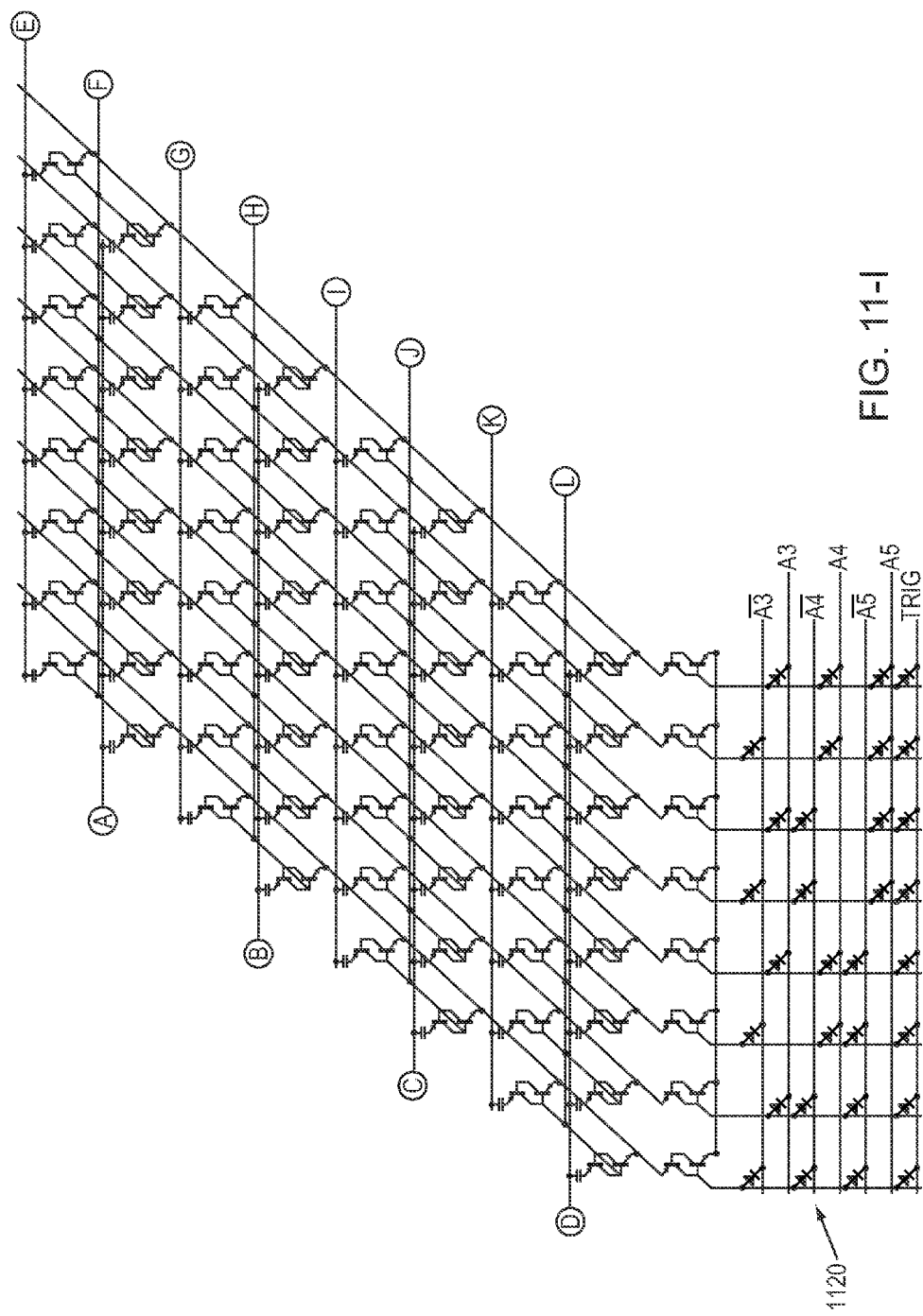
FIG. 11-I

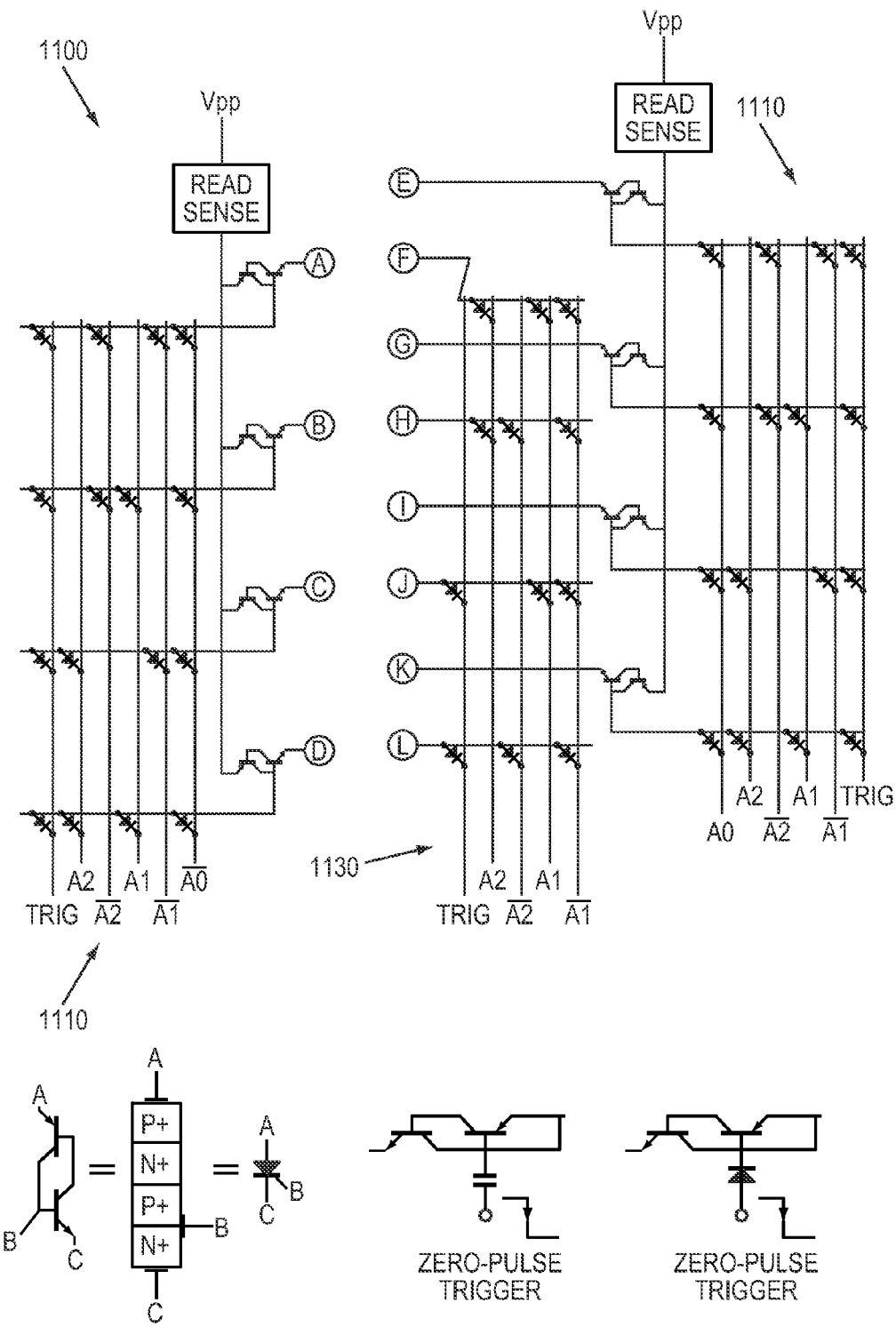
FIG. 11-II

VERTICAL SWITCH THREE-DIMENSIONAL MEMORY ARRAY

CROSS-REFERENCE TO RELATED APPLICATIONS

This application claims priority to and the benefit of U.S. Provisional Patent Application No. 61/209,725, filed on Mar. 10, 2009; U.S. Provisional Patent Application No. 61/273,163, filed on Jul. 31, 2009; U.S. Provisional Patent Application No. 61/275,169, filed on Aug. 26, 2009; and U.S. Provisional Patent Application No. 61/281,388, filed on Nov. 17, 2009. The entire disclosure of each of these applications is incorporated by reference herein.

TECHNICAL FIELD

In various embodiments, the present invention relates to arrays of switches utilized in memory devices, and more particularly to arrays of transistors that have a high packing density for use in memory devices.

BACKGROUND

As advances continue to be made in the area of semiconductor memory devices, high capacity and low cost are increasingly important. In particular, memory cell designs having small footprints are increasingly desired to provide high density. For this reason, diode arrays are increasingly finding utility in memory designs. However, because of leakage currents in diode arrays, increasingly large arrays often result in non-negligible total leakage currents. These leakage currents may grow geometrically with the size of the array, resulting in higher power consumption. U.S. Pat. No. 7,376,008 ("the '008 patent") describes this cumulative leakage problem in detail, and the entire disclosure thereof is incorporated by reference herein. To deal with this leakage problem, diode array memories can be broken down into multiple tiles or sub-arrays such that only a portion of the entire array is energized at a given point in time. However, each sub-array or tile typically requires some peripheral support circuitry and, as a result, will contribute to a reduction in array efficiency. The '008 patent addresses this problem through the use of current-level switching devices (CLSDs) and describes that when only a single row and a single column are energized, with the remaining (i.e., non-selected) rows and columns floating, the total current leakage grows only linearly with the size of the array. However, CLSDs switch when a voltage level is exceeded and, as such, have analog characteristics—i.e., they are not purely digital devices. Many memory-design engineers are skilled in digital logic design, but fewer engineers are trained in analog design. Thus, the increasing use of CLSDs leads to increased design complexity, time, and expense.

Thus, a device more digital than CLSDs that facilitates low power consumption by minimizing leakage currents is highly desirable. Furthermore, such a memory device should be inexpensive to manufacture and should utilize existing manufacturing tools and techniques while avoiding the use of materials that might contaminate manufacturing equipment.

SUMMARY

Embodiments of the present invention include memory arrays having substantially the same packing density as a diode array, and techniques for their manufacture. Some embodiments utilize vertical switches, such as MOS transistors, that may be tightly packed into an array for information-storage applications. Embodiments of the present invention are useful for many information-storage technologies that require a memory cell having a switchable current path and high packing density. Specifically, embodiments of the invention yield a terabit memory array on a single die. Furthermore, some embodiments of the present invention include conductive strapping features that help to compensate for the series resistance of bit lines and/or word lines in order to provide greater current to a given memory cell while requiring lower supply voltages.

Embodiments of the invention may include peripheral and/or support logic. This logic may include transistors built with a vertical orientation and/or built at the same time as the transistors in the high-density storage array. The logic circuitry may utilize transistors wired in series to withstand higher voltages or transistors wired in parallel to accommodate higher currents. It may comprise transistors that are drawn on a mask or reticule to provide for larger features for greater channel widths and, thereby, higher currents. Embodiments of the invention may include self-aligned features, and may include implantation or other doping techniques to form source layers, channel layers, and/or drain layers.

Memory arrays fabricated in accordance with the present invention may be programmed with data including or consisting essentially of music, video, computer software, a computer application, reference data, text, and/or a diagram. The memory array may be disposed within a removable memory storage device. The memory array may include or consist essentially of a plurality of storage cells, at least one of which may include or consist essentially of a phase-change material. The data typically includes error-correcting bits, but might not in some cases.

Embodiments of the invention are implemented with silicon or silicon-based materials; however, other semiconducting materials may also be utilized, including III-V semiconductors, organic semiconductors, field-emitting devices, and the like. Embodiments of the invention may be implemented in conjunction with various information storage materials and techniques including resistive change materials, phase-change materials, magnetic materials (for MRAM), one-time programmable (OTP) materials such as a fuse or anti-fuse material, charged oxide materials, trapped charge devices, and many other programmable materials.

Embodiments of the present invention also relates to the manufacture and processing of semiconductor devices, and more particularly to methods for fabricating three-dimensional memory devices having a programmable element that is self-aligned. Representative types of programmable elements for memory cells include phase-change materials, such as chalcogenide alloys, and resistive-change materials. These and other materials are switched from one stored data state to another by heating the material, which is accomplished by passing a current through the material. To effectively heat the material without passing excessive current (and thereby consuming considerable power), the current may be forced through a constricted area in order to increase the current density through that area and the concomitant heating. In addition, memory cells in accordance with embodiments of the invention may be one-time programmable (OTP) or multiply programmable or rewritable, and may alternatively include fusible or antifusible materials.

Embodiments of the present invention also include methods of processing a semiconductor device such that a constricted area is formed at the junction of a contacting material and a programmable-element material or at the junction of two portions of the programmable-element material.

Embodiments include memory cells having multiple storage bits per cell, including cells having one to eight bits per cell or even more.

Embodiments of the present invention also include methods for forming features (such as conductive posts) between other features separated by the minimum dimension of the lithographic techniques utilized to form the device. Embodiments include methods for processing a programmable-element portion of a memory cell such that the programmable material is not exposed to high temperatures that might damage it, even that programmable material utilized in stacked or three-dimensional memory variants. Embodiments also include methods for forming memory cells having one or more layers of programmable elements, where at least of the layers has one or more programmable elements, and where one or more of the elements has two or more programmable states. Thus, the number of bits of information per memory cell is a function of the number of layers, the number of programmable elements per layer, and the number of programmable states per element. For example, a memory cell having eight layers per cell, two elements per layer, and four states per element (two bits per element) has 32 bits per cell.

Embodiments of the present invention include methods for constructing a memory cell having an active device in the substrate (e.g., a transistor, a thristor, a nonlinear current-steering device such as a diode, a field emitter, or the like) that is shared by multiple programmable elements. The cell may have one or more layers of such programmable elements.

In an aspect, embodiments of the invention feature a memory device that includes a substrate, and, disposed thereover, an array of vertical memory switches each having at least three terminals and a cross-sectional area less than 6 $F^2$. Each memory switch may have a cross-sectional area less than approximately 4 $F^2$. At least one of the memory switches includes or consists essentially of a MOS transistor or a four-layer diode. At least two memory switches may share a common gate for operating the channel of each of the memory switches.

The device may include two interleaved pluralities of bit lines for selecting a memory switch, one plurality of bit lines being connected to a first selection circuit on a first side of the array of memory switches and the other plurality of bit lines being connected to a second selection circuit on a second side of the array opposing the first side. The device may include a first array of programmable memory elements disposed over the array of memory switches. Each memory element in the first array may be electrically connected to at least one of the memory switches through a conductive post. A second array of programmable memory elements may be disposed over the first array. Each memory element in the second array may be electrically connected to at least one of the memory switches through a conductive post. At least one, or even each, of the memory elements in the first array may include or consist essentially of a phase-change material, a resistive-change material, and/or a one-time-programmable element. Peripheral circuitry including or consisting essentially of a plurality of vertical MOS transistors may be electrically connected to the array of memory switches. F may be less than approximately 25 nm. Each vertical memory switch may correspond to a single bit or to a plurality of bits.

In another aspect, embodiments of the invention feature a method of forming a memory device. A substrate is provided, and a source layer is formed on the substrate. A channel layer having a doping type different from the doping type of the source layer is formed over the source layer. A drain layer having a doping type different from the doping type of the channel layer is formed over the channel layer. The source, channel, and drain layers are patterned into an array of memory switches each having a cross-sectional area less than 6 $F^2$. Patterning the source, channel, and drain layers may include forming a plurality of generally parallel isolation trenches intersecting the source, channel, and drain layers, depositing a dielectric material into the plurality of isolation trenches, and planarizing the dielectric material such that the top surface of the dielectric material is substantially coplanar with the top surface of the drain layer. Patterning the source, channel, and drain layers may include forming a plurality of generally parallel gate trenches intersecting the isolation trenches, each of the memory switches being bounded by intersecting isolation trenches and gate trenches. The isolation trenches and the gate trenches may be substantially perpendicular to each other. The cross-sectional area of each memory switch may be less than approximately 4 $F^2$.

A gate dielectric contacting the channel layer may be formed within the gate trenches, and a gate contact material may be deposited in the gate trenches. The gate contact material may be planarized such that the top surface of the gate contact material is substantially coplanar with the top surface of the dielectric material in the isolation trenches. A conductive post may be formed over a memory switch. A programmable material may be formed in contact with the conductive post, thereby forming a programmable memory cell. The programmable material may include or consist essentially of a phase-change material, a resistive-change material, and/or a one-time-programmable material.

Forming the programmable material may include or consist essentially of etching at least a portion of a dielectric material disposed around the conductive post to form a recess, at least substantially filling the recess with the programmable material, and planarizing the programmable material such that the top surface of the programmable material is substantially coplanar with the top surface of the conductive post. The conductive post may have a substantially quadrilateral (e.g., rectangular or square) cross-sectional area. The programmable may be disposed in contact with only one corner or with only two corners of the conductive post. Forming the source, channel, and drain layers each may include or consist essentially of ion implantation of dopants into the substrate and/or deposition of a semiconductor material over the substrate. The source, channel, and drain layers may be patterned into a plurality of peripheral devices disposed proximate the array of memory switches substantially simultaneously with their patterning into the array of memory switches. The peripheral devices may be electrically connected to the array of memory switches.

In yet another aspect, embodiments of the invention feature a memory device including a substrate defining a die, and, disposed over the substrate within the die, an array of vertical memory switches. Each of the vertical memory switches may have at least three terminals. The array of vertical memory switches may define a memory array of at least one terabit. Each vertical memory switch may correspond to a single bit or to a plurality of bits. The die may have an area of approximately 1 $cm^2$, and the memory array may have at least 5 terabits of storage capacity. At least one memory switch may include or consist essentially of a MOS transistor and/or a four-layer diode. At least two memory switches may share a common gate for operating a channel of each of the memory switches.

In a further aspect, embodiments of the invention feature a memory device including a vertical conductor disposed over a substrate, a switch for selecting the vertical conductor, and a plurality of layers, each layer comprising a plurality of programmable memory elements and being disposed over and electrically connected to the vertical conductor. The layers may be stacked vertically, and/or the vertical conductor may extend through each of the layers. The switch may include or consist essentially of a vertical memory switch having at least three terminals and a cross-sectional area less than 6 $F^2$. At least one of the programmable memory elements may include or consist essentially of a phase-change material, a resistive-change material, and/or a one-time-programmable element.

In still another aspect, embodiments of the invention include memory devices comprising a first set of parallel rows of memory cells connected together; a second set of parallel rows of memory cells connected together; and a control conductor selectable to activate at least one of the rows of the first set and at least one of the rows of the second set. Selection of (i) one of the sets, and (ii) at least one of the rows by the control conductor, causes activation of at least one row of memory cells.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawing, in which:

FIGS. 9A, 9B, and 9C are three symbolic representations of a four layer diode, also known as a thrystor, shockley diode, PNPN diode, or SCR;

FIG. 10 is a schematic diagram of a diode decoder for disabling all but one four layer diode device in accordance with various embodiments of the invention;

FIGS. 11-I, 11-II are schematic diagrams of an 8 bit×8 bit memory array in which row line and column line selection and memory cell enabling is performed by a diode decoder in accordance with various embodiments of the invention;

DETAILED DESCRIPTION

Embodiments of the present invention may be fabricated using standard techniques and equipment, and include arrays of memory switches each having a "footprint" (i.e., cross-sectional area) no larger than 4 $F^2$ (where F represents the minimum feature size of a particular technology generation). In a preferred embodiment, MOS transistors are fabricated in a vertical orientation and have a center channel layer vertically surrounded by a source and drain layer. The gate (that turns on the channel) is positioned to the side of the vertically stacked device. To facilitate a higher packing density, the gate is preferably shared by two adjacent MOS devices, resulting in transistors being enabled in pairs. Final resolution of a selected memory storage element is preferably accomplished by uniquely selecting a bit line to one of the two activated transistors. Various embodiments of the present invention do not require the highest packing density or fabrication of shared-gate transistors, which may be desirable for formation of peripheral circuits to support the operation of a high-density memory array.

Figure 1:
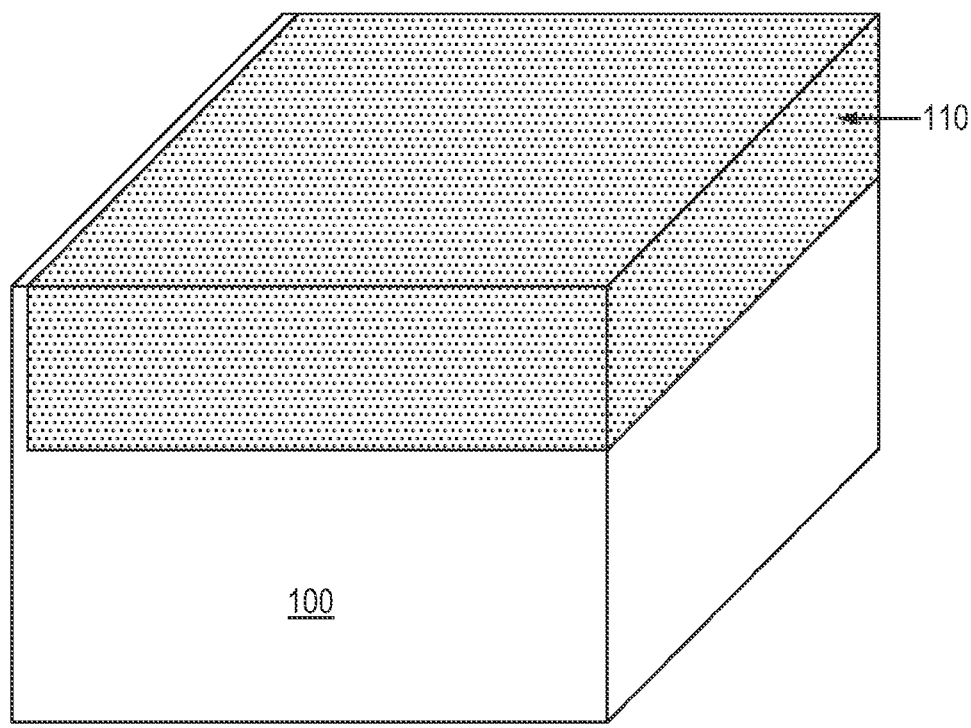
FIG. 1 is a schematic perspective view of a substrate following a first dopant implant in accordance with various embodiments of the invention.

FIG. 1 depicts a portion of a substrate 100, which may include or consist essentially of a semiconductor material such as silicon. One or more dopant species are introduced into substrate 100, e.g., by ion implantation, forming a first implanted layer 110. As depicted, an area is masked prior to introducing the dopant species by, e.g., photolithographic techniques. For fabrication of an array of memory cells, a single large-geometry mask may be used to outline the memory cells as well as the connections to the ends of the word lines (as described below). First implanted layer 110 will also be referred to herein as the "source layer."

Figure 2:
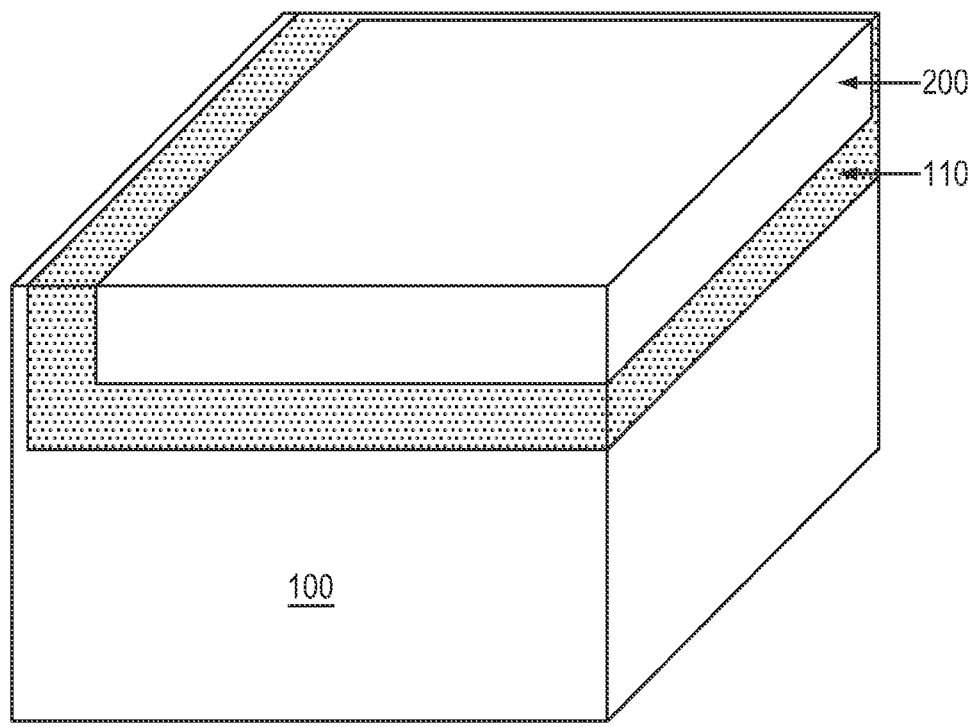
FIG. 2 is a schematic perspective view of the substrate of FIG. 1 following a second dopant implant in accordance with various embodiments of the invention.
Figure 3:
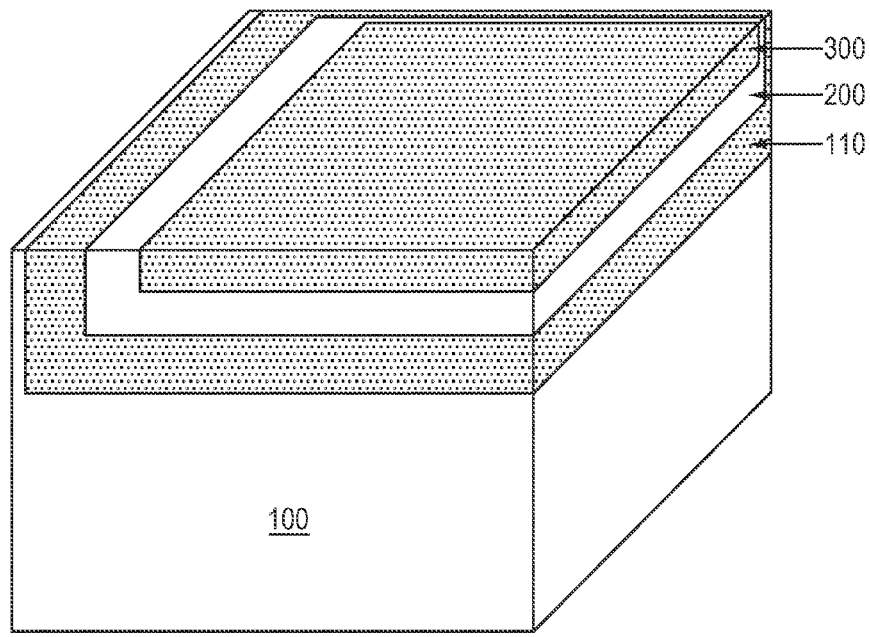
FIG. 3 is a schematic perspective view of the substrate of FIGS. 1 and 2 following a third dopant implant in accordance with various embodiments of the invention.

Referring to FIGS. 2 and 3, second and third implanted layers 200, 300 are formed in portions of substrate 100 by, e.g., photolithographic masking and ion implantation of one or more dopant species as described above with reference to first implanted layer 110. Second implanted layer 200 will also be referred to herein as the "channel layer," and third implanted layer 300 will also be referred to herein as the "drain layer."

As an alternative embodiment to that depicted in FIGS. 1-3, the dopants defining first, second, and third implanted layers 110, 200, 300 may be blanket-implanted in sequence. In such an approach, extra steps (as will be clear to those skilled in the art) will generally be required to make the appropriate connections to the end of the word line connections. For example, one may implement an etch that is timed to land within the desired (e.g., source) layer along with insulating layer to prevent that connection from also contacting the middle (e.g., channel) and topmost (e.g., drain) doped layers. A suitable insulating layer may be formed by conformal dielectric deposition and etch-back as is done with a spacer formation. Additional alternatives for the formation of first, second, and third implanted layers 110, 200, 300 include epitaxial growth of the layers with in-situ doping of the layers, thin-film deposition of doped layers, or any other combination of growth, deposition, and/or implantation.

Figure 4:
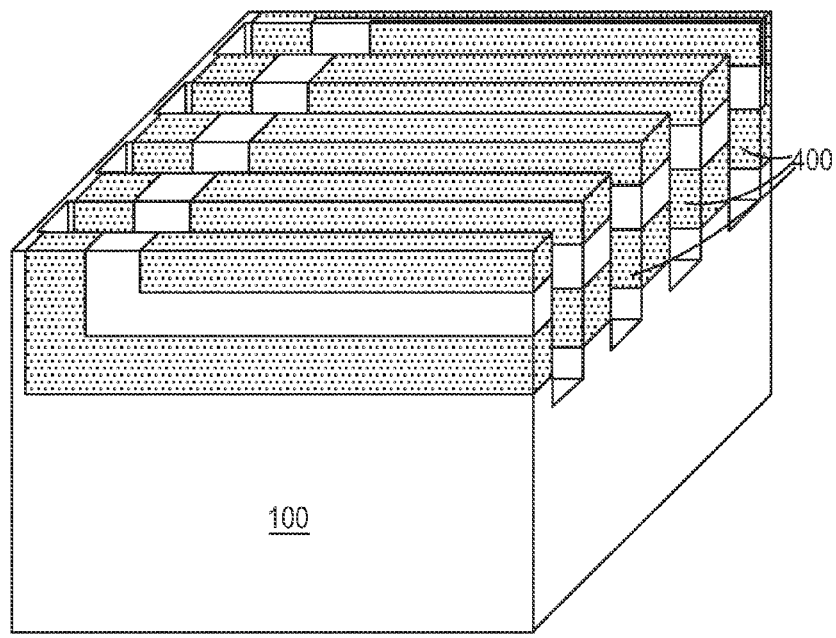
FIG. 4 is a schematic perspective view of the substrate of FIGS. 1-3 following the etching of isolation trenches in accordance with various embodiments of the invention.

Trenches 400 are then etched into substrate 100 as depicted in FIG. 4. These trenches are for isolation, e.g., shallow trench isolation (STI), of the transistors formed along the word lines. Trenches 400 are typically etched such that they extend through the drain layer 300, the channel layer 200, and the source layer 110, and into the bulk of substrate 100. Trenches 400 are typically formed at the finest or critical geometry of the lithography used to maximize the packing density of the device being fabricated.

Figure 5:
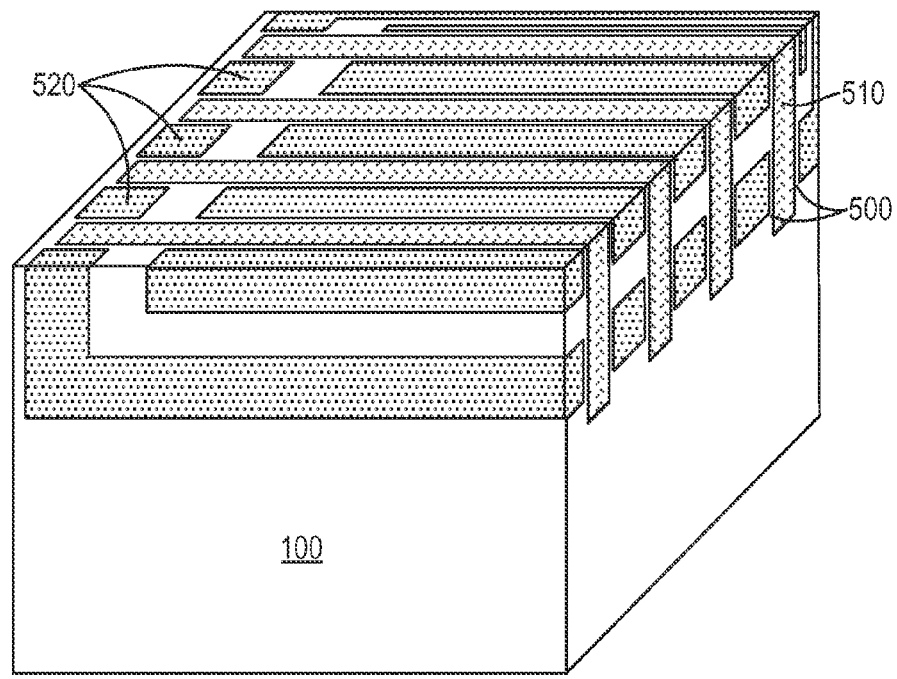
FIG. 5 is a schematic perspective view of the substrate of FIGS. 1-4 following (a) filling of the isolation trenches with a body contact liner and oxide and (b) planarization in accordance with various embodiments of the invention.

In a traditional lateral MOS fabrication, the channel area is generally connected to the semiconductor bulk of the substrate. To provide such a connection in embodiments of the present invention, as depicted in FIG. 5, a thin liner layer 500 (which may be doped similarly to the bulk of the substrate 100 and/or to the channel layer 200) is deposited by, for example, chemical vapor deposition (CVD) or another generally conformal process, and is typically in-situ doped. However, this connection to the substrate bulk (liner layer 500) is optional; if omitted, fabricated transistors may have characteristics similar to planar thin-film transistors (TFT) or silicon-on-insulator (SOI) transistors. Following the deposition of optional liner layer 500, the trenches 400 are filled with a dielectric material 510 (which may include or consist essentially of, e.g., $SiO_2$), and the result is polished by, e.g., chemical-mechanical polishing (CMP), to isolate trenches 400 and to expose the drain 300 and the ends of the word lines 520. (Omission of the liner layer 500 is more preferable as devices are scaled to smaller dimensions, as the number of atoms of thickness of such a liner layer relative to the number of dopant atoms necessary to achieve a particular doping profile may become an issue. Nonetheless, the figures depict an embodiment including liner layer 500.)

Figure 6:
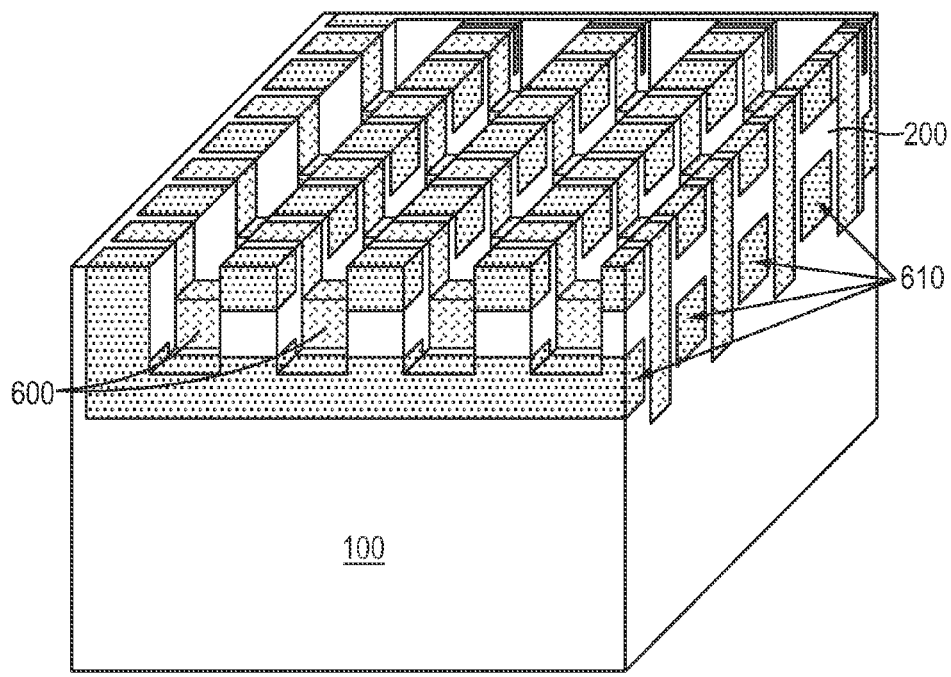
FIG. 6 is a schematic perspective view of the substrate of FIGS. 1-5 following the etching of gate trenches in accordance with various embodiments of the invention.

Finally, as depicted in FIG. 6, gate trenches 600 are formed by, e.g., etching. Gate trenches 600 preferably reach the bottom of the channel layer 102 and may be over-etched slightly into the source layer 110. However, the word lines 610 in the source layer 110 should not be severed by the etch of gate trenches 600, and excessive over-etching is generally avoided in order to maintain low resistivity in word lines 610.

A variation to either connecting the channel layer to the substrate or omitting that connection in a TFT approach is to form the gate trenches in two steps. Specifically, in this variation, the STI trenches are filled with dielectric (without a liner to connect to the substrate) and the gate trenches are patterned and etched and filled in two separate sequences of steps. The first sequence of steps in forming the gate trenches is to pattern and etch out the trenches corresponding to the alternate gate-like lines 830 and filling them with silicon (doped generally to match the substrate), and thereupon connecting these silicon-filled, gate-like lines to the substrate. The second sequence of steps in forming the gate trenches is to form the gate lines as described above. In this variation, during operation, the gate-like lines have no other connection.

Figure 7:
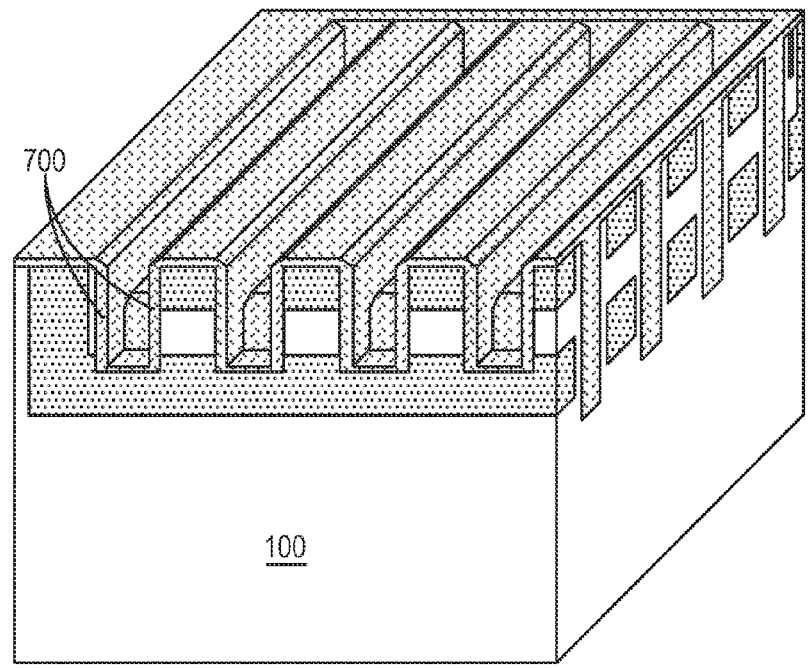
FIG. 7 is a schematic perspective view of the substrate of FIGS. 1-6 following the growing of gate oxide in the gate trenches in accordance with various embodiments of the invention.
Figure 8:
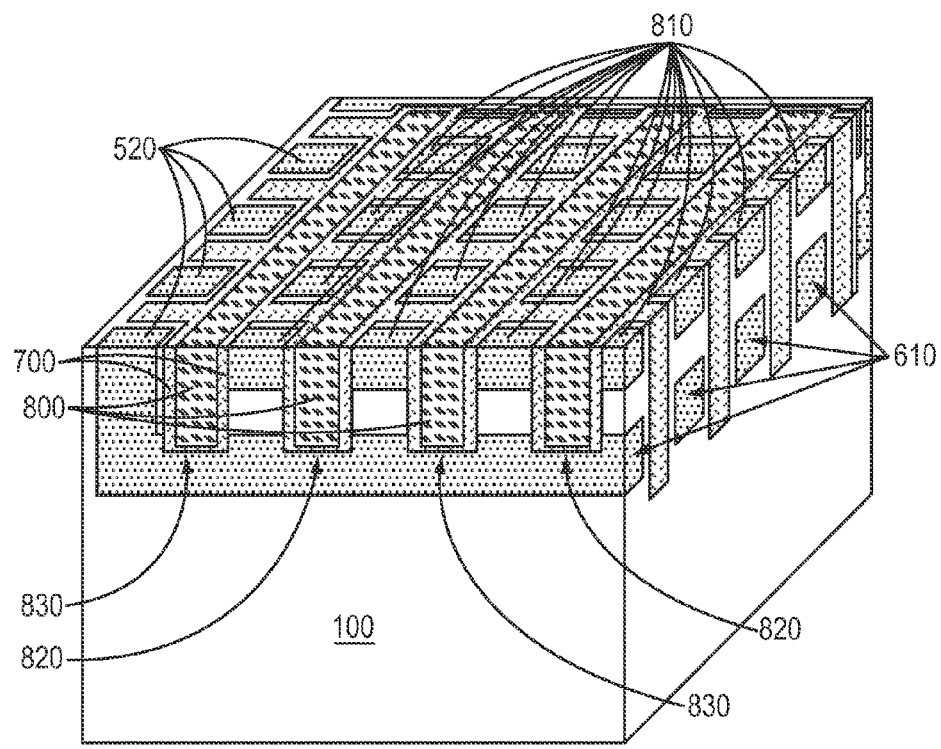
FIG. 8 is a schematic perspective view of the substrate of FIGS. 1-7 following filling of the gate trenches with polysilicon and planarization in accordance with various embodiments of the invention.

Referring to FIGS. 7 and 8, following the etch of gate trenches 600, a gate oxide 700 is grown on the exposed silicon surfaces, and the remainder of each gate trench 600 is substantially filled with gate polysilicon 800. The substrate 100 is planarized, e.g., by CMP, to remove any gate polysilicon and any gate oxide remaining on the surface above the gate trenches 600. As shown in FIG. 8, each transistor 810 in the depicted array of transistors occupies an area equal to 2 F×2 F (i.e., 4 $F^2$) or less. Since laterally constructed MOS transistors typically require a footprint of at least 3 F×2 F (i.e., 6 $F^2$), this is a significant area savings.

Alternatively, again referring to FIGS. 7 and 8, following the etch of gate trenches 600, other gate dielectric materials may be deposited or grown, in addition to or in the place of gate oxide 700, e.g., materials derived from hafnium, aluminum, tantalum, silicon, and the like. These alternative gate dielectric materials may include or consist essentially of (but are not limited to) $HfO_2$, HfN, $Al_2O_3$, AlN, TaN, $Ta_2O_5$, other high-κ dielectrics, and the like. Furthermore, the remainder of each gate trench 600 may be substantially filled with metal gate material or other gate material in place of or in addition to gate polysilicon 800. Such alternative gate materials may be deposited or grown by sputtering, thermal or e-beam evaporation, CVD (in its various forms), ALD, or the like.

In an embodiment, the transistors 810 are NMOS devices (and thus, the substrate 100 is doped P—, the source and drain layers 110, 300 are doped N+ and the channel layer 200 is doped P—) and (as pictured) the bottom N+ region is the source and the top N+ region is the drain. In operation, substrate 100 is generally at the lowest voltage (typically ground or a small negative voltage) and all of the word lines 610 and all of the gate lines 820 are biased to a voltage v. To select a memory cell, the voltage on the word line on which the memory cell is connected is lowered (e.g., to $v-V_{th}$ where $V_{th}$ is the turn-on threshold voltage of the transistor 810), and the gate line 820 passing next to the memory cell is raised (e.g., to $v+V_{th}$). This will result in a gate-to-source voltage greater than $V_{th}$ (e.g., a voltage of about $2V_{th}$) being placed on the device and the two transistors on the selected gate line that are also on either side of the asserted gate line may be switched on. In a preferred embodiment, the bit lines (not depicted in FIG. 8) will exit the array on two sides; the even-numbered bit lines will exit to one side and the odd-numbered bit lines will exit to the other. In this way, only one of the two above-referenced transistors will be active; which transistor is active is determined by which side of the array the active bit line comes from. The gate lines 820 include every other gate line, as the gates are shared by pairs of memory devices. Thus, the alternate gate-like lines 830 may act as additional isolation between device pairs and may be left floating or may be connected to a bias voltage (e.g., equal to the substrate bias voltage).

In one embodiment, drain 300 of the memory cell NMOS transistor 810 is connected to a word line 610. In this way, all of the unselected word lines (as well as the substrate 100) may be kept at ground potential. To select a word line 610, the voltage on that word line 610 is raised. This approach minimizes current leakage, as only one word line 610 is biased to a voltage different from the substrate, resulting in the word-line-to-substrate junction being reverse biased (with a concomitant low leakage current). All of the unselected word lines 610 are biased to the same potential as the substrate and exhibit no current leakage. The corresponding bit line selection has the unselected bit lines biased to a small positive voltage such that the selected bit line is pulled to a lower potential (e.g., ground potential or the potential of the substrate). If transistors 810 are PMOS transistors, the above voltage polarities may simply be reversed to achieve the same result.

Embodiments of the present invention include conductive strapping features that help to compensate for the series resistance of bit lines and/or word lines in order to provide greater current at a given memory cell while requiring lower supply voltages. To add strapping to reduce the resistance of the word lines, word line contacts 520 may be intermittently placed along the length of the word lines 610 (e.g., every 16 or 32 or 64 memory cells or the like) and then connected to a metal word line conductor running above and parallel to each word line 610. In this manner, the resistivity of the doped silicon word line 610 is offset by a parallel, more conductive metal word line and only a short resistive segment (from the closest strapping connection between the doped word line 610 and the parallel metal word line to the targeted memory cell) is on the conduction path. Similarly, strapping may be added to the gate lines. The strapping preferably does not interfere with the positioning of the storage elements and the bit lines. Since the bit lines run parallel with the gate lines, the gate line strapping may be placed below the bit lines; however, the word line strapping is still preferably located above the memory elements and the bit lines (to avoid colliding with the storage elements that connect between the bit lines and the tops of the transistors 810). The spacing on either side of the word line strapping contact vias may optionally be sized larger than the critical geometry along the direction of the word line 610 without a significant loss of array density. The gate line strapping may optionally be formed directly on the gate line poly, thus eliminating the need for the drop-down connections, and the gate-line material may include or consist essentially of a higher conductive material such as metal and/or be made taller.

Peripheral circuits including vertical MOS transistors may be fabricated simultaneously with the vertical transistors of the storage cells. By fabricating these peripheral transistors at substantially the same time as the storage cell transistors 810, a lower manufacturing cost may be achieved. These peripheral transistors may also be wired together to achieve additional electrical properties such as higher current passing ability, greater capacitance, or the like. The peripheral transistors may also be laid-out with a larger area for wider transistor channels for higher current carrying capacity. Two or more transistors in series may equate the performance of a higher voltage transistor by acting as a voltage divider and sharing the voltage drop across them. The channel length of such transistors is determined by the thickness of the channel layer 200.

An alternate embodiment of the present invention, as suggested above, excludes the sequence of masking and implanting in favor of creating an initial substrate having the requisite layers of doped materials (that define layers 110, 200, 300) through blanket techniques. For example, these layers may be formed by epitaxial deposition. Once the layers are deposited, the STI trenching and other subsequent etches may be performed with the inclusion of additional steps for creating contacts 520 to the layer 110. This may be accomplished by etching openings to a depth where layer 110 is exposed at those locations where contacts 520 are desired; these openings may then be filled with conductive material, such as heavily doped semiconductor material (doped to the same type, N or P, as the layer to be contacted) or metal (optionally with appropriate surface doping to make the contact ohmic). In a further variation, areas of the substrate 100 may be etched and then refilled utilizing epitaxial deposition. In this case, the deposited layers may be doped differently in certain areas in order to enable the fabrication of different device types on a single substrate (e.g., vertical NMOS plus vertical P-i-N diodes or vertical PMOS and vertical NMOS). The layers may be formed by implantation and/or epitaxy. Once the areas of layered doping are created, if the bottom conductive layers 110 are at the same depth for two or more areas, those areas may be processed in parallel (i.e., the orthogonal trenches etched and filled with STI and/or gate poly). If a combination of vertical MOS and diodes is created, the "gate" material on both sides of the diodes may be biased to a set voltage that enables normal diode operation.

Alternative Switching Devices

Various embodiments of the present invention utilize switching devices different from the vertical MOS transistors described above. One example is the threshold triggered device, such as the four-layer diodes described in U.S. Pat. No. 7,376,008, the entire disclosure of which is incorporated herein by reference. FIG. 9 illustrates three symbolic representations of a four-layer diode, also known as a thrystor, shockley diode, PNPN diode, or SCR. FIG. 9A illustrates the twin-bipolar-transistor model that may be utilized to describe characteristics of the devices utilized in embodiments of the present invention. In this model, a positive voltage (such as Vpp) is applied to the PNP transistor's emitter A and a lower voltage is applied to the NPN transistor's emitter C. In a two-terminal device (i.e., if terminal B is ignored for a moment), by raising the positive voltage, leakage current through the PNP transistor's collector to the base of the NPN transistor causes the NPN to begin to turn on. This starts to turn on the PNP transistor, forming a positive feedback loop that eventually causes the full device to avalanche and switch on. If a negative voltage (or a voltage lower than that which would occur at point B in a two-terminal version of the device) is applied to terminal B, the leakage current that causes avalanche is drawn away from the NPN transistor's base and makes avalanche more difficult (a greater positive voltage may be required at terminal A). However, if the voltage at point B is raised, this helps to turn on the NPN transistor and makes avalanche easier (a lesser positive voltage may be required at terminal A). FIG. 9B illustrates a generalized silicon device structure, and FIG. 9C illustrates the schematic symbol of the device. Other switching type devices may also be utilized in embodiments of the present invention.

FIG. 10 depicts a simplified diode-decoded, four-layer-diode switch selector. A fully decoded diode decoder has as inputs N complementary address pairs to decode one out of 2N lines. In a fully decoded diode decoder, every line to be decoded is typically connected to every address pair (either to the address line or the address complement line, but not both) by a diode. All of the decoding diodes generally face in the same direction, i.e., every address line will be connected to either the anodes or the cathodes. The complementary address pair lines are used to disable a given line in the collection of lines to be decoded and thus, a diode is present in the decoder between every complementary address pair line and every line in the collection of lines to which that address line does not correspond. That is, if each of the collection of lines is uniquely numbered with one of the decoded addresses between 0 and (2N−1) inclusive, and if that unique number is written as a binary number showing both the address bit and its complement, the binary address pattern corresponding to that line will reveal the pattern of diodes to be connected between it and the complementary address lines. If the cathodes of the diodes are connected to the address lines, each one bit represents a diode. For example, if the first line in FIG. 10 is line 0, the bits corresponding to this address, showing both the address and complement bits in the same order as the address lines are ordered, are 0101 (corresponding to A2, $\overline{A2}$, A1, and $\overline{A1}$), and the diode pattern is no-diode, diode, no-diode, diode as shown in FIG. 10. The diode decoder illustrated in FIG. 10 pulls all lines to a low voltage except for the one being addressed. By reversing the direction of the diodes in the decoding array, one may alternatively pull all but one line to a high voltage for connecting to the base of the NPN transistor (i.e., the other internal layer of the four-layer diode) to achieve a similar effect. With either approach, the four-layer diodes may be used as the line drivers to an array. One line driver may be made to be more easily switched (while the rest are less easily switched) by applying a control voltage to the middle layer of the other four-layer diodes, making them less easily switched. Switching may also be controlled by adding a capacitively coupled trigger input. Such an input may be held low with the addresses being applied and then brought high to impose a pulse of current to each control gate line to the line drivers. Then, since all but one line is being held low through the diode-decoder array, only one control gate experiences a pulse of current and is triggered to its on state. As described below, embodiments of the present invention include a method for fabricating both the diodes of the decoders and the four-layer diodes in a unified process.

Various embodiments of the invention include programmable materials such as phase-change materials or resistive-change materials that change their programmed state by applying a voltage across that material (or, correspondingly, by causing a current of a given magnitude and duration to pass therethrough). In embodiments in which threshold devices such as four-layer diodes are utilized in a memory array including such materials, care is taken to ensure that the voltages across the four-layer diodes is not placed across the programmable material when those devices switch (thereby causing the voltage across those devices to drop). FIG. 10 includes an additional input TRIG for triggering the switching of the device. The TRIG input is used to capacitively couple (as depicted, through capacitors, but reverse biased diodes may be utilized) a positive pulse of current to the B terminal of the four-layer device to cause it to avalanche without placing a large voltage across the outer terminals of the device (that might be momentarily placed across the programmable material at the time of avalanche). Only one four-layer device is switched on as a function of the complementary address inputs and the layout of the diode decoder, because the diode decoder ensures that every line but one will have a path through a diode in the decoder to a low voltage address input. This path will dissipate the capacitively coupled trigger pulse to all but the one device without a diode path to a low voltage through the diode decoder. In this manner, the desired voltage to be placed across the memory cell may be applied to Vpp (taking into account any circuit voltage drops) without having to elevate that voltage to cause triggering. Furthermore, since memory-cell reading is typically done with a low voltage and writing is done with a higher voltage, a targeted memory cell should be avalanched by a lower voltage when reading and a non-targeted memory cell should not be inadvertently avalanched by the higher voltages used during writing. In embodiments of the present invention, the desired voltage for reading or writing (or, in the case of some programmable materials, a third voltage for erasing) is applied to Vpp (taking into account any circuit voltage drops) and then the separate triggering input TRIG switches on the selected four-layer device.

FIG. 11 illustrates a schematic diagram of a simplified memory array 1100 in accordance with various embodiments of the invention for ease of explanation (in practice, arrays of much greater capacity are anticipated). In FIG. 11, the four-layer devices have been drawn using the bipolar equivalent circuit of FIG. 9A, but the devices are generally constructed as illustrated in FIG. 9B. FIG. 11 is drawn with the row decoders 1110 split with the even rows being driven from the left side of array 1100 and the odd rows driven from the right side. The columns are drawn as being all driven from the bottom of array 1100 in order to illustrate that both divided and non-divided decoders may be utilized for the rows and/or the columns. The row diode decoders 1110 are duplicated on both sides of array 1100 (except for $\overline{A0}$ on the left and A0 on the right), and the column diode decoder 1120 is drawn below the column drivers at the bottom of the figure. Unlike previous designs, the switching control inputs for every pair of lines are tied together. The decoder 1130 for the memory cell gate control signal is drawn between the array 1100 and the right-side row drivers 1110 (the rows are decoded and driven in pairs of rows). A single row is selected by activating the gates of the memory cells in a given pair of rows, and resolving to a single memory cell as the intersection of the pair of rows triggered (by the gate pulse to the pair of rows), with the driven row (driven from either the left or right side), and the driven column. In operation, the complementary address pairs are asserted (where an address bit is either pulled low for a 0 input or floating for a 1 bit) along with the TRIG input being held low. The Vpp level is applied, and the TRIG input is transitioned from low to high in order to induce a capacitively coupled voltage spike to the decoder line connected to each corresponding gate terminal of the four-layer devices (e.g., their B inputs). The TRIG inputs are typically designed to be on the far side of the diode decoder from the four-layer device, but this is only a consideration for tight geometries where the transmission of the trigger signal may propagate to the B terminal input before being fully dissipated by the low address inputs. Only the capacitively coupled spike on the single line without a diode connected to a low address input will reach and trigger its respective four-layer device. This will turn on the row driver, column driver, and memory cell at generally the same time. During a read operation, the low Vpp voltage results in a current through the array 1100 that will be sensed with a Read Sense circuit in the current path (depicted at the top of array 1100 on the row driving circuits 1110, but may be at the bottom of array 1100 at the column driving circuits 1120). During an erase or program operation, the read sense is generally ignored or switched off, and writing or erasing is controlled by the level, duration, and waveform of the Vpp voltage. Three-dimensional stacking of arrays 1100 may be accomplished as described in U.S. Pat. No. 6,956,757 (the entire disclosure of which is incorporated by reference herein), where a relatively small number of signals (typically complementary address signals, Vpp, TRIG and Read Sense) are connected vertically, layer to layer.

Figure 12:
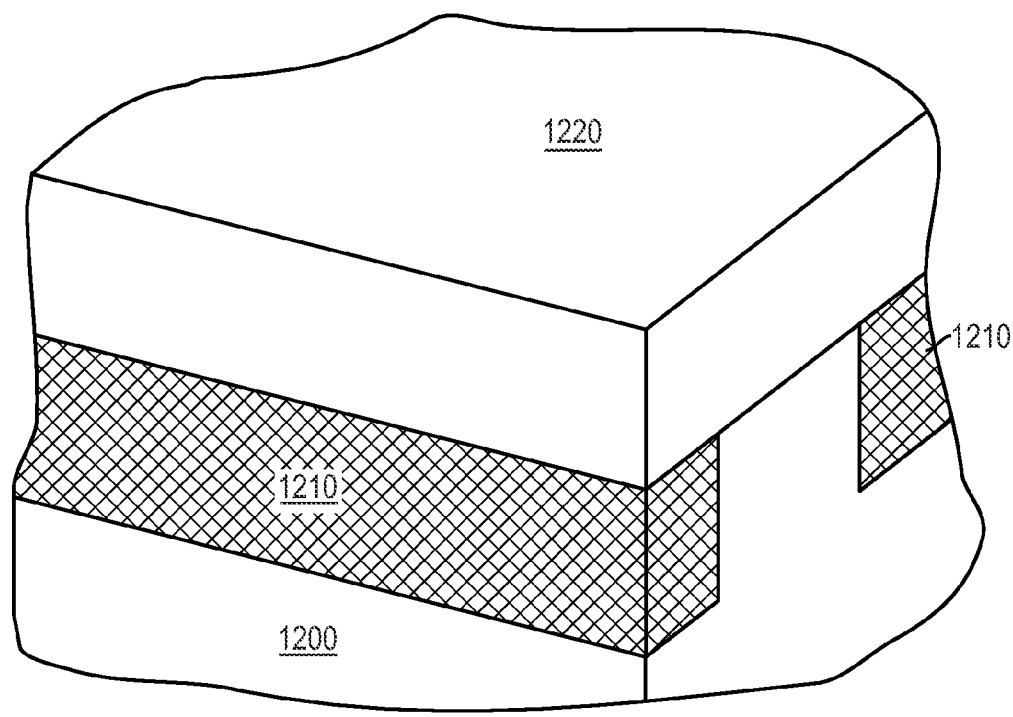
FIG. 12 is a perspective view of a portion of a memory device during fabrication following damascene formation of column lines and encapsulation with dielectric material in accordance with various embodiments of the invention.

Manufacture of the array 1100 may be accomplished with standard semiconductor-processing techniques. Referring to FIG. 12, a substrate 1200 has within it bottom metal conductors 1210. Bottom metal conductors 1210 may be fabricated by, e.g., a metal damascene process, although pattern-and-etch techniques may also be utilized. These conductor lines 1210 will typically correspond to the column lines (sometimes called bit lines) and connect to the cathode ends of the active memory cell devices. Typically, for a high-density memory device, bottom metal conductors 1210 are fabricated at the critical dimension F (also referred to as the memory half-pitch). The center-to-center distance from one such line to the next is 2×F, or 2 F. Typically, for a single bit per cell memory cell, the highest density is 2 F×2 F, or 4 F$^2$. Following the formation of bottom metal conductors 1210, a layer 1220 of dielectric or non-conductive material is deposited. In accordance with various embodiments of the invention, F may be approximately 250 nm or less, approximately 180 nm or less, approximately 130 nm or less, approximately 90 nm or less, approximately 65 nm or less, approximately 45 nm or less, or even approximately 25 nm or less.

Figure 13:
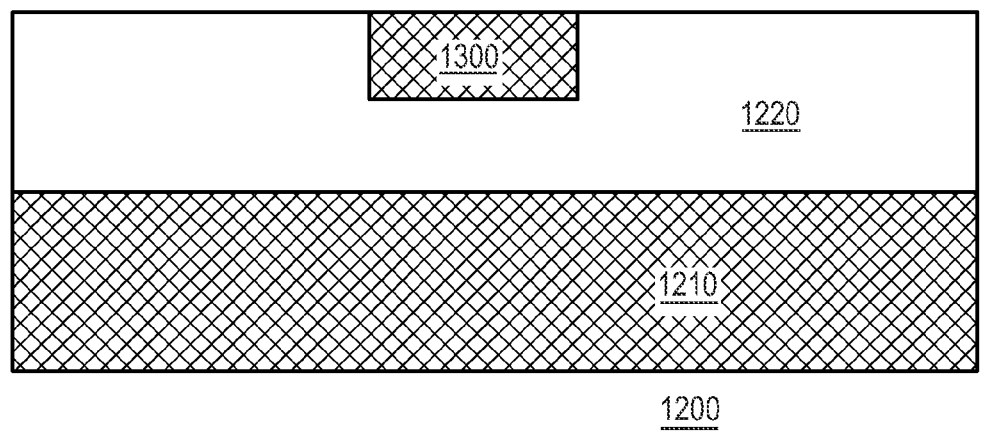
FIG. 13 is a side view of a portion of the memory device of FIG. 12 following damascene formation of an orthogonal column gate control line in accordance with various embodiments of the invention.

Referring to FIG. 13, middle electrode conductor line 1300 is formed within layer 1220 by, e.g., a damascene process. In the depicted embodiment, middle electrode conductor line 1300 is orthogonal to bottom metal conductor line 1210. As discussed below, other designs and layouts may also be utilized.

Figure 14:
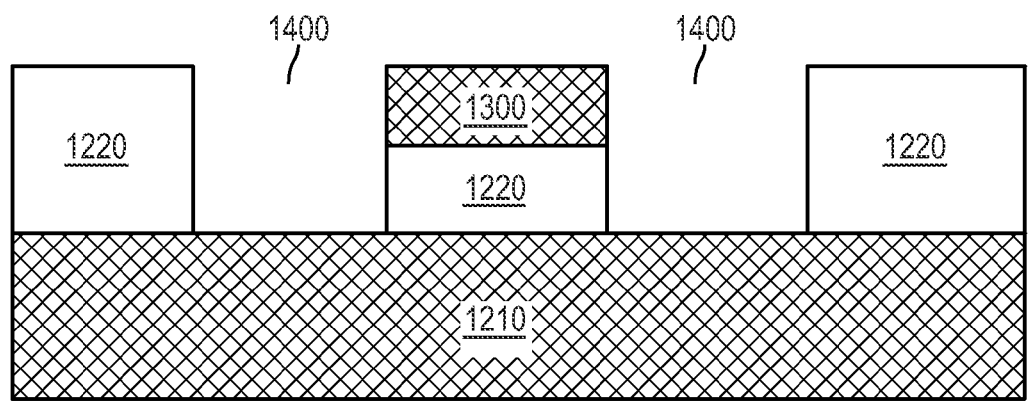
FIG. 14 is a side view of a portion of the memory device of FIGS. 12 and 13 following etching of two memory cell locations in accordance with various embodiments of the invention.

As shown in FIG. 14, holes 1400 corresponding to the active element of the individual memory cells to be fabricated (two are depicted here) are patterned and etched. The pattern may be made with two features that are each 1 F$^2$ or with a single feature centered about metal line 1300 that is 3 F×1 F (in which case the middle electrode conductor line 1300 metal protects the area between holes 1400 from being etched).

Figure 15:
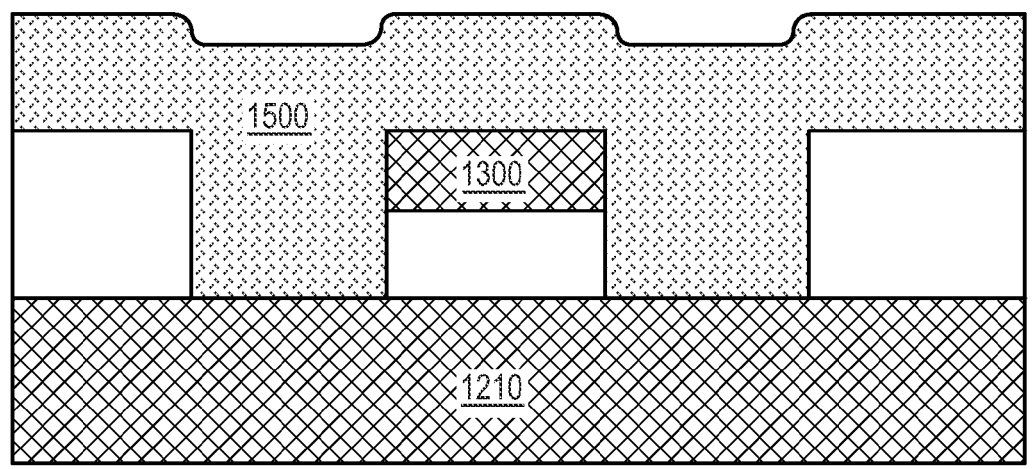
FIG. 15 is a side view of a portion of the memory device of FIGS. 12-14 following N+ silicon deposition in accordance with various embodiments of the invention.
Figure 16:
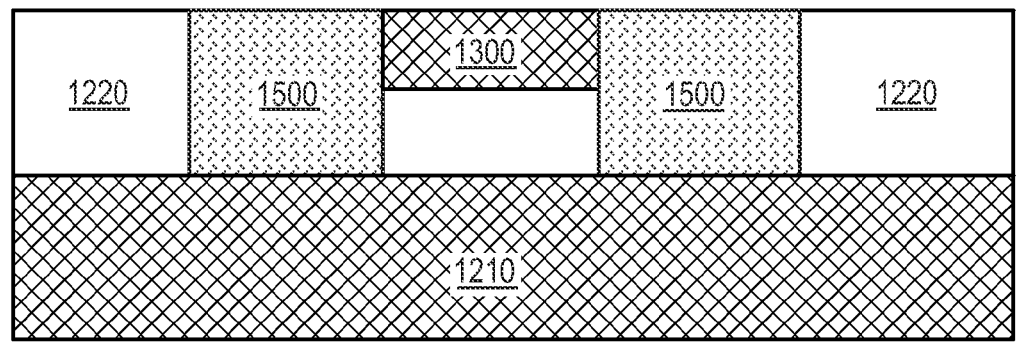
FIG. 16 is a side view of a portion of the memory device of FIGS. 12-15 following planarization in accordance with various embodiments of the invention.

Referring to FIG. 15, N+ silicon 1500 is blanket-deposited to at least substantially fill the etched holes 1400. Silicon 1500 may be polycrystalline if deposited on a bottom conductor 1300 including or consisting essentially of metal. However, bottom conductor 1300 may alternatively be made of doped silicon and substantially all of silicon 1500 may be single crystalline. In an embodiment, silicon 1500 is deposited in a selective epitaxial process in which silicon 1500 grows from the silicon surfaces exposed in the bottoms of the holes 1400. Silicon 1500 is planarized (e.g., by CMP) as shown in FIG. 16. A small amount of overpolishing of silicon 1500, conductive line 1300, and layer 1220 (where exposed to the surface) is performed in some embodiments to ensure a substantially planar surface.

Figure 17:
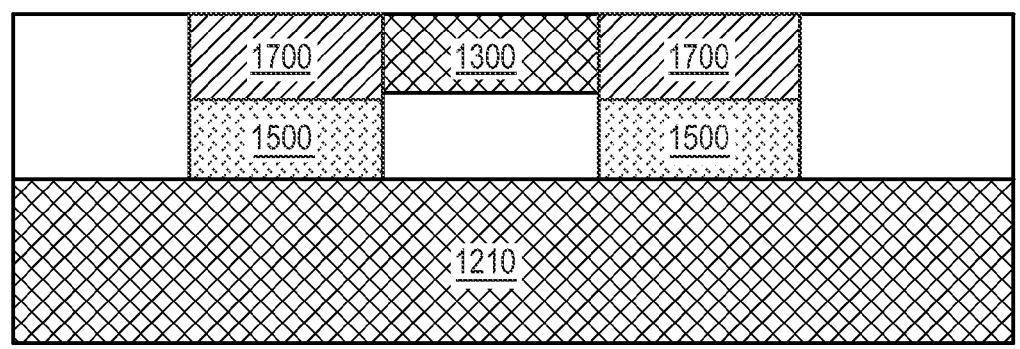
FIG. 17 is a side view of a portion of the memory device of FIGS. 12-16 following P+ silicon implant in accordance with various embodiments of the invention.

As shown in FIG. 17, a P+ implant is used to change the doping of the upper portion of deposited silicon 1500, thus forming P+ silicon 1700. The lower boundary of P+ silicon 1700 is below the bottom edge of middle electrode conductor line 1300 such that middle electrode conductor line 1300 contacts P+ silicon 1700 but not N+ silicon 1500 (or the junction between P+ silicon 1700 and N+ silicon 1500). In another embodiment, silicon 1500 and silicon 1700 are epitaxially deposited using in-situ doping of the appropriate type.

Figure 18:
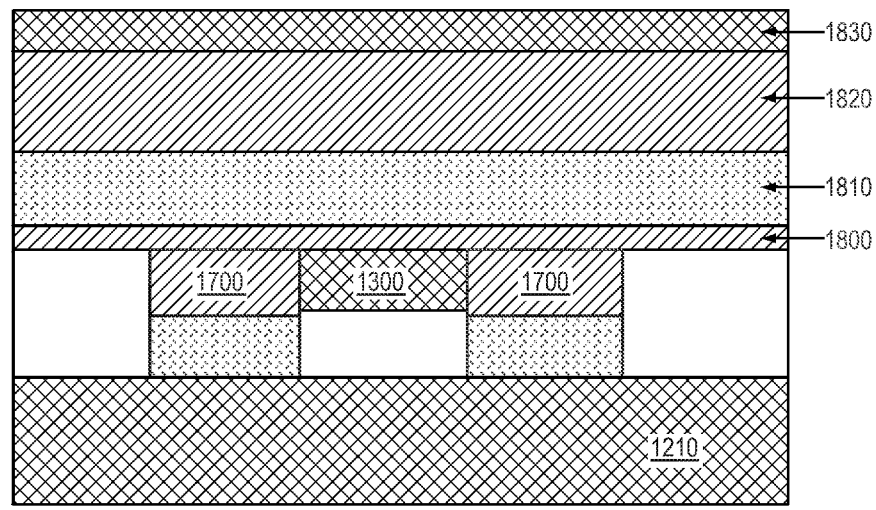
FIG. 18 is a side view of a portion of the memory device of FIGS. 12-17 following deposition of P+ silicon, N+ silicon, P+ silicon, and a top contact in accordance with various embodiments of the invention.

Referring now to FIG. 18, layers of doped silicon and a top contact are formed. First a P+ silicon layer 1800 is deposited, followed by deposition of an N+ silicon layer 1810. The P+ layer 1800 extends the thickness of P+ silicon layer 1700 such that middle electrode conductor line 1300 contacts P+ silicon 1700 but not N+ silicon 1810 (or the junction between P+ silicon 1700 and N+ silicon 1810). A P+ silicon layer 1820 and a top contact 1830 are formed above N+ silicon 1810. The above-described layer formations may be more complex and may further comprise intervening layers of intrinsic silicon as is understood to those skilled in the art. Such layers may be deposited with a selective epitaxial growth process, particularly if silicon 1500 is deposited with a selective epitaxial growth process. Epitaxial growth will limit leakage currents that could result in the false triggering of, or a lowered switching threshold for, the pillar device 1900 when it is an avalanching device such as an SCR, a four-layer diode, a gated four-layer diode, or the like. In various embodiments, the above-described layers include or consist essentially of materials other than silicon, e.g., other type-IV semiconductor materials, III-V semiconductor materials, or even polymeric or organic semiconductors.

Figure 19:
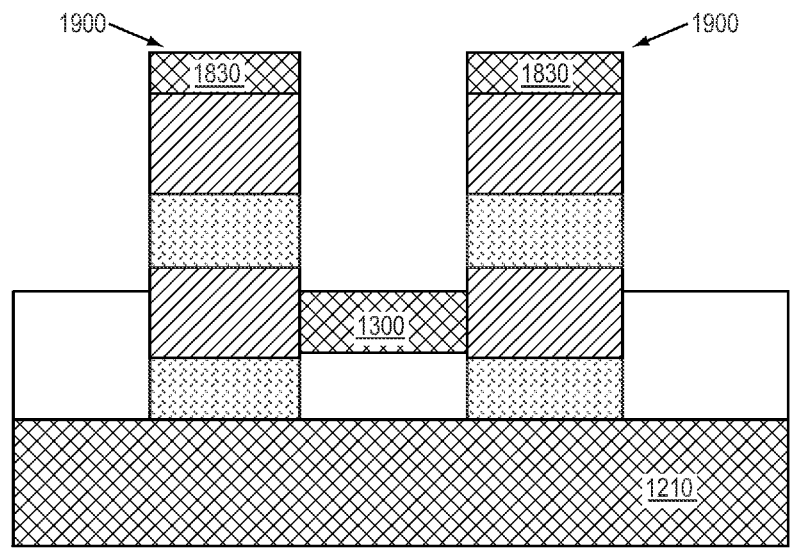
FIG. 19 is a side view of a portion of the memory device of FIGS. 12-18 following pillar etch formation of active memory elements in accordance with various embodiments of the invention.
Figure 20:
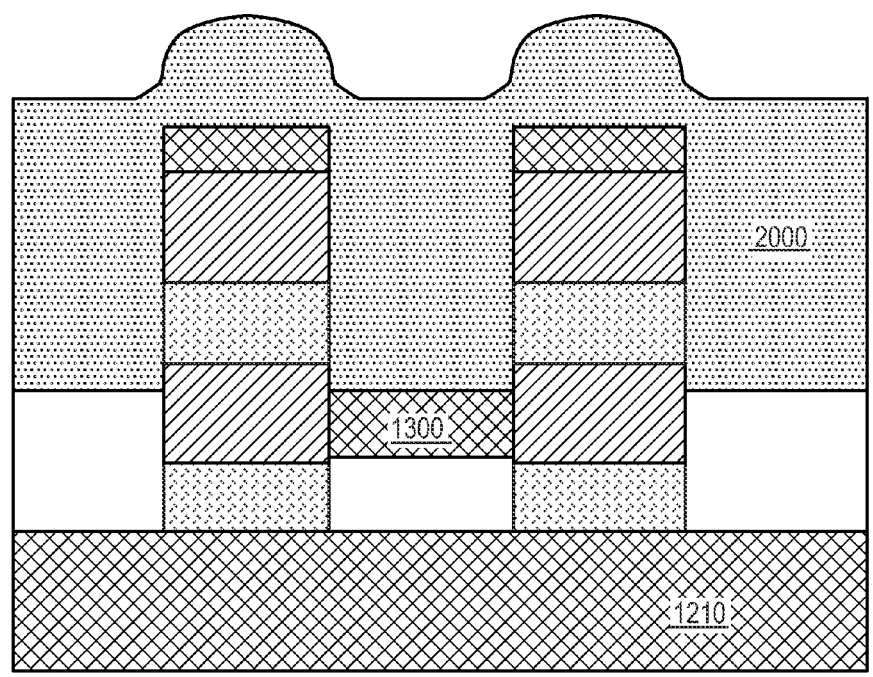
FIG. 20 is a side view of a portion of the memory device of FIGS. 12-19 following a dielectric fill in accordance with various embodiments of the invention.
Figure 21:
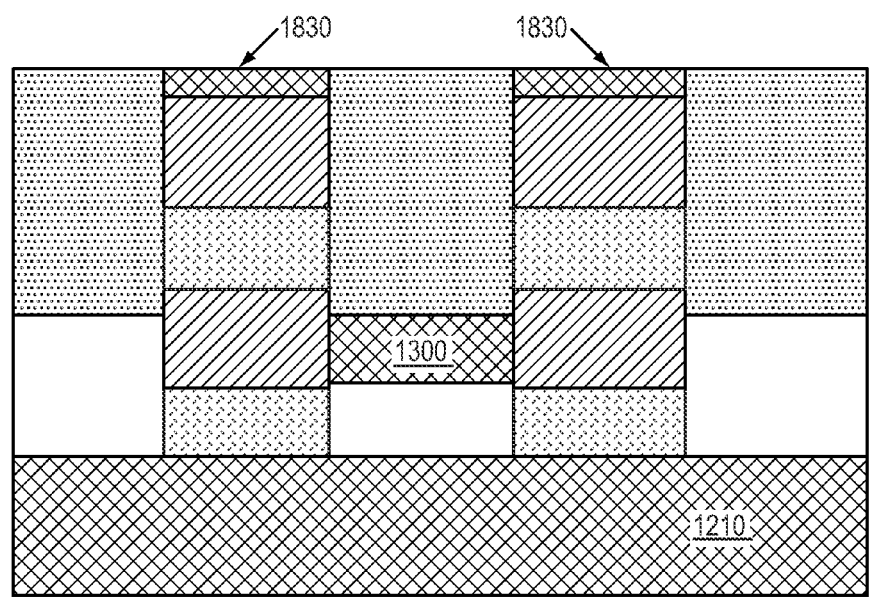
FIG. 21 is a side view of a portion of the memory device of FIGS. 12-20 following dielectric planarization in accordance with various embodiments of the invention.

As illustrated in FIG. 19, the layers are patterned and etched into individual pillars 1900, each pillar 1900 forming the active switch of a memory cell. Each pillar 1900 is generally of the size 1 F$^2$. With a spacing to the left and right of each pillar 1900 being approximately 1 F, and with a spacing (not shown) in front and in back of each pillar 1900 also being approximately 1 F, the memory cell has a footprint of approximately 4 F$^2$. It should be noted that the top contacts 1830 may include or consist essentially of materials and/or structures to implement programmable capability as will be described below, but for simplicity, are shown only as a simple conductive material here. As shown in FIG. 20, pillars 1900 are then surrounded with a dielectric or non-conductive material 2000 that is subsequently planarized to expose contacts 1830 to the top of each memory cell (as shown in FIG. 21).

The process described above produces multiple twin columns of memory cells where each pair of memory cells shares a single conductor line connecting to bottom conductor 1300

(i.e., the middle electrode of each memory cell). When this conductor line is energized, all memory devices on either side of that conductor line may be activated together, and a single cell is identified by the signals selecting (i.e., asserting with a low voltage) a single row passing below the cells (thereby reducing the number of potentially activated cells to two at the intersection of the one active row with the twin columns of memory cells) and selecting (i.e., asserting with a high voltage) a single column passing above the cells.

Figure 22:
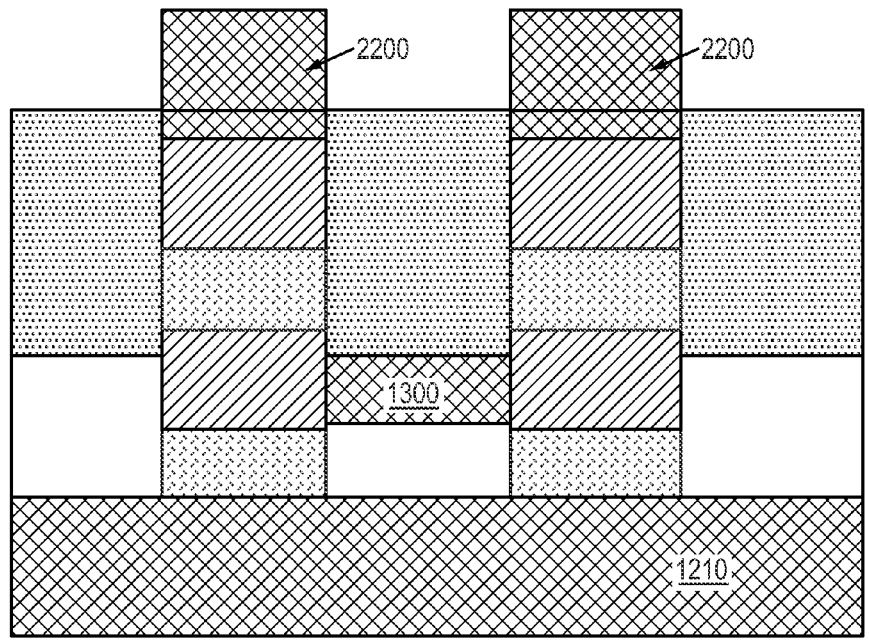
FIG. 22 is a side view of a portion of the memory device of FIGS. 12-21 following deposition and patterning of the top metal into row lines in accordance with various embodiments of the invention.

Referring to FIG. 22, top column conductor lines 2200 that run in parallel with middle electrode conductor line 1300 and orthogonal to bottom metal conductor line 1210 are fabricated. One of these two top column conductor lines 2200 is energized (with a high voltage) to uniquely select a single memory cell. All other top column conductor lines (not shown) have little or no impact on circuit operation as the memory cells associated with those other top conductors are disabled by a low voltage on their middle electrode conductor lines.

Figure 23:
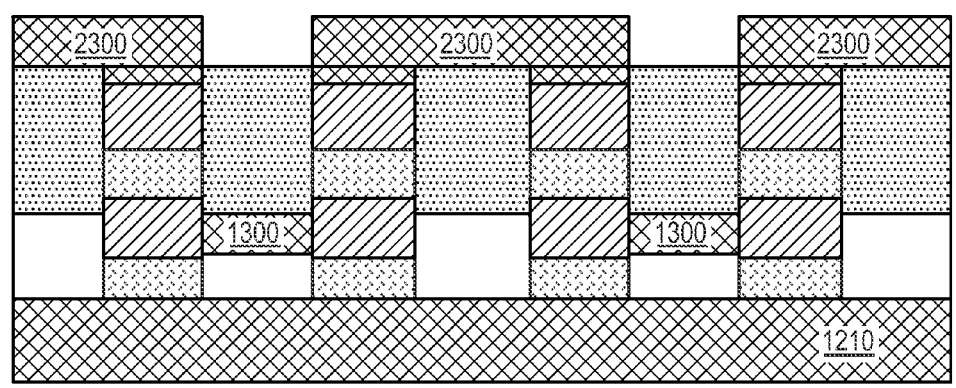
FIG. 23 is a side view of a portion of the memory device of FIGS. 12-22 following deposition and alternate patterning of the top metal into row lines in accordance with various embodiments of the invention.

For this reason, as shown in FIG. 23, as an alternative to top conductor lines 2200, top conductors 2300 may be fabricated. Top conductors 2300 each contact the tops of two columns of memory cells. As long as the two contacted columns include cells from two different twin-cell columns (i.e., two columns not both contacted by the same conductor 1300 therebetween), a column of memory cells may be uniquely identified as being the intersection of two rows of memory cells having a common middle electrode conductor line 1300 and two rows of memory cells having a common top conductor 2300. A memory cell from this uniquely selected column of memory cells is identified by the selection of a single orthogonal row 1210 passing below it. An additional benefit of this structure is that the resistance along the length of "triple-wide" top conductor 2300 is approximately one-third that of "single-width" top conductors 2200. As a result, the voltage drop thereacross is also reduced by approximately one third, enabling use of smaller supply voltages. An embodiment of the invention implements a similar triple-wide conductor as the bottom conductor (i.e., the two conductors to the same side of a gate line) and a column of memory cells may be uniquely identified as being the intersection of two rows of memory cells having a common middle electrode conductor line 1300 and two rows of memory cells having a common bottom conductor. This may be implemented in the conductive line in the substrate or in the parallel conductive strapping lines described above.

As an alternative to triple-wide top conductors 2300, single-width top conductors 2200 may be implemented so that all of the even-numbered top conductors are wired together an exit to one side of the array, and all of the odd-numbered top conductors are wired together and exit the array to the opposite side. In this implementation, each control conductor (i.e., gate line) turns on one row of even-numbered transistors and one row of odd-numbered transistors. Selecting either all of the even-numbered top conductors or all of the odd-numbered top conductors results in the selection of a single row of memory cells (i.e., the intersection of one even-numbered row and one odd-numbered row selected by the gate conductor with either the even-numbered top conductors or the odd-numbered top conductors). A similar alternative implementation can be achieved by tying together all the even-numbered gate conductors and all of the odd-numbered gate conductors and selecting a single triple-wide top conductor 2300, which also results in a single row selection. Other smaller groupings comprising fewer than half of all the conductors (e.g., fewer than all the even-numbered or odd-numbered conductors) as well as other groupings of gate conductors and top conductors can be employed. The bottom conductors can be brought into such groupings as well. In some implementations, such as when multiple memory cells are accessed at once, the resulting intersection can involve selection of more than one row.

Figure 24:
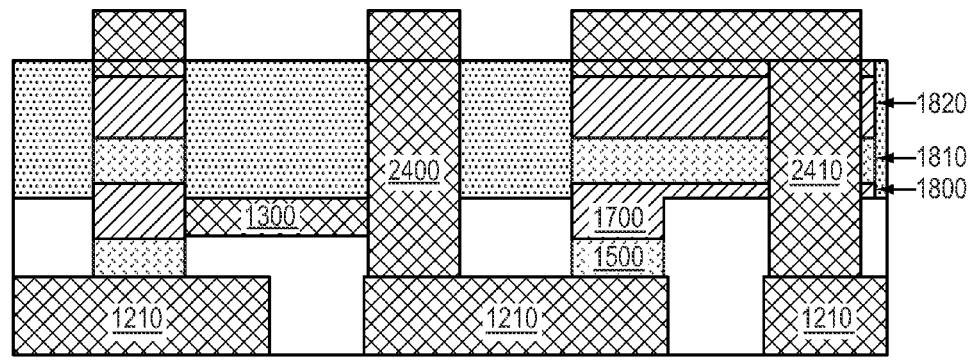
FIG. 24 is a side view of a portion of the memory device of FIGS. 12-23 following via connection formation for a top-metal-to-bottom-metal contact and formation of P-N junction devices for decoder diodes in accordance with various embodiments of the invention.

As shown in FIG. 24, vertical via connections 2400, 2410 are formed. These via connections are formed by patterning holes and then filling the holes with conductive material (e.g., a metal). The via formation is generally performed just before the top metal conductors 2200 or 2300 are formed. It should be noted that via 2410 passes through layers of silicon 1800, 1810, 1820 (patterned, in this instance, to the side of lower silicon layers 1500, 1700) and will typically short circuit those layers together. This structure enables via conductor 2410 to make an electrical connection to layer 1800, in particular, and through it a connection to layer 1700. Layer 1700 forms a P-N junction with layer 1500 before contacting the bottom conductor 1210. Thus, via 2410 enables the fabrication of P-N junction devices simultaneously with the formation of three-terminal P-N-P-N devices. Alternatively, the device shown on the left side of FIG. 24 may be used as a P-N junction device if its top connection is unused. As shown, the P-N junction device on the right side of FIG. 24 is connected to a three-terminal P-N-P-N device on the left side, thus corresponding to a portion of the circuit shown in FIG. 11. These techniques may also be used to wire peripheral circuits that include or consist essentially of vertical MOS transistors.

Many variants of the present invention will be apparent to one skilled in the art in light of the present teaching, such as implementation on the column lines (rather than, or in addition to on the row lines), decoders other than diode decoders, use with fuses instead of antifuses, and use with other reprogrammable devices (such as phase-change material devices, resistive material devices, one-time programmable (OTP) devices, and Flash-like floating gate devices, etc.) instead of antifuses. Furthermore, for three-dimensional memory array variants, the disabled line may be in the third dimension (i.e., in the direction orthogonal to the rows and columns) or may disable the selection of one out of many subtiles. The switching device in the memory cell may be a gated P-N-P-N device, or as one skilled in the art will readily recognize by omitting the top P+ deposition step, may be an N-P-N bipolar transistor device. Using the techniques described herein to fabricate other devices such as P-N junction devices, N-P-N-P devices, P-N-P devices, FET devices, J-FET devices and unijunction transistors will all be apparent in light of the present teaching. Note that in the case of an FET-type device, middle conductor layer 1300 is constructed as a pair of layers where the first (lower) layer is a conductive layer and the second (upper) layer is a dielectric layer. Before depositing the silicon in the hole, a thin dielectric layer is either conformally deposited or grown and then etched back (as is often done for a side-wall spacer structure) to form the gate oxide; these extra features wrap the middle conductor with an insulating layer. The switching devices may be constructed with one middle contact in addition to the top and bottom contacts, or with two or more middle contacts. Devices may be constructed as a part of an array or may be designed and manufactured to stand alone or as portions of peripheral circuits.

Referring back to FIG. 22, an embodiment of the present invention features top column conductor lines 2200 running in parallel with middle electrode conductor line 1300 and orthogonal to bottom metal conductor line 1210. One of the two top column conductor lines 2200 is energized (with a high voltage) to uniquely select a single memory cell. In an alternative embodiment, top column conductor lines 2200 run in parallel with bottom metal conductor line 1210 and orthogonal to middle electrode conductor line 1300. In such a variant, one of the two bottom metal conductor lines 1210 is energized (with a low voltage) to uniquely select a single memory cell.

Embodiments of the present invention may feature memory cell devices having multiple middle connections. For example, from the point in the process shown in FIG. 17, a layer of dielectric or non-conductive material may be deposited and then patterned. Into such a layer, an additional middle conductor may be formed with a damascene process (resulting in a layer on top of that shown in FIG. 17 looking like the upper half of FIG. 13). This second, upper middle electrode conductor line may be parallel to or orthogonal to the first, lower middle electrode conductor line 1300. The ends of the two middle conductor lines may be staggered to enable via connections to be made to both. The process continues by etching holes at each memory cell and filling with P+ silicon (to merge with the P+ shown in FIG. 17) and planarizing. An implant may be made to change the doping of the P+ silicon to N-type (driving it deep enough to reach just below the bottom edge of the second, upper middle conductor line, but not so deep as to reach the top of first, lower middle electrode conductor line 1300). Finally, N+ silicon is deposited to extend the N-type silicon above the second, upper middle conductor line, followed by a layer of P+ silicon 1820 and top contact material 1830. The middle contacts and the junctions between N+ and P+ silicon layers are preferably not in contact with each other. Processing then resumes at the point shown in FIG. 18, now allowing for via connections to more than one middle conductor. One skilled in the art will recognize this technique may be repeated for more middle conductors than the two described here. Another variation includes formation of the circuit of FIG. 11 with gated field emitters replacing the three-terminal, four-layer devices and simple two-terminal (ungated) field emitters replacing the decoder diodes.

Programmable Elements

Following the formation of memory cells having vertically constructed switching elements (e.g., the MOS transistors in FIG. 8 or the voltage threshold switching devices in FIG. 21), each of the array of memory has an exposed top contact. This facilitates the formation of any of several types of programmable elements on top of one or more cells prior to the formation of the top conductors.

Figure 25:
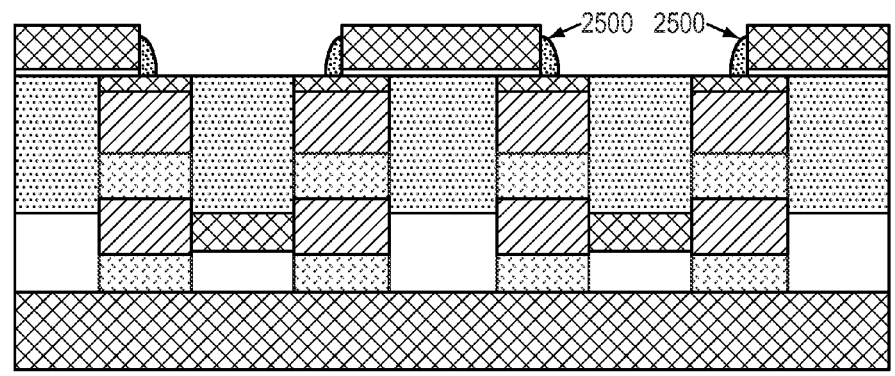
FIG. 25 is a side view of a portion of the memory device of FIGS. 12-24 following formation of exemplary programmable resistive-change cells in accordance with various embodiments of the invention.

FIG. 25 depicts an embodiment of the present invention incorporating a programmable material 2500. Such a structure is described in U.S. patent application Ser. No. 12/643,278, filed on Dec. 21, 2009, the entire disclosure of which is incorporated by reference herein. Programmable material 2500 (e.g., a resistive-change or phase-change material) may be formed by a sidewall spacer technique, and may be disposed between the top contact of the memory cell and the top conductor (an insulating dielectric layer disposed below the top conductor prevents current from bypassing material 2500).

Figure 26:
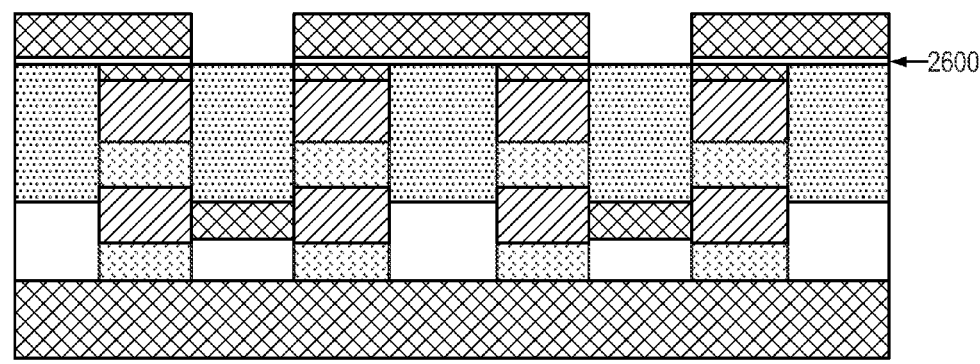
FIG. 26 is a side view of a portion of the memory device of FIGS. 12-24 following formation of exemplary one-time programmable (OTP) antifuse cells in accordance with various embodiments of the invention.

FIG. 26 shows an embodiment of the present invention that incorporates an OTP material 2600. This programmable structure includes a thin dielectric antifuse layer 2600 between the top contact of the memory cell and the top conductor. Antifuse layer-based memory cells are well understood by those skilled in the art.

Regardless of the type of memory cell switching device utilized and the method of its formation, a surface substantially similar to that depicted in FIG. 28 may be achieved above the switches (as described below).

Self-Aligned Programmable Element Contacts

Figure 27A:
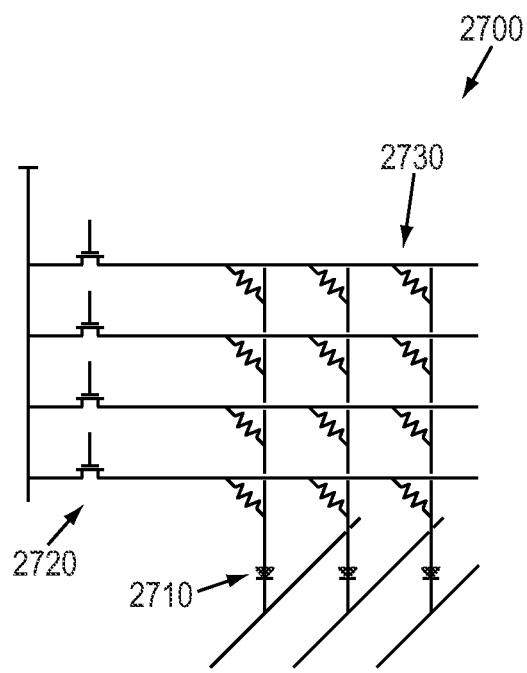
FIGS. 27A and 27B depict partial circuit schematics for memory elements in a vertical third dimension according to various embodiments of the present invention.

Embodiments of the present invention include memory-cell arrays having active devices disposed below the memory cells (e.g., in the underlying substrate or in another layer of circuitry). The active devices (e.g., diodes, transistors, and/or thyristors) are each shared by multiple programmable elements. The memory-cell array may have multiple stacked layers of memory cells. In various embodiments, the memory-cell layer includes a portion of the active device. For example, it may include base and emitter portions of transistors that cooperate with previously fabricated collector portions therebelow. FIG. 27A shows a partial schematic in which the columns of an array 2700 are drawn as three column lines to each of which a vertical connection is made through a memory cell switch 2710 (each depicted as a diode). Above each switch 2710, a post connects to multiple layers of row lines (here four are depicted) each controlled by a FET 2720. At each intersection of a row line with a post is a programmable memory element 2730. Each programmable memory element 2730 may be a phase-change element (e.g., one including or consisting essentially of a chalcogenide material such as a germanium-antimony-tellurium alloy (GST)), a resistive-change element, an organic programmable element, a nano-material element, an OTP element (such as a fuse or an antifuse), a factory programmed link, or some other information storing element. FETs 2720 are typically be formed in a substrate with higher-temperature processing, but this is not a requirement, and these row-selection switching devices may be put in each layer of memory cells. Memory cell switches 2710 may be any of a number of devices formed in a base (e.g., substrate) layer, e.g., diodes, transistors, thristors, and the like. The control gate of each FET 2720 is selected by address circuitry that determines which row line or lines in which layer or layers is selected at any particular time.

Figure 27B:
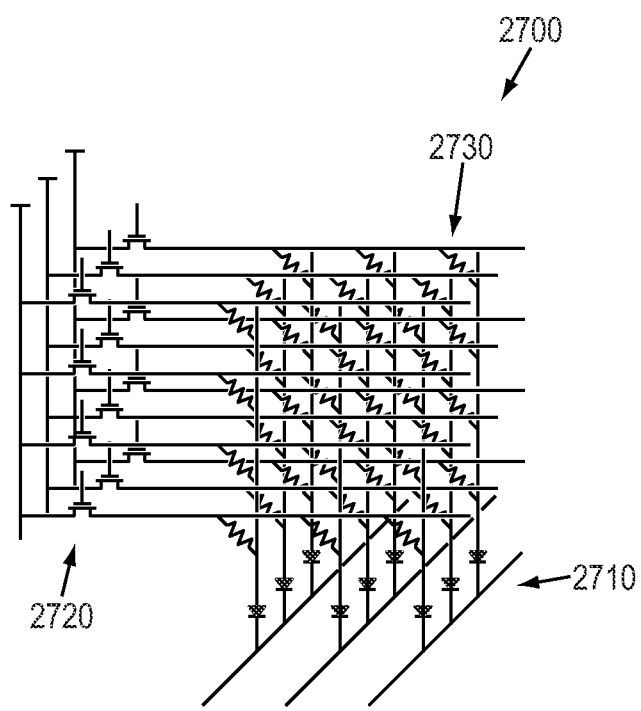

FIG. 27B shows array 2700 in three dimensions; three rows in each of four layers are shown above three columns of a diode array. Selection of an individual memory storage element is accomplished by selection of a column (by way of column address decode circuitry, not shown but well understood by those skilled in the art) and one or more row FETs 2720 (by way of row address decode circuitry, not shown in the figure but well understood by those skilled in the art). As mentioned above, devices other than diodes 2710 may be utilized at the base of the posts, e.g., switching devices such as transistors (an individual post may be selected through address decode circuitry such that a single post is activated as opposed to a column of devices). Furthermore, circuitry to detect current flowing through an addressed or selected path from one or more rows to a column may be implemented in embodiments of the present invention. For example, each set of row-selection FETs 2720 in a given layer may pass through a sense amplifier that senses the amount of current flowing into the FETs 2720 of a given layer and thereby determine the information stored in the selected bit within that layer. In various embodiments, one or more layers (or even all layers) may be active simultaneously and sensed to read a bit therefrom. The layer(s) may be active simultaneously and programmed to write a bit into the layer(s) simultaneously. The programmable elements 2730 may exhibit more than two bit states and therefore each store more than one bit of information.

Figure 28:
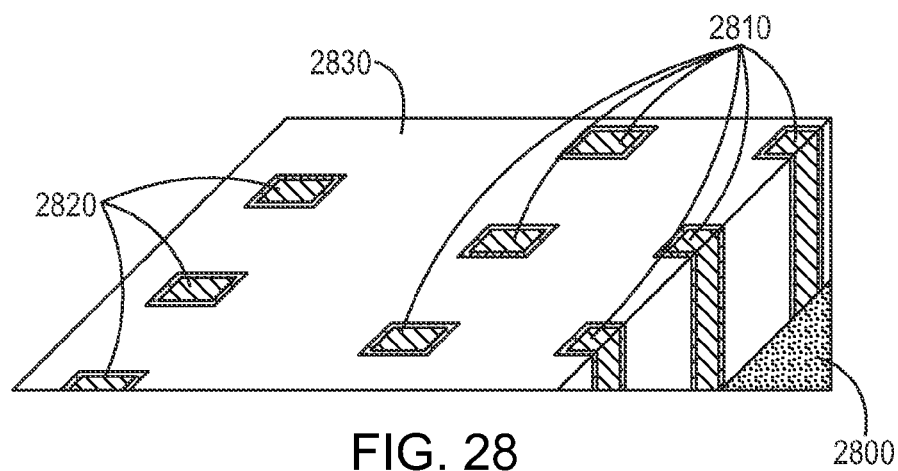
FIGS. 28-65 are perspective views of memory elements being fabricated according to various embodiments of the present invention at various stages during the fabrication process.

FIG. 28 depicts a perspective view of a portion of a starting surface 2800. Surface 2800 may be a base layer above an array of memory cells including vertical switches (or of other orientations) or may be a portion of one or more layers of programmable memory elements according to embodiments of the present invention. Contacts 2810 to individual memory cells are disposed on surface 2800, as are contacts 2820 connecting the substrate and individual row lines. Contacts 2810, 2820 may include or consist essentially of one or more conductive materials (e.g., a metal). As depicted in FIG. 28, contacts 2810, 2820 are metal surrounded by a thin layer of material that promotes adhesion of the metal to surrounding non-conductive substrate material 2830.

Figure 29:
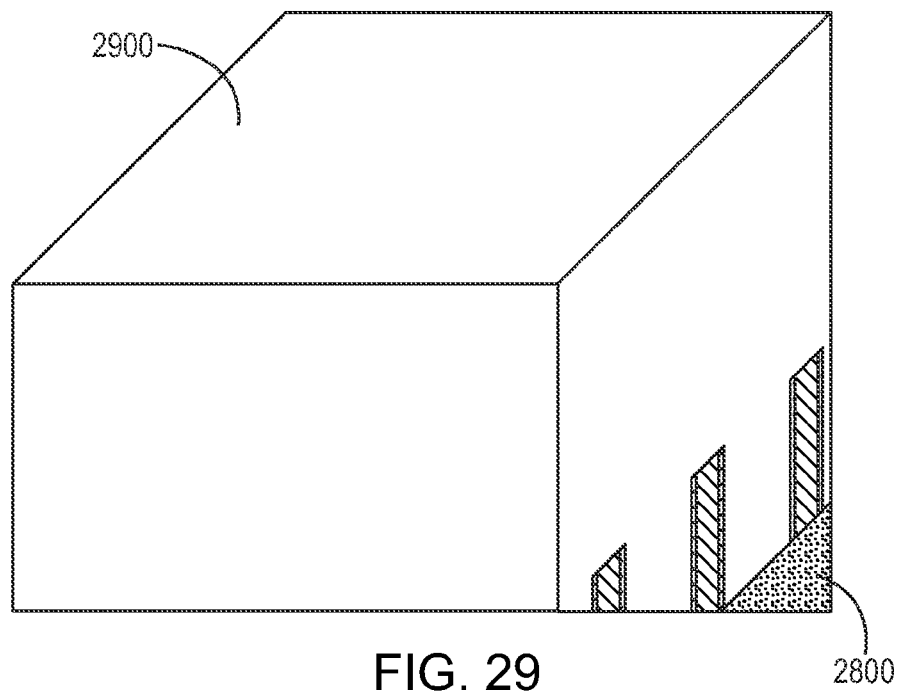
Figure 30:
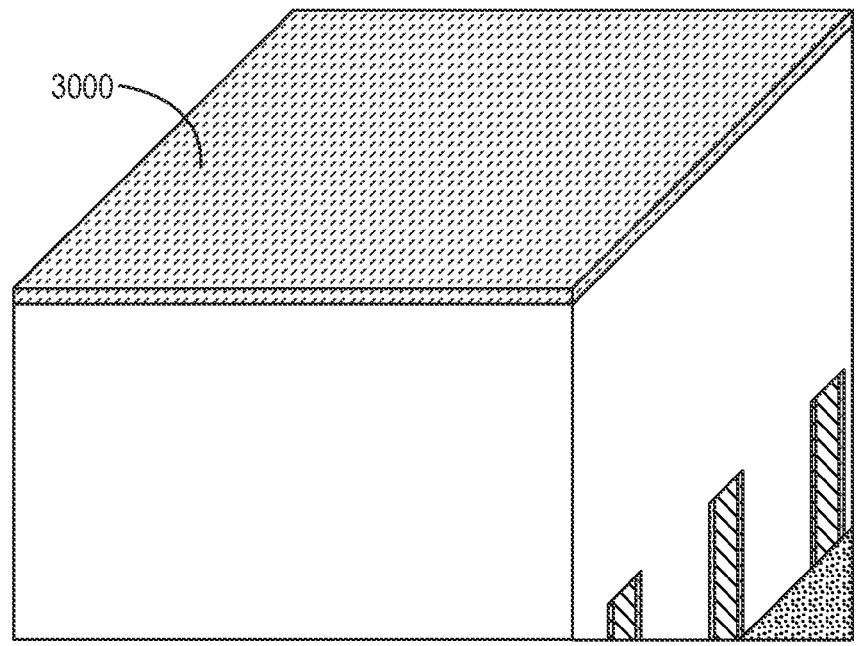
Figure 31:
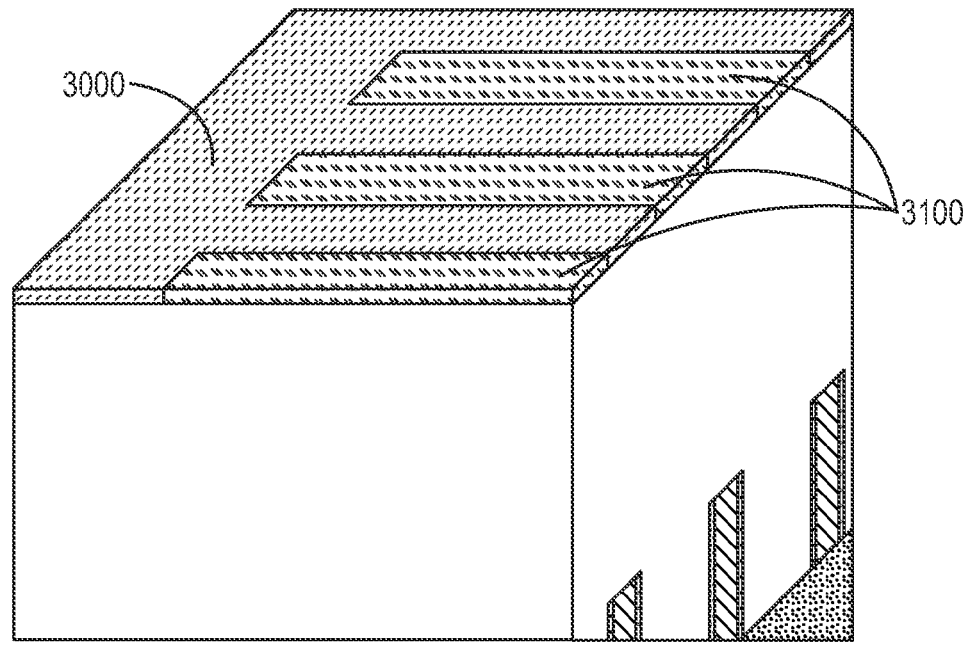
Figure 32:
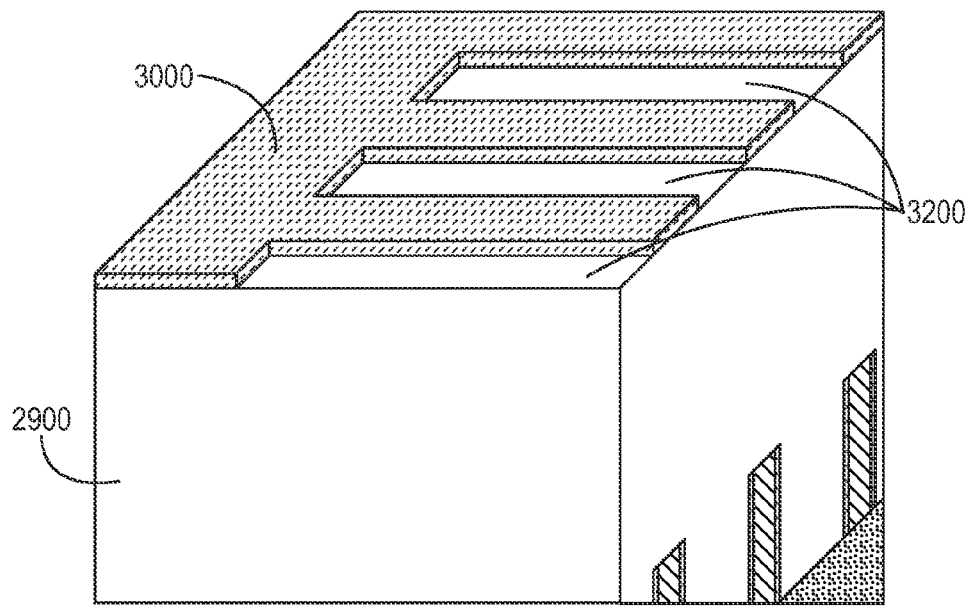
Figure 33:
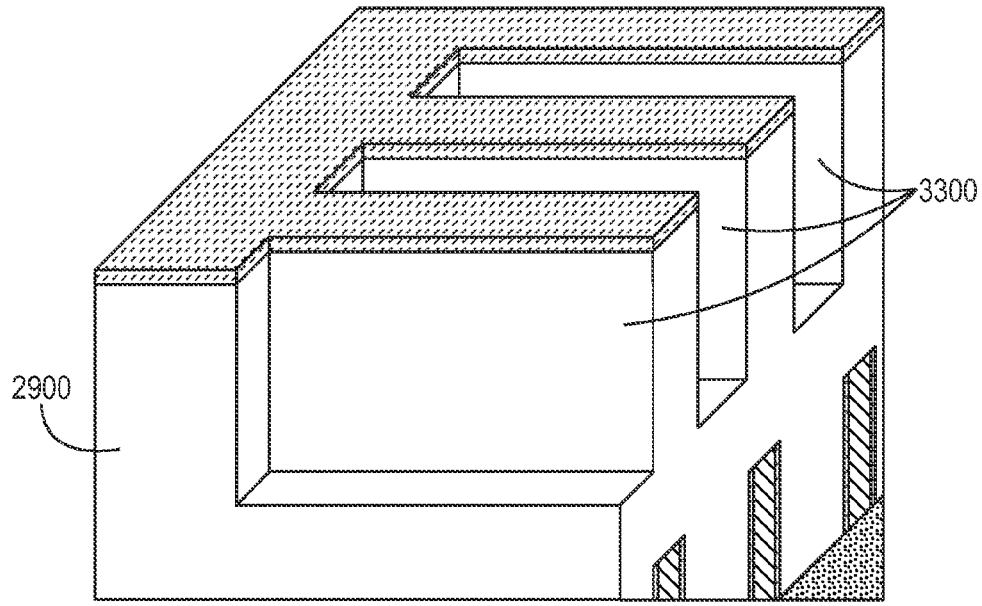

In FIG. 29, a layer of non-conductive material 2900 (e.g., a dielectric such as silicon dioxide) has been deposited over surface 2800. As described below, one or more layers of programmable memory elements are formed in layer 2900 in accordance with various embodiments of the invention.

Referring to FIGS. 30-33, photoresist 3000 is deposited over layer 2900. A pattern of row lines 3100 is exposed in photoresist 3000 and then developed to form openings 3200 corresponding to row lines to be fabricated as described below. Material 2900 is exposed by openings 3200 and is subsequently etched to form row trenches 3300.

Figure 34:
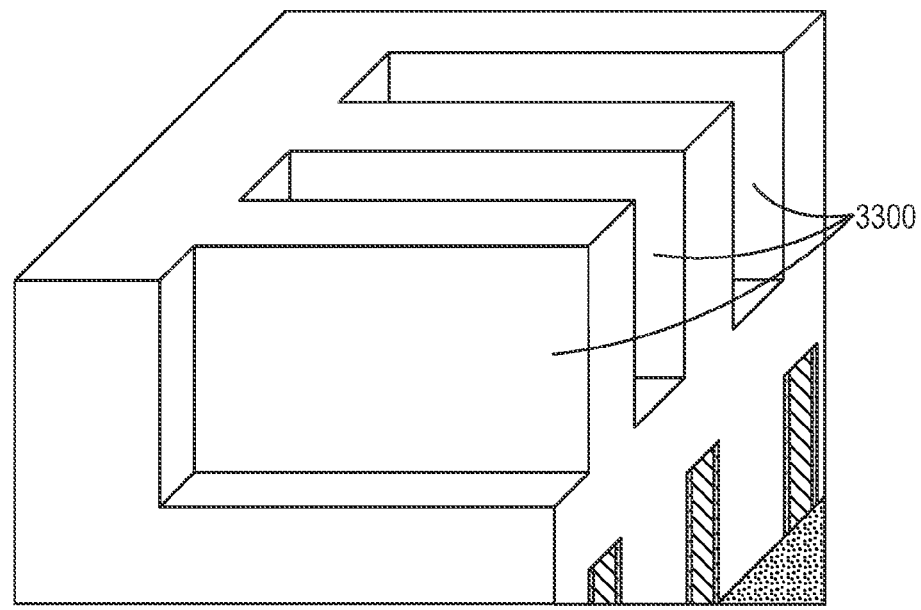
Figure 35:
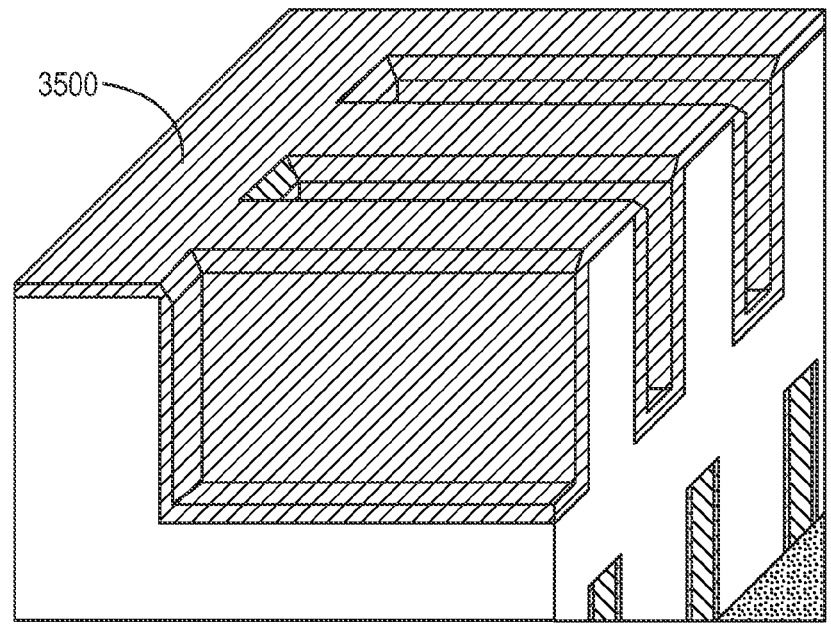
Figure 36:
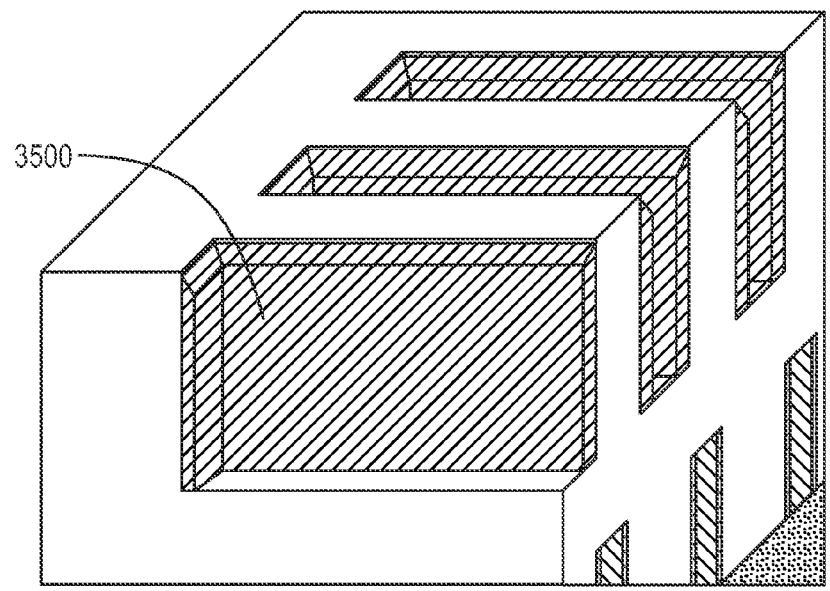
Figure 37:
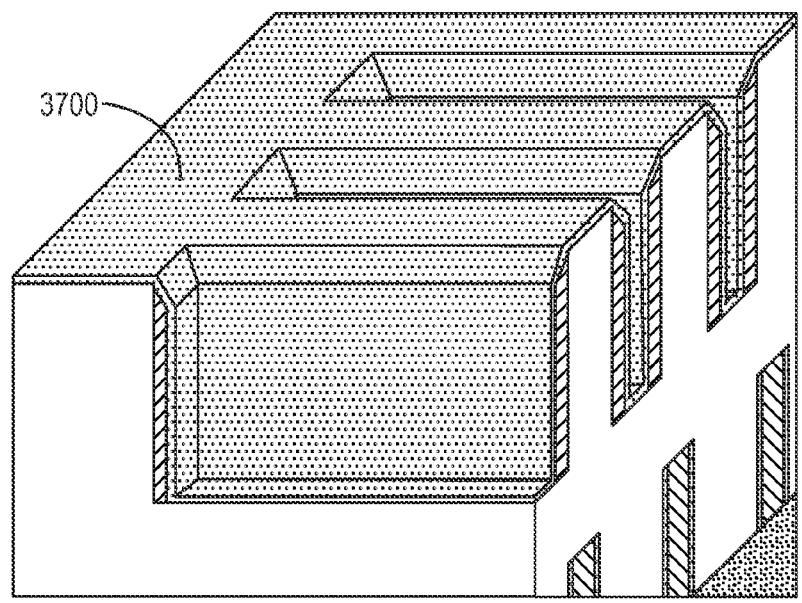
Figure 38:
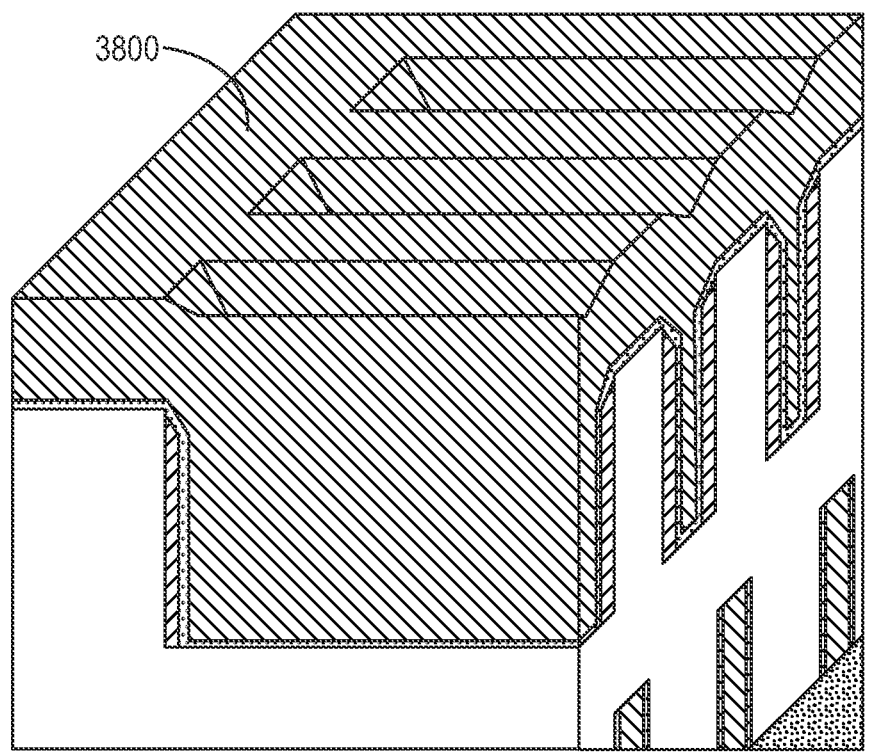
Figure 39:
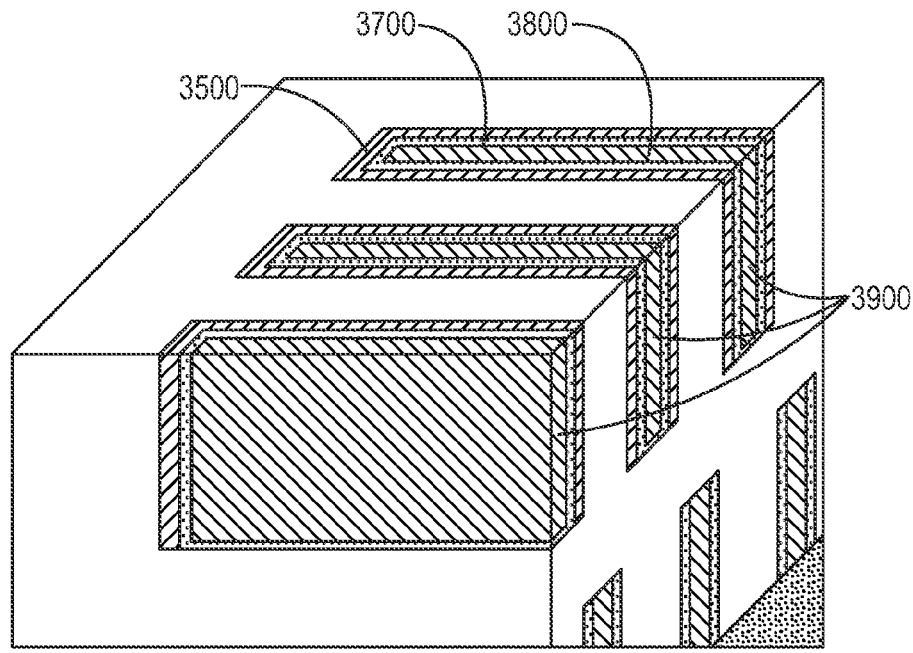

As shown in FIG. 34, after formation of row trenches 3300, the remaining photoresist 3000 is removed. With reference to FIGS. 35 and 36, a spacer layer 3500 including or consisting essentially of a non-conductive material (e.g., a dielectric such as silicon nitride) is conformally deposited and then directionally etched back (e.g., by reactive-ion etching (RIE)), thus removing spacer layer 3500 on the top surface and in the bottom of the trenches 3300 while leaving spacer layer 3500 on the sidewalls of the row trenches 3300. As shown in FIG. 37, a thin barrier layer 3700 is conformally deposited in row trenches 3300. Barrier layer 3700 promotes adhesion to and may substantially prevent interdiffusion between spacer layer 3500 and subsequently deposited layers. As shown in FIG. 38, conductive material 3800 is then deposited within row trenches 3300. Conductive material 3800 may include or consist essentially of, e.g., a metal such as copper, tungsten, molybdenum, aluminum, and/or a noble metal. Afterwards, as shown in FIG. 39, a planarization step is performed (e.g., by chemical-mechanical polishing), forming the conductive row lines 3900. Row lines 3900 may include regions of conductive material 3800 surrounded by barrier layer 3700 spacer layer 3500.

Figure 40:
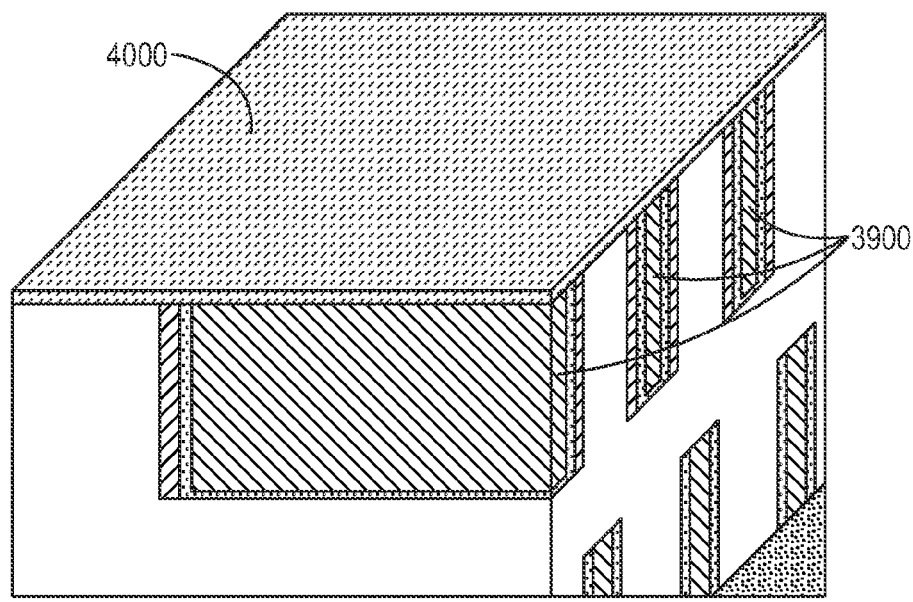
Figure 41:
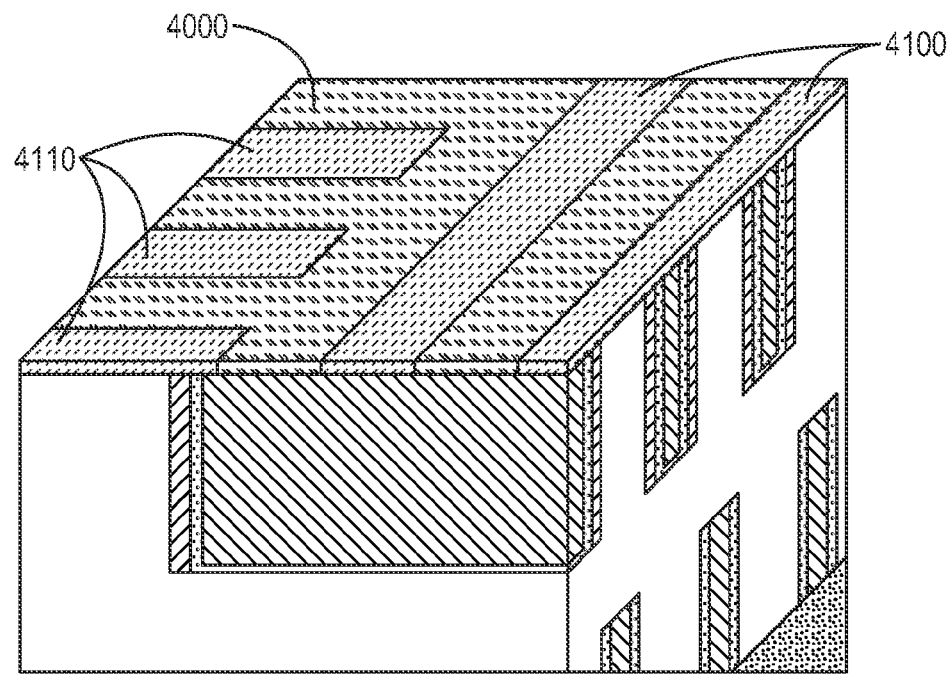
Figure 42:
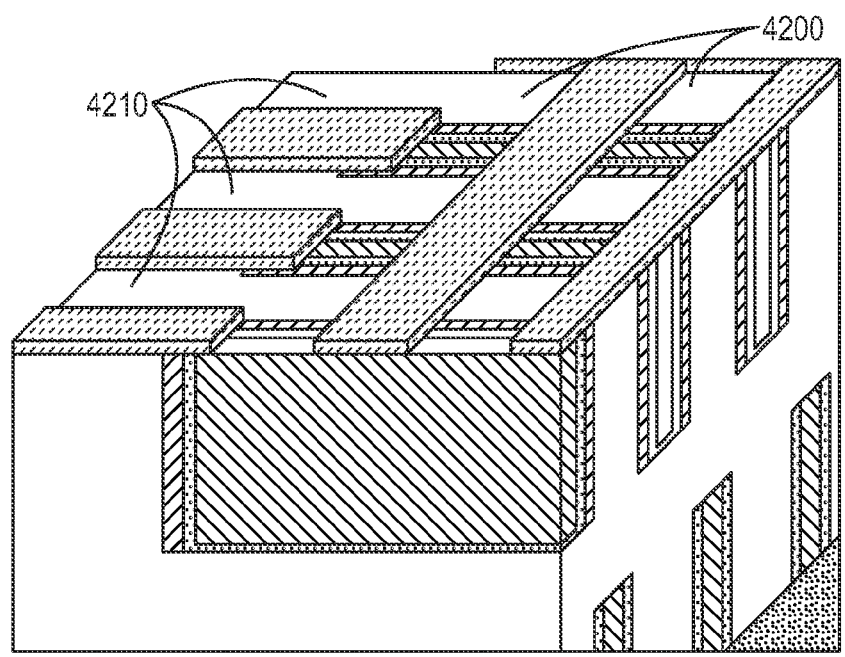

Referring now to FIGS. 40-42, a layer of photoresist 4000 is deposited over row lines 3900. Photoresist 4000 is exposed, defining a pattern of column lines 4100 and end-of-row connectors 4110. Photoresist 4000 is then developed, forming openings 4200 corresponding to the spaces between column lines 4100 and opening 4210 between end-of-row connectors 4110. Through these openings, the materials underlying photoresist 4000 are revealed.

Figure 43:
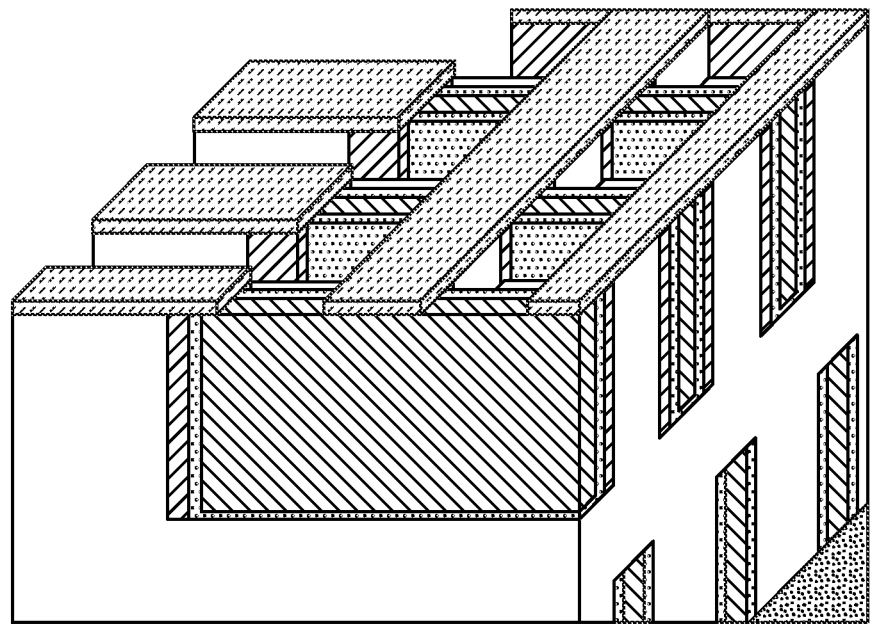
Figure 44:
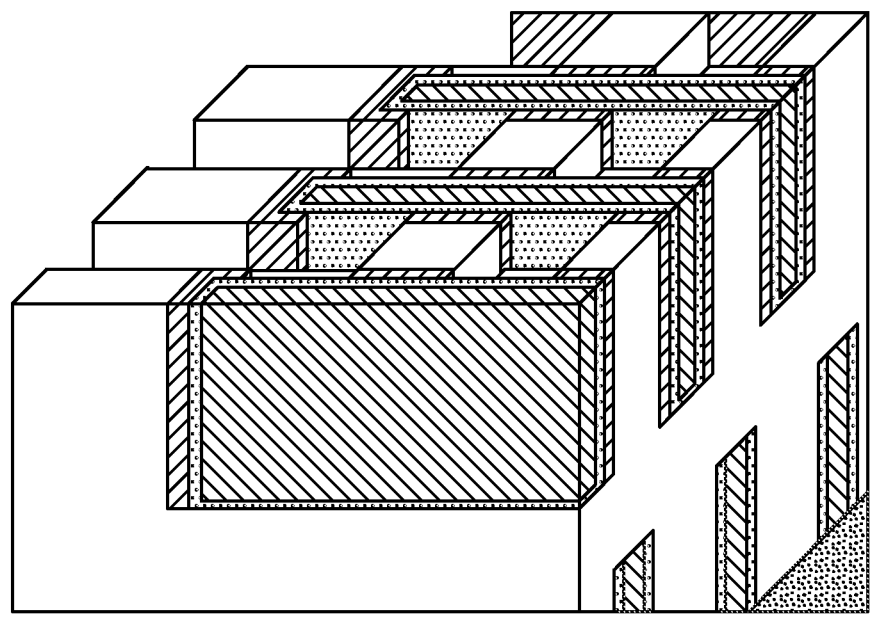
Figure 45:
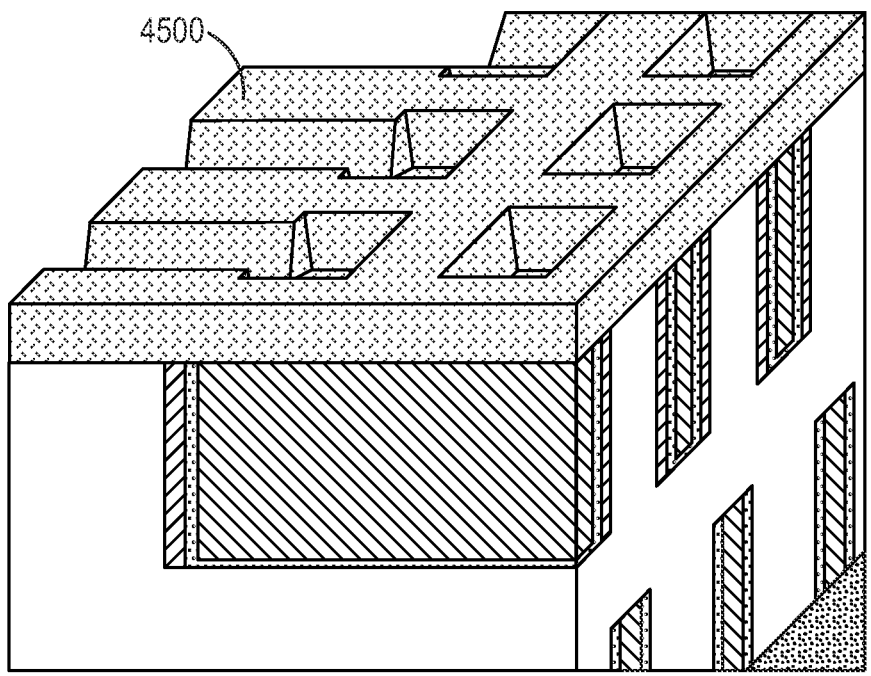
Figure 46:
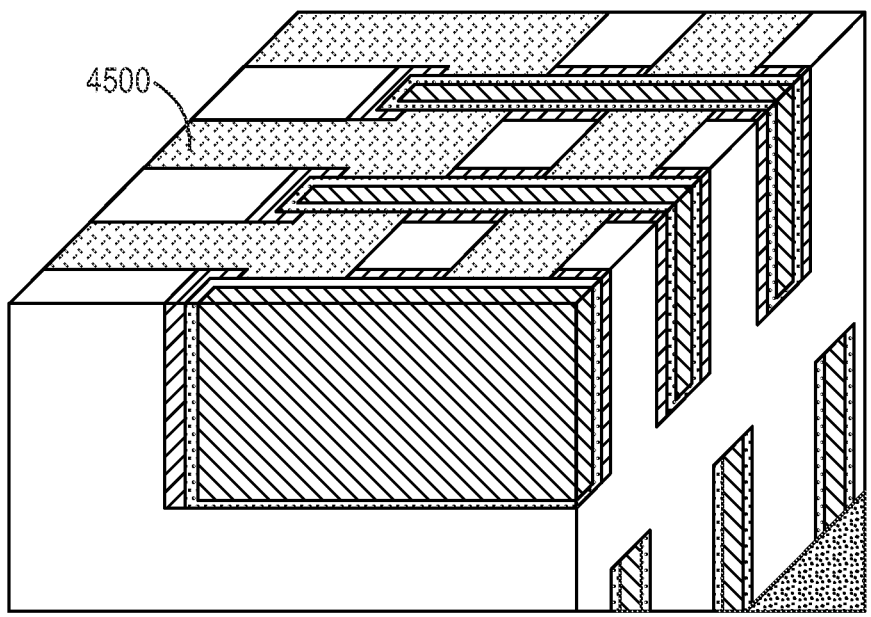

As shown in FIG. 43, a selective dielectric etch is performed by, for example, reactive ion etching (RIE). This etch removes exposed portions of layer 2900 and spacer layer 3500 but does not significantly remove any of the exposed conductive (e.g., metal) materials. The etch selectivity is preferably such that the spacer layer 3500 is etched deeper than the non-conductive bulk material (i.e., layer 2900). For example, an etch tailored for nitride materials may remove silicon nitride faster than silicon oxide (at a ratio of 2:1 to 3:1). Following this etch, remaining portions of photoresist 4000 are stripped away (FIG. 44) and a conductive masking material 4500 (e.g., a metal such as tungsten) is deposited (FIG. 45). As shown in FIG. 46, conductive mask 4500 is planarized and remains only in the etched areas shown in FIG. 44, thus forming an etch-resistant pattern for protection of the spaces between the column lines 4100 and between the end-of-row connectors 4110 (the rows are also made of an etch-resistant material such as metal).

Figure 47:
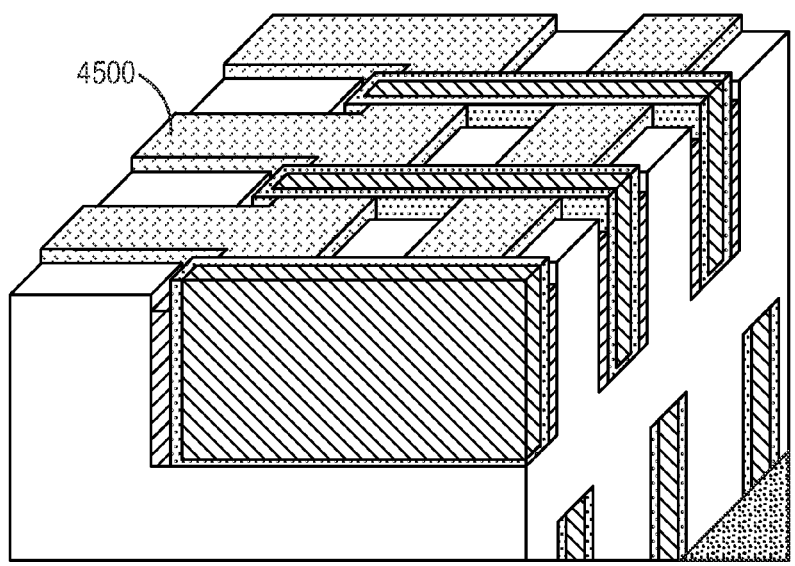

Referring to FIG. 47, another dielectric etch like that described above with reference to FIG. 43 is performed. The etch likewise exposed portions of layer 2900 and spacer layer 3500 but does not significantly remove any of the exposed conductive (e.g., metal) materials. As described above, spacer layer 3500 is etched deeper than the non-conductive bulk material (i.e., layer 2900). However, depth of the etch for both materials is less than the corresponding etch depth for the first etch of FIG. 43 (this is described further in conjunction with FIG. 55).

Figure 48:
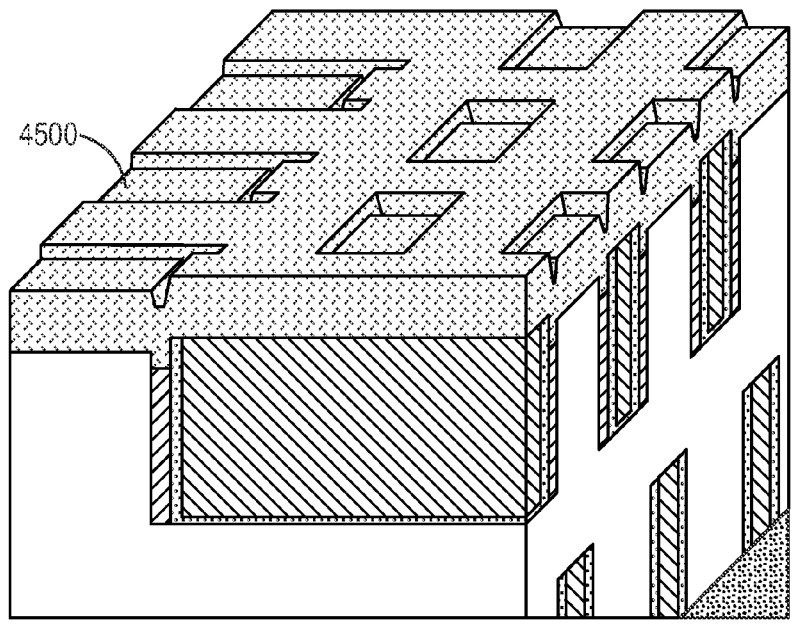
Figure 49:
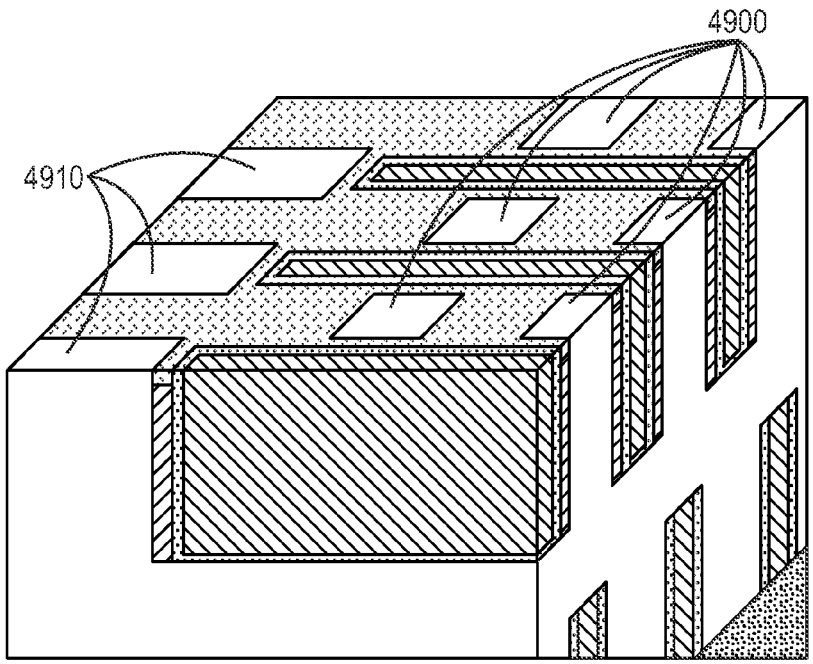
Figure 50:
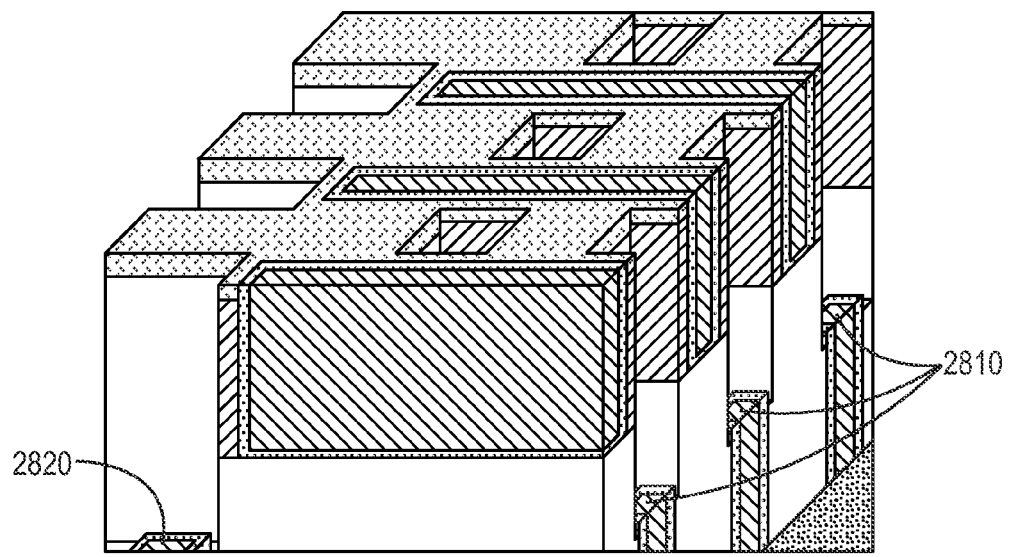

As shown in FIGS. 48-50, a second conductive mask layer 4500 of conductive material (e.g., metal such as tungsten) is deposited and polished back (e.g., by CMP) in a damascene-like process. The non-conductive spacer layer 3500 is protected by metal in both the spaces between the column lines 4100 as well as the areas of the column lines 4100 themselves; the only areas not now protected by a metal masking material are those areas corresponding to the vertical via connection points of the memory cells 4900 and the vertical end-of-row connection vias 4910. All of these vertical via connections are then opened by etching (i.e., using the metal surface patterns as an etch mask), thus opening contacts 2810 to the individual memory cells as well as the contacts 2820 connecting the substrate to the individual row lines.

Figure 51:
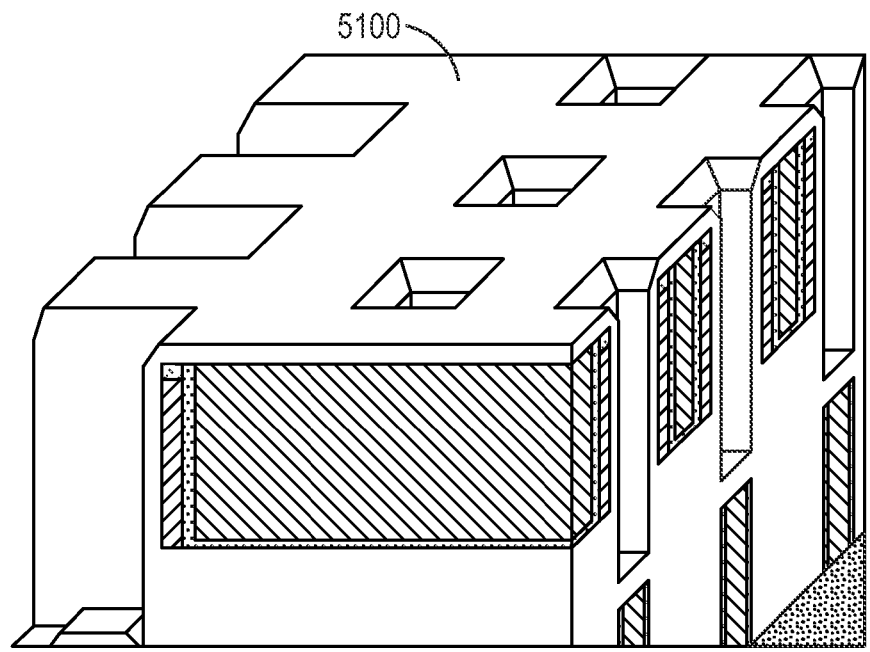
Figure 52:
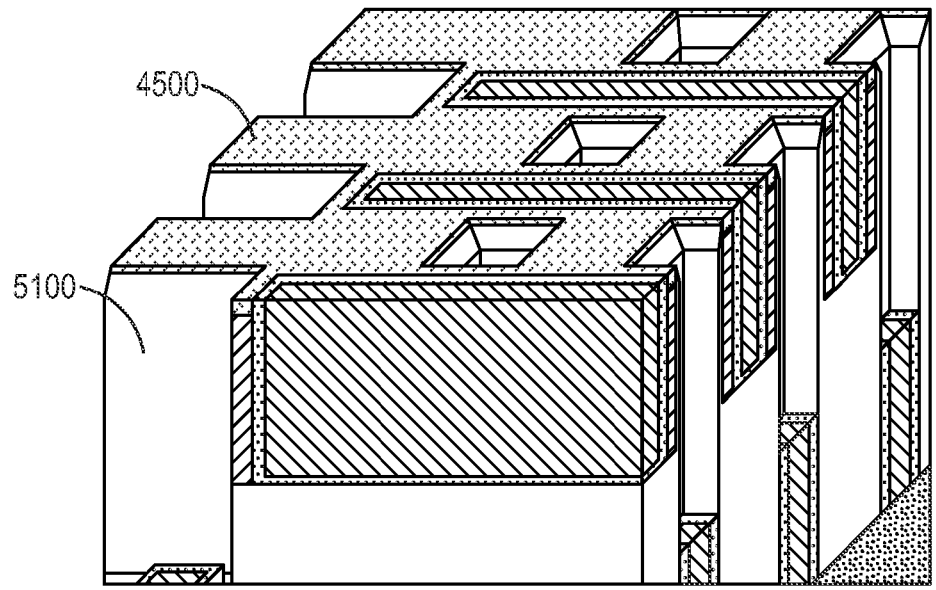

As shown in FIGS. 51 and 52, a thin spacer layer 5100 of non-conductive material (e.g., a dielectric such as silicon dioxide) is conformally deposited and then directionally etched back (e.g., by RIE). The etch removes the material on the surface and in the bottom of the via pits while leaving the non-conductive material on the sidewalls of the via pits. The etch of FIG. 51 and the spacer formation of FIG. 52 enable the subsequent formation (as described below) of self-aligned posts positioned between two adjacent row lines spaced apart by a single critical dimension F without contacting either row line.

Figure 53:
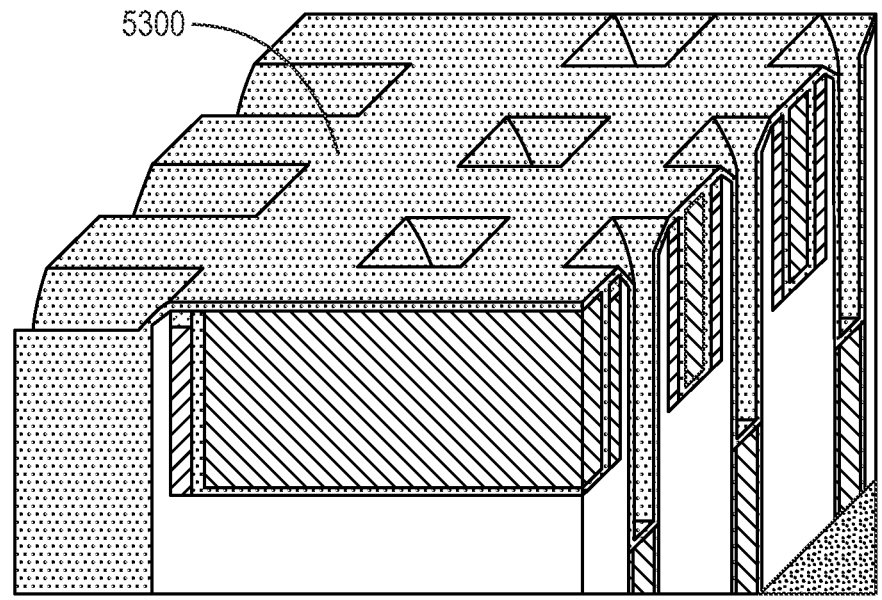
Figure 54:
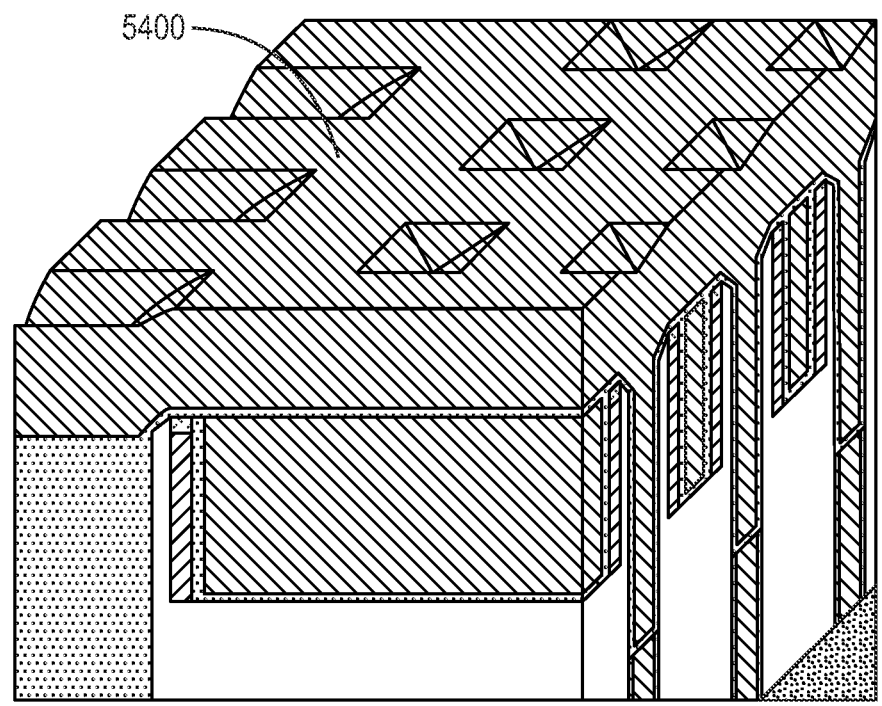
Figure 55:
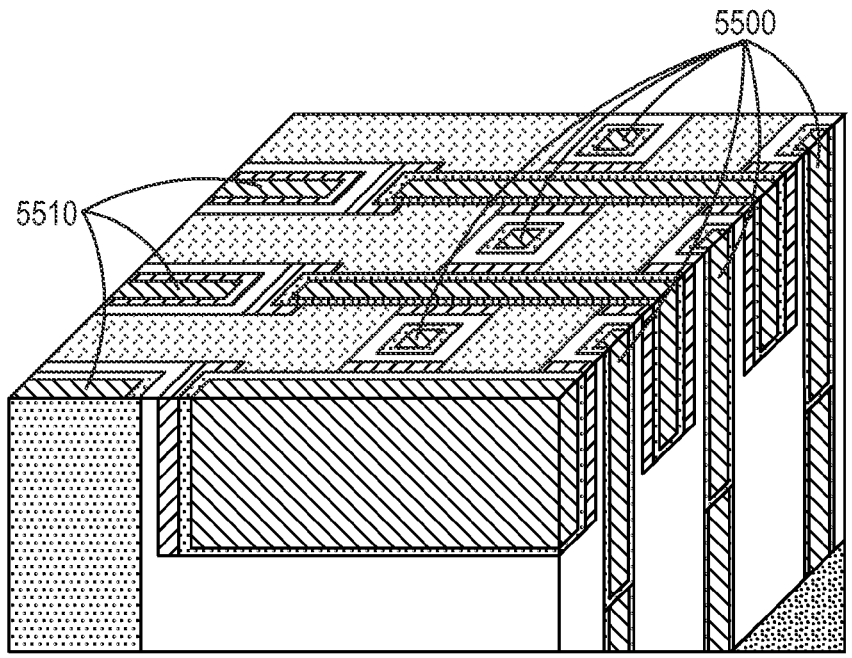
Figure 56:
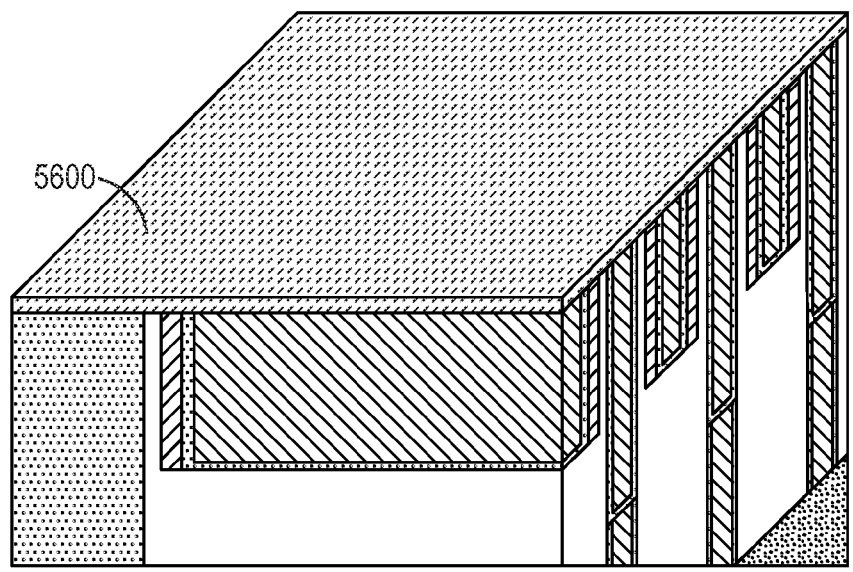

Referring now to FIG. 53, a thin barrier layer 5300 is conformally deposited. Barrier layer 5300 promotes adhesion to and may substantially prevent interdiffusion between spacer layer 5100 and subsequently deposited layers. As shown in FIG. 54, conductive material 5400 is then deposited over barrier layer 5300. Conductive material 5400 may include or consist essentially of, e.g., a metal such as copper, tungsten, molybdenum, aluminum, and/or a noble metal. Afterwards, as shown in FIG. 55, a planarization step is performed (e.g., by CMP), forming vertical via posts 5500 to individual memory cells and end-of-row posts 5510. Posts 5500, 5510 feature conductive material 5400 surrounded by barrier layer 5300 and spacer layer 5100.

Figure 57:
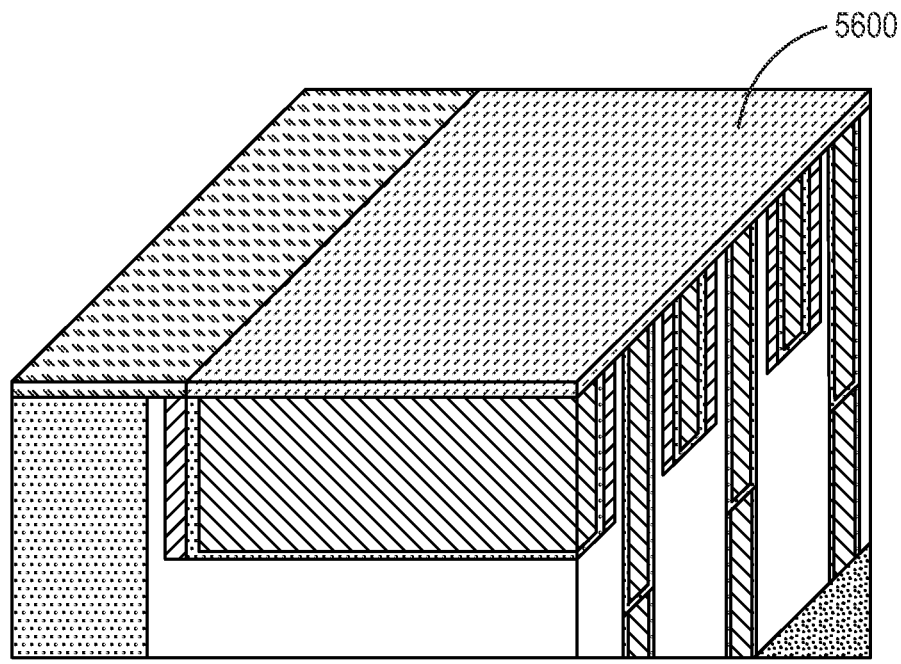
Figure 58:
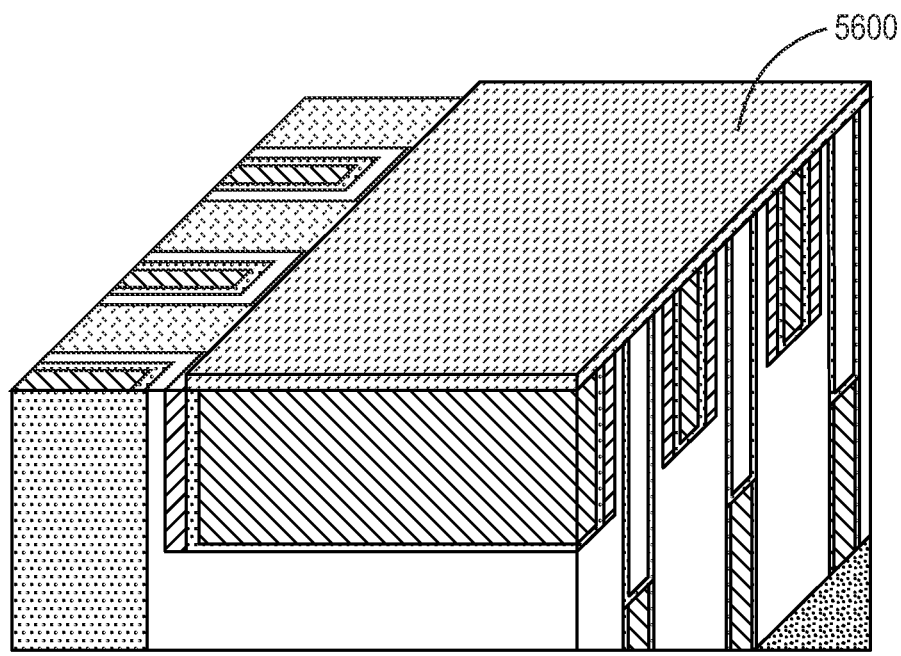
Figure 59:
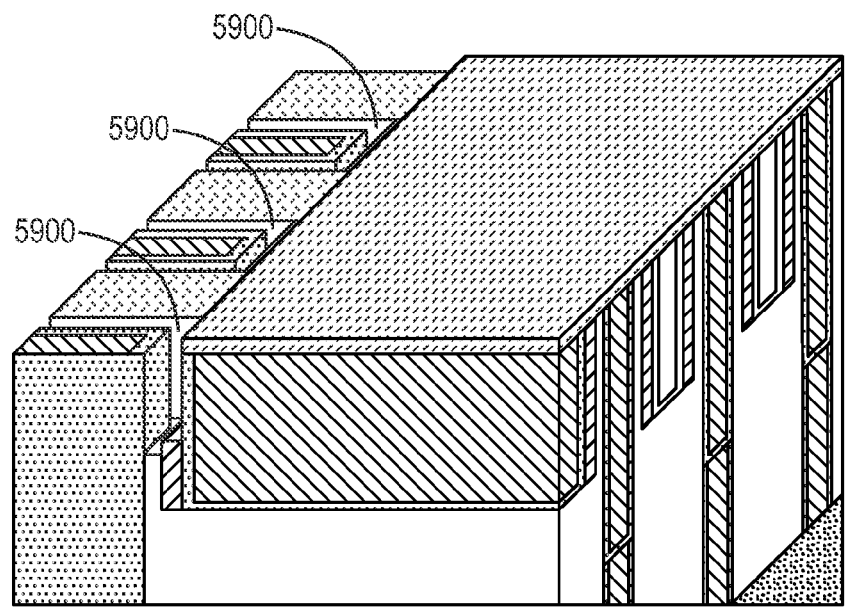
Figure 60:
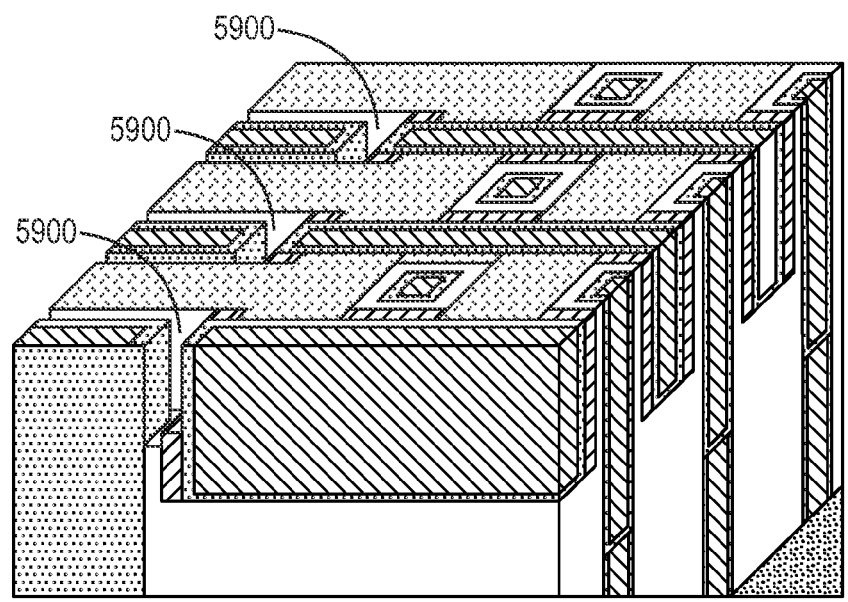
Figure 61:
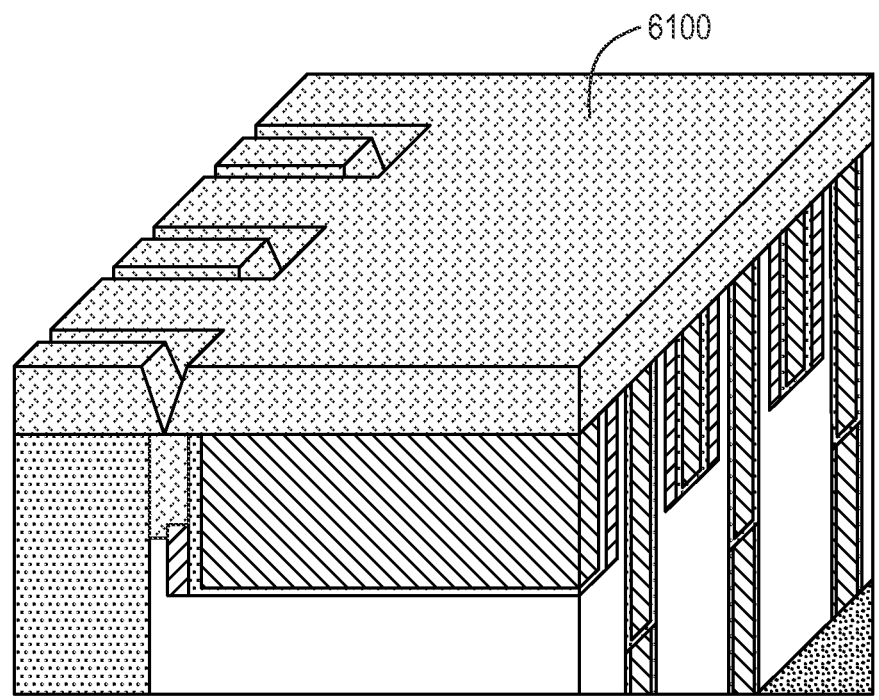
Figure 62:
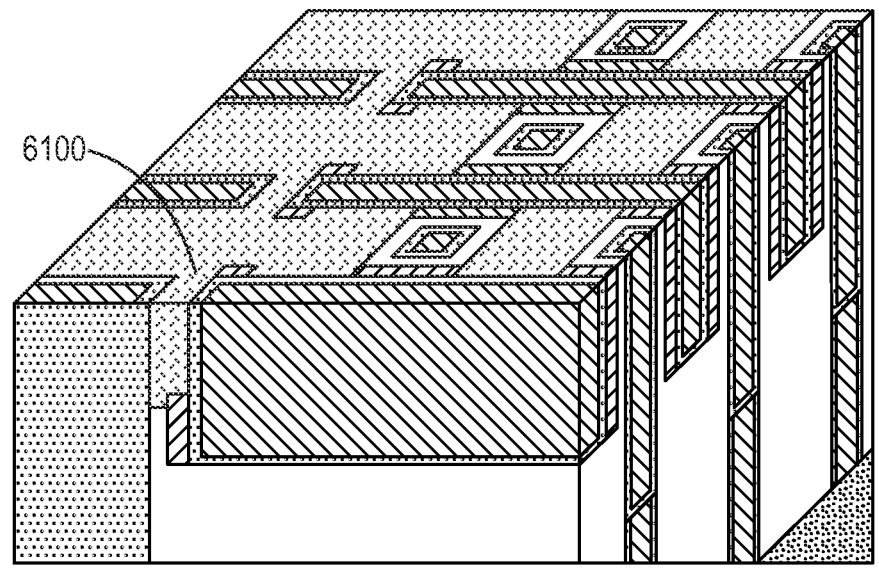

FIGS. 56-62 depict the formation of conductive links that electrically connect the vertical end-of-row connection posts 5510 to the ends of the individual row lines 3900 (depicted in FIG. 39). A layer of photoresist 5600 is deposited (FIG. 56) and then exposed, preferably using a non-critical geometry mask (FIG. 57). Photoresist 5600 is then developed (FIG. 58) to reveal the areas where the ends of the row lines 3900 and the end-of-row vertical connections are located. Only the spacers around the end-of-row connectors (made of non-conductive material, i.e., spacer layer 5100) and the spacers around the rows (also made of non-conductive material, i.e., spacer layer 3500) are exposed (i.e., not covered by metal masking material and/or photoresist) and etchable at this point in the process. These spacers are then etched (FIG. 59), forming trenches 5900. Trenches 5900 are preferably deep enough so they will not be polished away during subsequent polishing steps (corresponding to FIG. 65 described below). As shown in FIG. 60, remaining portions of photoresist 5600 are then removed. Trenches 5900 are then filled with a conductive material 6100, as shown in FIG. 61. Conductive material 6100 may include or consist essentially of a metal, e.g., tungsten. As shown in FIG. 62, conductive material 6100 is then polished in a damascene-like polishing step.

Figure 63:
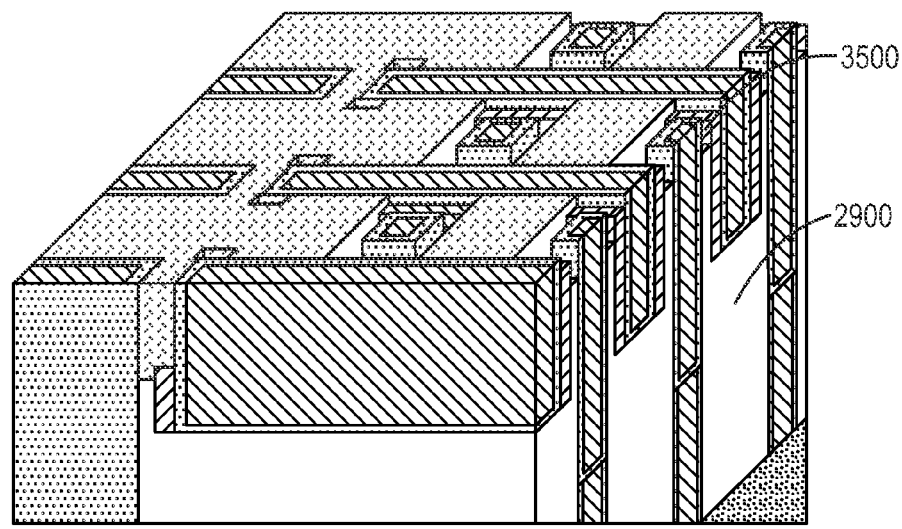
Figure 64:
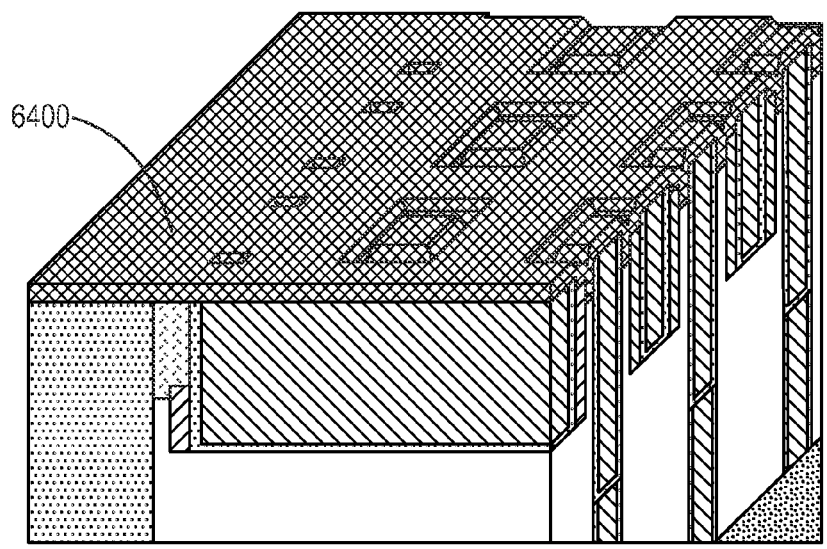
Figure 65:
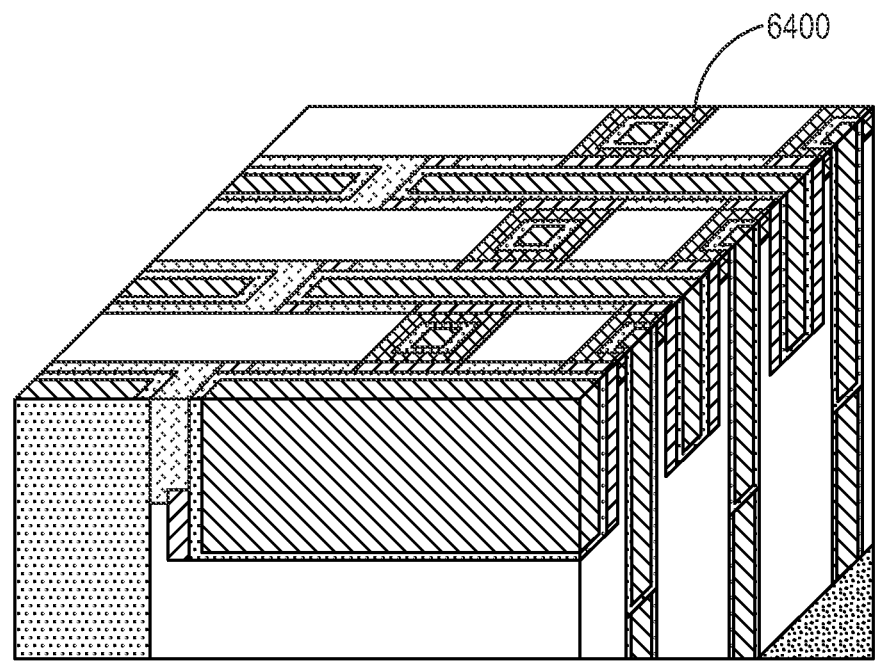
Figure 66:
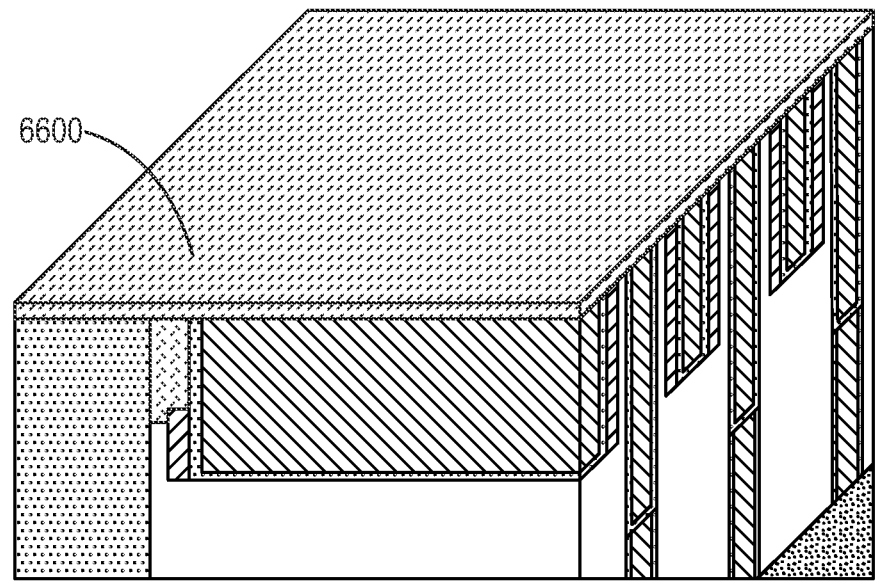
FIGS. 66-72 are perspective views of memory elements being fabricated according to various embodiments of the present invention at various stages during the fabrication process.
Figure 67:
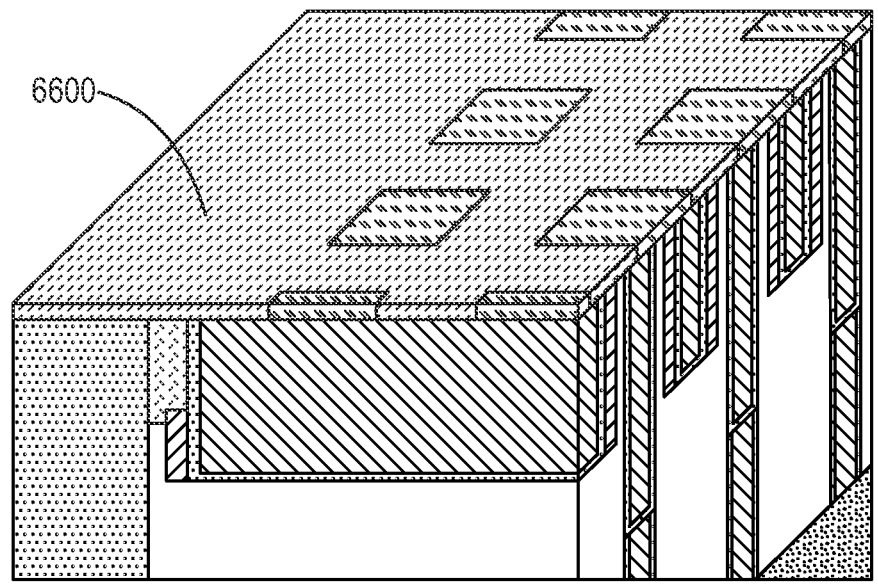
Figure 68:
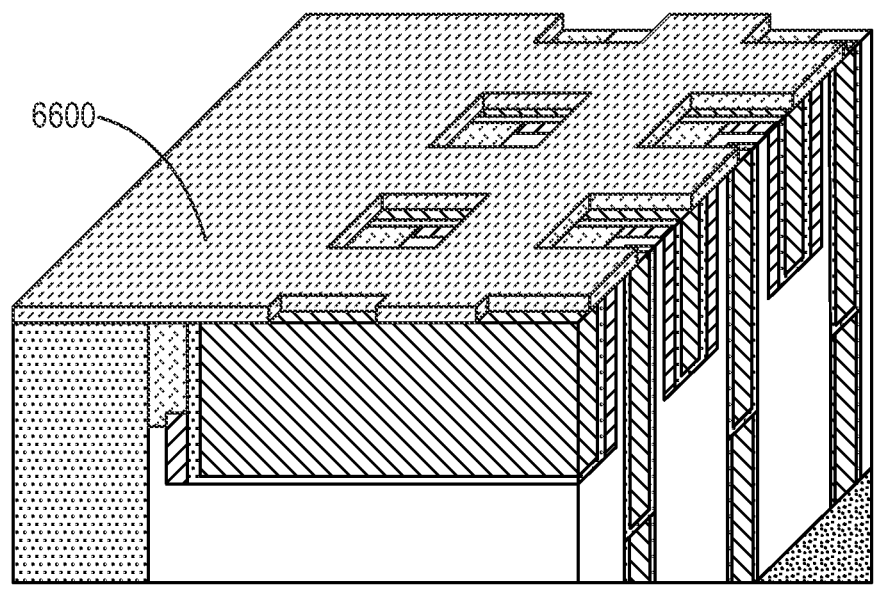

FIGS. 63-65 depict the addition of programmable material to the circuit and the removal of the conductive masking structures. First, spacer material 3500 and layer 2900 surrounding the conductive vertical via connection posts of the memory cells is etched back utilizing a timed etch (e.g., RIE) to form a cup around the posts. A programmable material 6400 is then deposited over the surface, filling in the etched areas. A polishing step (by, e.g., CMP) is then performed, removing portions of programmable material 6400 not in the etched areas. The polishing step continues until substantially all of the conductive masking materials are also removed from the surface. Only the metal around the end-of-row vertical connectors (that supplanted the spacer material) and the metal along the sides of the rows (that also supplanted the row spacer material) remain at this point. The conductive material between the columns and along the rows will remain because it was formed in the openings created by etching the spacer material around the rows deeply. The thickness of the remaining conductive material is a function of the depth of that etch. The end-of-row vertical connectors are connected to the ends of the rows by metal remaining as a result of a deep etch of the spacer material around the end-of-row vertical connectors as well.

In an embodiment, the cups are lined with a thin antifuse material and then filled with conductive material rather than with programmable material 6400, thus forming one-time programmable memory cells. During programming, the conductive material forms a filament through the antifuse material, thus forming an electrical connection.

At the point of the process depicted in FIG. 65, contact points are once again present on the surface of the substrate in a pattern similar to that at the start of the process (shown in FIG. 28). It should be noted that the processing steps utilized herein are generally low-temperature processing steps that may be performed at or near room temperature or at temperatures only slightly above room temperature. Typically, no high-temperature anneal, furnace, or crystallization steps are required, and the process requires no semiconductor material deposition (typically a high-temperature process). As a result, the process may be performed entirely on the back-end equipment of a semiconductor processing line and may be performed on top of materials that might be damaged by high thermal budgets (e.g., many programmable materials such as chalcogenide alloys are typically susceptible to high temperatures, leading to microstructural damage).

In various embodiments, the process may be repeated (one or more times) to form an additional layer (or layers) of programmable memory elements (that will generally share the same vertical memory cell via connection post to a single memory cell in the substrate or in a lower layer). To access the memory elements of each layer individually, separate end-of-row vertical connectors (not shown) may be formed, and this, in light of the present teaching, will be apparent to one skilled in the art.

The programmable-memory-storage state change generally occurs at the point of contact of a corner of the programmable material 6400 about the conductive vertical via connection posts of the memory cells to a corner of the conductive material between the columns and along the rows. This corner-to-corner, self-aligned contact formed by the crossing of the straight-sided rows with the pattern of the straight-sided columns results in a high concentration of current flowing through this corner-to-corner contact.

Figure 69:
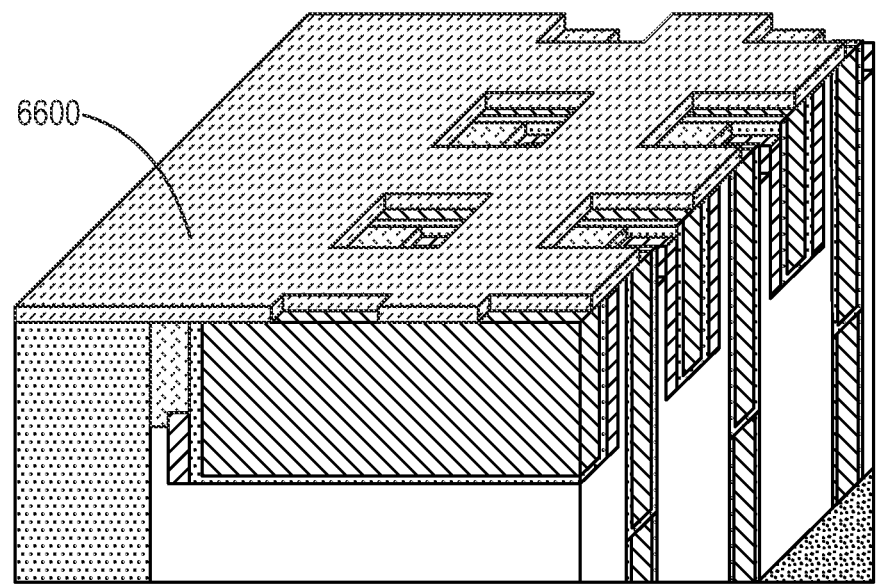
Figure 70:
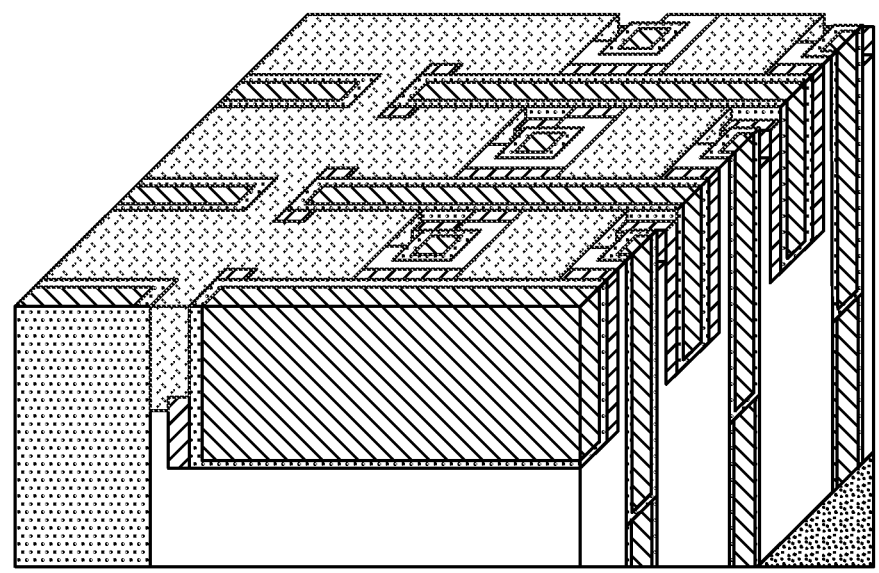
Figure 71:
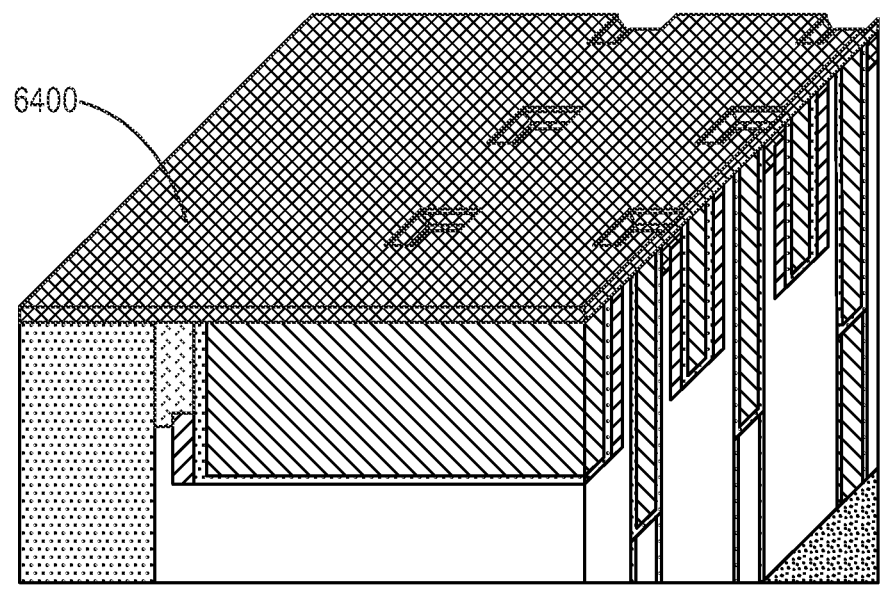
Figure 72:
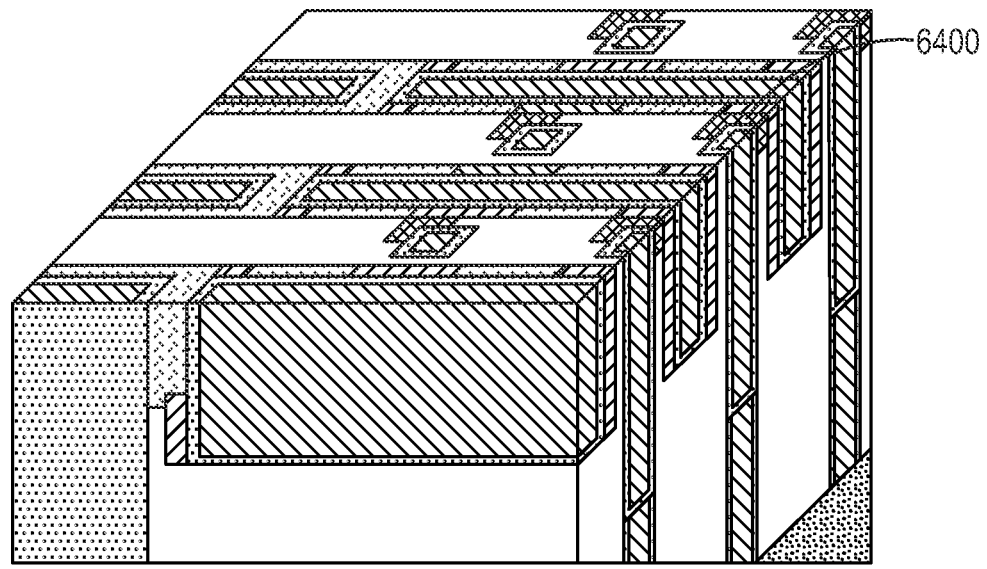

In the embodiment depicted in FIG. 65, each conductive vertical via connection post of the memory cells is contacted in four points—two points each to each of the rows on either side of the post. To limit this contact to a single point between a given row and a given conductive vertical via connection posts of the memory cells, embodiments of the invention incorporate the steps depicted in FIGS. 66-72 to replace the steps depicted in FIGS. 63-65. Referring back to FIG. 62 and to FIGS. 66-72, a layer of photoresist 6600 is deposited on the surface over planarized conductive material 6100. The photoresist 6600 is then exposed and developed to reveal only one of the four corners of the cups formed when etching as described above with reference to FIG. 62. Thus, the etch only opens up one corner of the area around the conductive vertical via connection post of the memory cells, as shown in FIG. 69. Photoresist 6600 is removed (FIG. 70), and programmable material 6400 is, as described above, deposited (FIG. 71) and polished (FIG. 72) such that each conductive vertical via connection post of the memory cells is contacted at a single point to the row to one side of the post.

Figure 73:
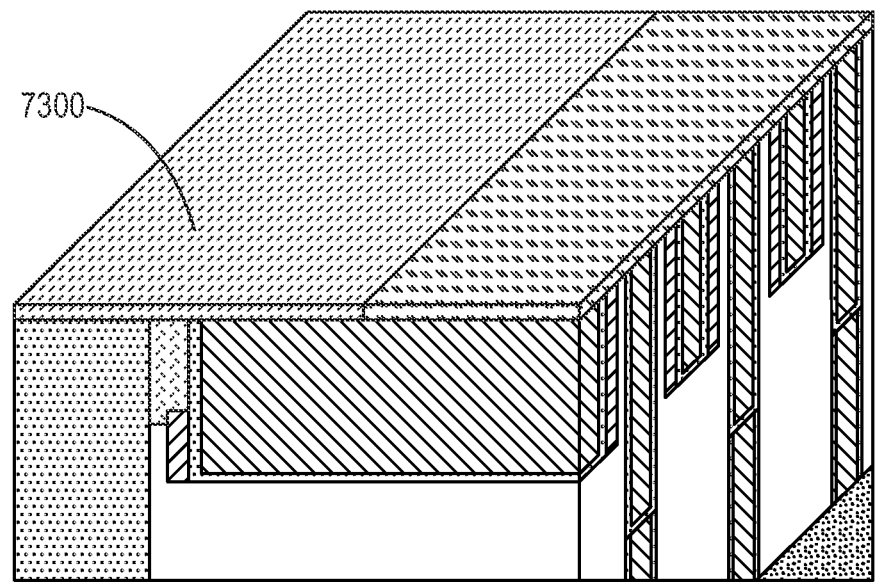
FIGS. 73-78 are perspective views of memory elements being fabricated according to various alternative embodiments of the present invention at various stages during the fabrication process.
Figure 74:
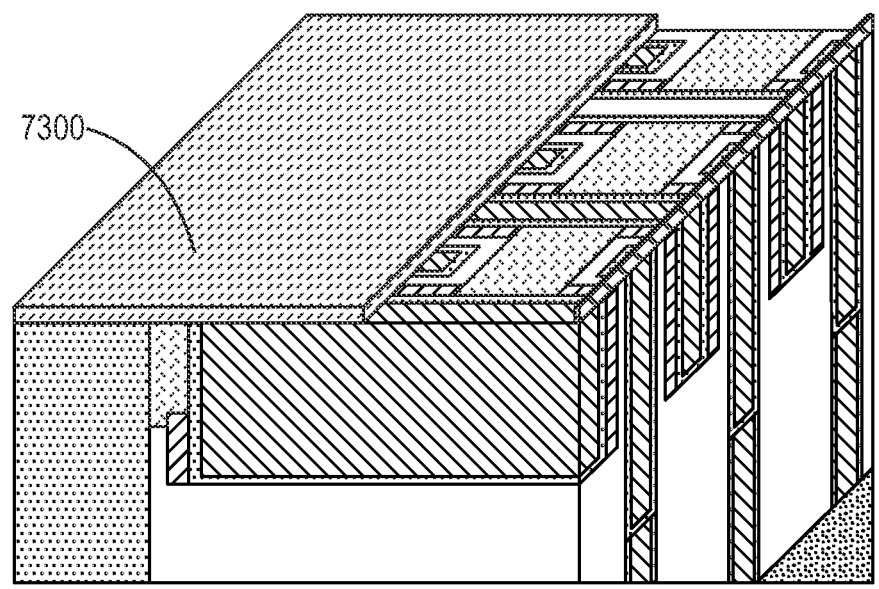
Figure 75:
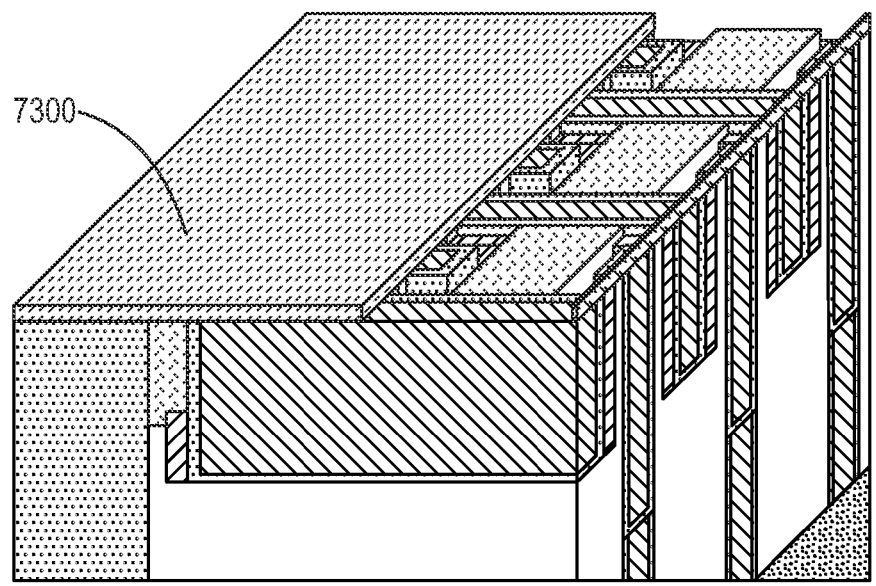
Figure 76:
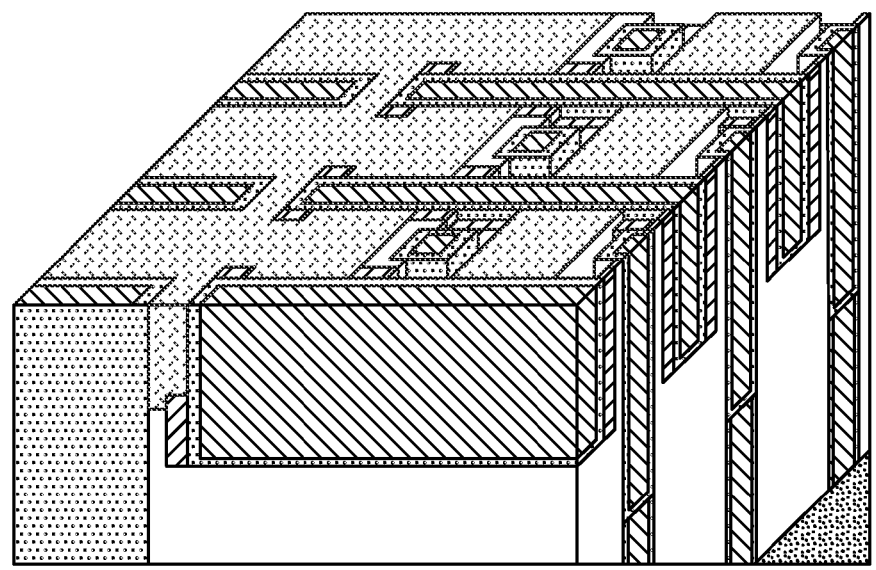
Figure 77:
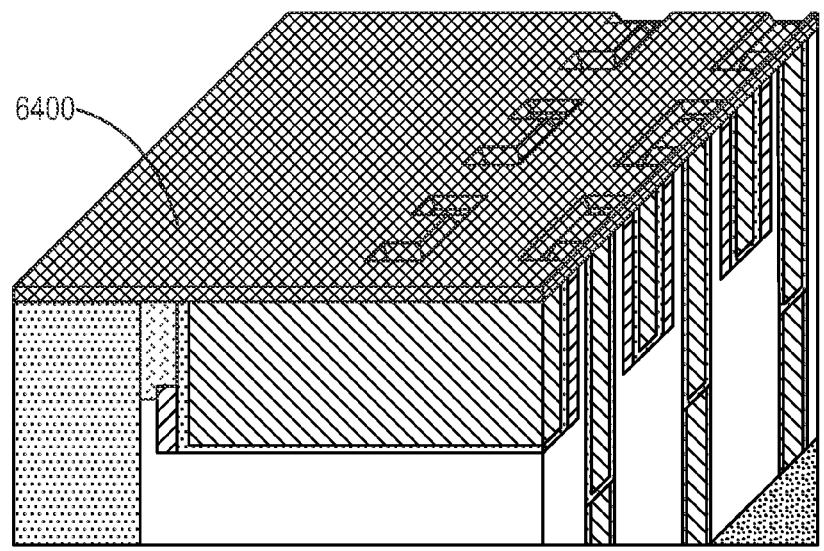
Figure 78:
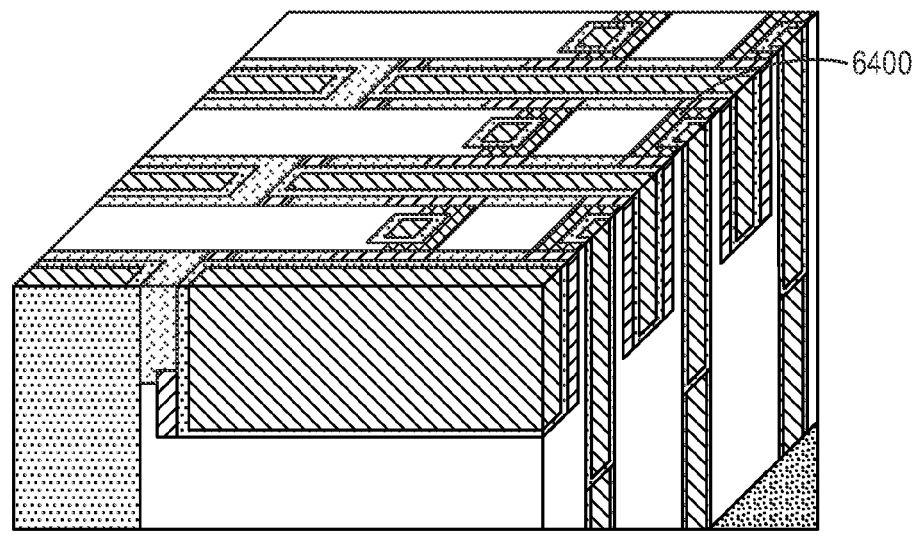

In another embodiment, long stripes are formed using a half-critical (twice the critical minimum feature size geometry) mask in photoresist 7300 (FIG. 73) and developed (FIG. 74) to expose half of each memory cell for each pair of columns. In this way, the above-described cup-formation etch opens one corner of the cup to both adjacent rows (FIG. 75), and when the photoresist 7300 is stripped (FIG. 76) and the programmable material 6400 is deposited (FIG. 77) and polished (FIG. 78), each conductive vertical via connection post of the memory cells has two programmable contact points—one to each row to either side of the post. Thus, if the selection of an individual post is made in the substrate (as opposed to a selection of a single post by its intersection with a selected row) then two programmable elements are present for each memory cell post location (i.e., two bits per cell). In such a case, selection of a single element is made through the selection of a single adjacent row (of the two adjacent rows).

Figure 79:
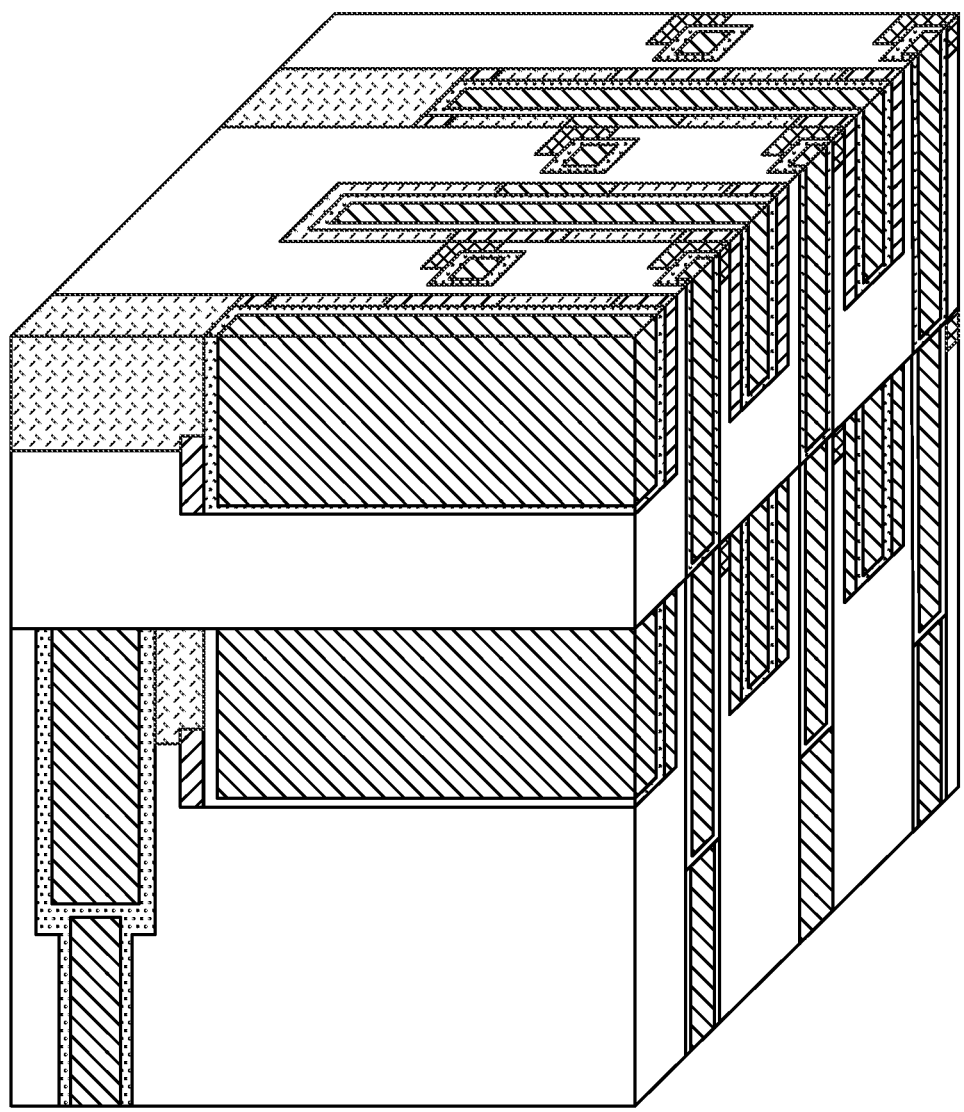
FIG. 79 is a perspective view of a memory device including stacked layers of memory elements fabricated in accordance with various embodiments of the invention.

In another variation, each programmable element may be programmed to represent more than one bit of data. For example, with a programmable element comprising a chalcogenide alloy such as GST, one state may be the crystalline (i.e., reset and low-resistance) state, and another state may be the amorphous (i.e., programmed and high-resistance) state. Additional bits of programmable data may be provided by including intermediate resistance states having resistances between those of these two states. Such elements may also be referred to as multi-level cell (MLC) memory elements. With this approach, a programmable material in which four states are utilized along with the two programmable elements per memory cell post and multiple layers of programmable elements connecting to a single post result in many bits of data per memory cell. For example, a memory device having a 50-nm pitch in both the row and column direction (i.e., F approximately equal to 25 nm), two memory elements per cell, four bits per MLC memory element, and 16 layers stacked in three dimensions has a storage capacity of about 5 terabits in a single 1 $cm^2$ die. Various embodiments of the present invention combine two or more of the above-described density-enhancing techniques in a single device (e.g., to have two or more of three-dimensional stacking, two or more programmable elements per memory cell, and/or multi-level cell programming of memory elements). FIG. 79 illustrates the embodiment of FIG. 72 having a second, stacked layer of memory cells fabricated thereon. The structure of FIG. 79 may be formed by repeating the steps described above with respect to FIGS. 29-72 atop the structure illustrated in FIG. 72. In various embodiments, such stacking may be repeated more than once to form memory devices having increased storage capacity but with substantially similar footprints.

As explained above in reference to FIG. 63, the non-conductive dielectric material about the posts of the memory cells (i.e., layer 2900 and spacer material 3500) is etched, thus exposing the post as well as the corner of the conductive material (on the side of an adjacent row) at the corner of the cup. In an embodiment, photolithography and the etch are performed to etch only a single one of these four "corners" around each post. The corner so exposed may be etched with a brief clean-up etch (e.g., a short wet etch in a diluted etchant such as hydrofluoric acid, or a non-isotropic RIE etch) to ensure the contact material is sufficiently exposed in the corner.

The memory storage elements described herein may be implemented with cross-point memory arrays in which the memory arrays' surrounding circuitry is also implemented in accordance with embodiments of the present invention; these arrays may be one of many tiles or sub-arrays in a larger device or an array within a three-dimensional arrangement of arrays or tiles. In such a memory device, the storage cells may incorporate field-emitters, diodes, or other non-linear conductor devices that conduct current better in one direction than the other for a given applied voltage. The storage element may be a fuse, an antifuse, a phase-change material such as a chalcogenide (including a chalcogenide in which the programmed resistivity may have two or more selected values), a resistance that may be electrically altered, or a field-emitter element programming mechanism including an element for which the resistance or the volume is changeable and programmable.

Memory devices incorporating embodiments of the memory storage elements described herein may be applied to memory devices and systems for storing digital text, digital books, digital music (such as MP3 players and cellular telephones), digital audio, digital photographs (wherein one or more digital still images can be stored including sequences of digital images), digital video (such as personal entertainment devices), digital cartography (wherein one or more digital maps can be stored, such as GPS devices), and any other digital or digitized information as well as any combinations thereof. Devices incorporating embodiments of the memory storage elements described herein may be embedded or removable, and may be interchangeable among other devices that can access the data therein. Embodiments of the memory storage elements described herein may be packaged in any variety of industry-standard form factor, including Compact Flash, Secure Digital, MultiMedia Cards, PCMCIA Cards, memory stick, any of a large variety of integrated circuit packages including ball grid arrays, dual in-line packages (DIPs), SOICs, PLCC, TQFPs and the like, as well as in proprietary form factors and custom designed packages. These packages can contain just the memory chip, multiple memory chips, one or more memory chips along with other logic devices or other storage devices such as PLDs, PLAs, micro-controllers, microprocessors, controller chips or chipsets or other custom or standard circuitry.

Embodiments of the present invention may incorporate PMOS transistors for a reversed-polarity array by altering the dopant profiles. The manufacturing techniques described herein may also be used to form bipolar transistors, P-N, P-i-N, or four-layer diodes (i.e., thyristors or the like) or other switching devices (e.g., SCRs, diacs, or the like). Two-terminal device arrays utilizing P-N or P-i-N diodes may be fabricated by omitting the middle contact (i.e., the gate contact trench may utilized for STI isolation simply by filling with oxide, without the gate channel doping step, instead of filling with gate polysilicon) and implementing an array by utilizing the doped semiconductor channels in one direction and conductors across the tops of the devices (each in series with a programmable element) in the orthogonal direction (e.g., a typical diode array). The transistor may be utilized such that the drain is common to the transistors connected by a single word line (as described above, the source is common to the transistors connected by a single word line).

Embodiments of the present invention will typically, though not necessarily, be built as integrated circuits by means of photolithography. Embodiments may be implemented with a traditional two dimensional arrangement of storage elements or with a three-dimensional arrangement of storage elements. The storage elements may include a fusible material, an antifusible material, a phase-change material (for PRAM) such as a chalcogenide alloy material (including a chalcogenide in which the programmed resistivity may be one of two resistance values and, in the case of more than one bit per cell storage cells, in which the programmed resistivity may be one of three or more resistance values), a resistive change material (for RRAM), a ferroelectric material (for FRAM), a magnetic or magnetoresistive material (for MRAM), magnetic tunnel junction or spin-transfer torque element (for MTJ-RAM or STT-RAM), a dual layer oxide memory element comprising a junction and an insulating metal oxide and a conductive metal oxide (see U.S. Pat. No. 6,753,561 by Rinerson), or a trapped charge device (see U.S. Pat. No. 7,362,609 by Harrison et al.). The phase-change material, such as a chalcogenide material, may be programmed or erased. Orientation of the array may be rotated, i.e., the "rows" may be "columns," or vice versa. The polarity of the voltages and direction of the steering elements in the storage bits may be reversed while still keeping within what is envisioned by embodiments of the present invention. The present invention may be applied to other memory technologies as well including static RAM, Flash memory, EEPROM, DRAM, and others.

Memory devices incorporating embodiments of the present invention may be applied to memory devices and systems for storing digital text, digital books, digital music (such as MP3 players and cellular telephones), digital audio, digital photographs (wherein one or more digital still images may be stored including sequences of digital images), digital video (such as personal entertainment devices), digital cartography (wherein one or more digital maps can be stored, such as GPS devices), and any other digital or digitized information as well as any combinations thereof. Devices incorporating embodiments of the present invention may be embedded or removable, and may be interchangeable among other devices that can access the data therein. Embodiments of the invention may be packaged in any variety of industry-standard form factor, including Compact Flash, Secure Digital, MultiMedia Cards, PCMCIA Cards, memory stick, any of a large variety of integrated circuit packages including ball grid arrays, DIPs, SOICs, PLCC, TQFPs and the like, as well as in proprietary form factors and custom designed packages. These packages may contain just the memory chip, multiple memory chips, one or more memory chips along with other logic devices or other storage devices such as PLDs, PLAs, micro-controllers, microprocessors, controller chips or chipsets or other custom or standard circuitry.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method of forming a memory device, the method comprising:
   providing a substrate;
   forming a source layer on the substrate;
   forming a channel layer over the source layer, the channel layer having a doping type different from a doping type of the source layer;
   forming a drain layer over the channel layer, the drain layer having a doping type different from a doping type of the channel layer; and
   patterning the source, channel, and drain layers into an array of memory switches each having a cross-sectional area less than 6 $F^2$,
   wherein patterning the source, channel, and drain layers comprises:
      forming a plurality of generally parallel isolation trenches intersecting the source, channel, and drain layers;
      depositing a dielectric material into the plurality of isolation trenches; and
      planarizing the dielectric material such that a top surface of the dielectric material is substantially coplanar with a top surface of the drain layer.

2. The method of claim 1, wherein patterning the source, channel, and drain layers further comprises:
   forming a plurality of generally parallel gate trenches intersecting the isolation trenches,
   wherein each memory switch is bounded by intersecting isolation trenches and gate trenches.

3. The method of claim 2, wherein the cross-sectional area of each memory switch is less than approximately 4 $F^2$.

4. The method of claim 2, further comprising:
   forming a gate dielectric in contact with the channel layer within the gate trenches;
   depositing a gate contact material in the gate trenches; and
   planarizing the gate contact material such that a top surface of the gate contact material is substantially coplanar with a top surface of the dielectric material in the isolation trenches.

5. The method of claim 1, wherein forming the source, channel, and drain layers each comprises ion implantation of dopants into the substrate.

6. The method of claim 1, wherein forming the source, channel, and drain layers each comprises deposition of a semiconductor material over the substrate.

7. The method of claim 1, further comprising, substantially simultaneously with patterning the source, channel, and drain layers into an array of memory switches, patterning the source, channel, and drain layers into a plurality of peripheral devices disposed proximate the array of memory switches.

8. The method of claim 7, further comprising electrically connecting the peripheral devices to the array of memory switches.

9. The method of claim 1, further comprising:
   forming a conductive post over a memory switch; and
   forming a programmable material in contact with the conductive post, thereby forming a programmable memory cell.

10. The method of claim 9, wherein the programmable material comprises at least one of phase-change material, a resistive-change material, or a one-time-programmable material.

11. The method of claim 9, wherein forming the programmable material comprises etching at least a portion of a dielectric material disposed around the conductive post to form a recess, at least substantially filling the recess with the programmable material, and planarizing the programmable material such that a top surface of the programmable material is substantially coplanar with a top surface of the conductive post.

12. The method of claim 11, wherein the conductive post has a substantially quadrilateral cross-sectional area, and the programmable material is disposed in contact with only one corner of the conductive post.

13. The method of claim 11, wherein the conductive post has a substantially quadrilateral cross-sectional area, and the programmable material is disposed in contact with only two corners of the conductive post.

14. The method of claim 1, wherein the cross-sectional area of each memory switch is less than approximately 4 $F^2$.

15. The method of claim 1, wherein the memory switches comprise four-layer diodes.

16. The method of claim 1, wherein the memory switches comprise MOS transistors.

17. A method of forming a memory device, the method comprising:
   providing a substrate;
   forming a source layer on the substrate;
   forming a channel layer over the source layer, the channel layer having a doping type different from a doping type of the source layer;
   forming a drain layer over the channel layer, the drain layer having a doping type different from a doping type of the channel layer;
   patterning the source, channel, and drain layers into an array of memory switches each having a cross-sectional area less than 6 $F^2$;
   forming a conductive post over a memory switch; and
   forming a programmable material in contact with the conductive post, thereby forming a programmable memory cell.

18. The method of claim 17, wherein the programmable material comprises at least one of phase-change material, a resistive-change material, or a one-time-programmable material.

19. The method of claim 17, wherein forming the programmable material comprises etching at least a portion of a dielectric material disposed around the conductive post to form a recess, at least substantially filling the recess with the programmable material, and planarizing the programmable material such that a top surface of the programmable material is substantially coplanar with a top surface of the conductive post.

20. The method of claim 19, wherein the conductive post has a substantially quadrilateral cross-sectional area, and the programmable material is disposed in contact with only one corner of the conductive post.

21. The method of claim 19, wherein the conductive post has a substantially quadrilateral cross-sectional area, and the programmable material is disposed in contact with only two corners of the conductive post.

22. The method of claim 17, wherein patterning the source, channel, and drain layers comprises:
   forming a plurality of generally parallel isolation trenches intersecting the source, channel, and drain layers;

depositing a dielectric material into the plurality of isolation trenches;

planarizing the dielectric material such that a top surface of the dielectric material is substantially coplanar with a top surface of the drain layer; and forming a plurality of generally parallel gate trenches intersecting the isolation trenches, wherein each memory switch is bounded by intersecting isolation trenches and gate trenches.

23. The method of claim 22, further comprising:

forming a gate dielectric in contact with the channel layer within the gate trenches;

depositing a gate contact material in the gate trenches; and planarizing the gate contact material such that a top surface of the gate contact material is substantially coplanar with a top surface of the dielectric material in the isolation trenches.

24. The method of claim 17, wherein the cross-sectional area of each memory switch is less than approximately 4 $F^2$.

25. The method of claim 17, wherein forming the source, channel, and drain layers each comprises ion implantation of dopants into the substrate.

26. The method of claim 17, wherein forming the source, channel, and drain layers each comprises deposition of a semiconductor material over the substrate.

27. The method of claim 17, further comprising, substantially simultaneously with patterning the source, channel, and drain layers into an array of memory switches, patterning the source, channel, and drain layers into a plurality of peripheral devices disposed proximate the array of memory switches.

28. The method of claim 27, further comprising electrically connecting the peripheral devices to the array of memory switches.

29. The method of claim 17, wherein the memory switches comprise four-layer diodes.

30. The method of claim 17, wherein the memory switches comprise MOS transistors.

* * * * *